(12) United States Patent
Park et al.

(10) Patent No.: US 10,734,552 B2
(45) Date of Patent: Aug. 4, 2020

(54) SEMICONDUCTOR DEVICE HAVING A LIGHT EMITTING STRUCTURE

(71) Applicant: LG INNOTEK CO., LTD., Seoul (KR)

(72) Inventors: Su Ik Park, Seoul (KR); Youn Joon Sung, Seoul (KR); Min Sung Kim, Seoul (KR); Yong Gyeong Lee, Seoul (KR); Eun Dk Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/310,340

(22) PCT Filed: Jun. 20, 2017

(86) PCT No.: PCT/KR2017/006473
§ 371 (c)(1),
(2) Date: Dec. 14, 2018

(87) PCT Pub. No.: WO2017/222279
PCT Pub. Date: Dec. 28, 2017

(65) Prior Publication Data
US 2019/0181300 A1   Jun. 13, 2019

(30) Foreign Application Priority Data

Jun. 20, 2016  (KR) .................. 10-2016-0076586
Jul. 11, 2016  (KR) .................. 10-2016-0087728
Sep. 8, 2016  (KR) .................. 10-2016-0115894

(51) Int. Cl.
*H01L 33/38* (2010.01)
*H01L 33/48* (2010.01)
(Continued)

(52) U.S. Cl.
CPC ............ *H01L 33/382* (2013.01); *H01L 33/32* (2013.01); *H01L 33/387* (2013.01);
(Continued)

(58) Field of Classification Search
CPC ......... H01L 33/22; H01L 33/30; H01L 33/32; H01L 33/382; H01L 33/385; H01L 33/387; H01L 33/405; H01L 33/48; H01L 33/483
See application file for complete search history.

(56) References Cited

U.S. PATENT DOCUMENTS 4,910,571 A  3/1990 Kasahara et al.
6,614,119 B1  9/2003 Asahina et al.
(Continued)

FOREIGN PATENT DOCUMENTS

EP  1 453 160  9/2004
EP  2 955 763  12/2015
(Continued)

OTHER PUBLICATIONS

Japanese Office Action dated Sep. 3, 2019 issued in Application JP 2017-168498.
(Continued)

*Primary Examiner* — Stephen W Smoot
(74) *Attorney, Agent, or Firm* — KED & Associates LLP

(57) ABSTRACT

An embodiment provides a semiconductor device including a light emitting structure including a first conductive semiconductor layer, a second conductive semiconductor layer, an active layer disposed between the first conductive semiconductor layer and the second conductive semiconductor layer, and a plurality of recesses passing through the second conductive semiconductor layer and the active layer and extending to a portion of the first conductive semiconductor layer; a plurality of first electrodes disposed inside the plurality of recesses and electrically connected with the first conductive semiconductor layer; and a second electrode electrically connected with the second conductive semiconductor layer, wherein a ratio of a first area of where the plurality of first electrodes are in contact with the first
(Continued)

conductive semiconductor layer and a second area of where the second electrode is in contact with the second conductive semiconductor layer (first area:second area) ranges from 1:3 to 1:10.

19 Claims, 34 Drawing Sheets

(51) Int. Cl.
*H01L 33/32* (2010.01)
*H01L 33/40* (2010.01)
*H01L 33/22* (2010.01)
(52) U.S. Cl.
CPC .......... *H01L 33/405* (2013.01); *H01L 33/48* (2013.01); *H01L 33/22* (2013.01); *H01L 33/385* (2013.01); *H01L 2224/48091* (2013.01); *H01L 2224/49175* (2013.01); *H01L 2933/0016* (2013.01)

(56) References Cited

U.S. PATENT DOCUMENTS

| | | |
|---|---|---|
| 8,269,410 B2 | 9/2012 | Kijima et al. |
| 8,969,898 B2 | 3/2015 | Onishi et al. |
| 9,450,151 B2 | 9/2016 | Choi et al. |
| 9,537,055 B2 | 1/2017 | Park |
| 9,590,141 B2 | 3/2017 | Tachibana et al. |
| 9,748,410 B2 | 8/2017 | Kinoshita et al. |
| 10,347,804 B2 | 7/2019 | Yoo |
| 2002/0088985 A1 | 7/2002 | Komoto |
| 2003/0006418 A1 | 1/2003 | Emerson et al. |
| 2005/0127391 A1 | 6/2005 | Yanamoto |
| 2006/0131558 A1 | 6/2006 | Sato et al. |
| 2006/0260671 A1 | 11/2006 | Ohta et al. |
| 2007/0023777 A1 | 2/2007 | Sonobe et al. |
| 2007/0205375 A1 | 9/2007 | Ward et al. |
| 2008/0061308 A1 | 3/2008 | Yoon |
| 2008/0185606 A1 | 8/2008 | Sano et al. |
| 2008/0247435 A1 | 10/2008 | Choi |
| 2010/0006884 A1 | 1/2010 | Ou et al. |
| 2011/0266568 A1 | 11/2011 | Aldaz et al. |
| 2011/0316126 A1 | 12/2011 | Emura et al. |
| 2012/0040480 A1 | 2/2012 | Shieh et al. |
| 2012/0049156 A1 | 3/2012 | Ohta et al. |
| 2012/0085986 A1 | 4/2012 | Iwanaga et al. |
| 2012/0112218 A1 | 5/2012 | Teng et al. |
| 2012/0141771 A1 | 6/2012 | Pan et al. |
| 2012/0292631 A1 | 11/2012 | Katsuno et al. |
| 2013/0082237 A1 | 4/2013 | Northrup et al. |
| 2014/0034981 A1 | 2/2014 | Hung et al. |
| 2014/0084274 A1 | 3/2014 | Yamazaki et al. |
| 2014/0209955 A1 | 7/2014 | Kim et al. |
| 2014/0225143 A1 | 8/2014 | Kususe |
| 2014/0239341 A1* | 8/2014 | Matsumura ............. H01L 33/36 257/99 |
| 2014/0327034 A1 | 11/2014 | Toyota |
| 2015/0263305 A1 | 9/2015 | Premutico et al. |
| 2015/0311392 A1 | 10/2015 | Hirayama et al. |
| 2015/0380621 A1 | 12/2015 | Chae et al. |
| 2016/0005919 A1 | 1/2016 | Obata |
| 2016/0056338 A1 | 2/2016 | Park et al. |
| 2016/0111600 A1 | 4/2016 | Chae et al. |
| 2016/0149078 A1 | 5/2016 | Takeuchi et al. |
| 2016/0218262 A1 | 7/2016 | Aketa et al. |
| 2016/0284941 A1 | 9/2016 | Seo et al. |
| 2016/0365486 A1 | 12/2016 | Kim et al. |
| 2017/0025566 A1 | 1/2017 | Song et al. |
| 2017/0317236 A1* | 11/2017 | Lee ........................ H01L 33/405 |
| 2018/0069150 A1* | 3/2018 | Oh .......................... H01L 22/12 |
| 2018/0076355 A1 | 3/2018 | Hayashi et al. |
| 2018/0145219 A1* | 5/2018 | Kim .................... H01L 33/0025 |
| 2018/0151778 A1* | 5/2018 | Park ....................... H01L 33/36 |
| 2019/0326473 A1* | 10/2019 | Choi ....................... H01L 33/36 |

FOREIGN PATENT DOCUMENTS

| | | |
|---|---|---|
| EP | 2 988 339 | 2/2016 |
| EP | 3 043 395 | 7/2016 |
| EP | 3 073 539 | 9/2016 |
| JP | H 07-106631 | 4/1995 |
| JP | 2003-110140 | 4/2003 |
| JP | 2006-032779 | 2/2006 |
| JP | 2007-134533 | 5/2007 |
| JP | 2008-285758 | 11/2008 |
| JP | 2010-171272 | 8/2010 |
| JP | 2012-049337 | 3/2012 |
| JP | 2012-216603 | 11/2012 |
| JP | 2013-105917 | 5/2013 |
| JP | 2013-149889 | 8/2013 |
| JP | 2014-195055 | 10/2014 |
| JP | 2015-177023 | 10/2015 |
| JP | 2015-216352 | 12/2015 |
| JP | 2016-044095 | 4/2016 |
| JP | 2016-184724 | 10/2016 |
| KR | 10-2014-0003351 | 1/2014 |
| KR | 10-2014-0006429 | 1/2014 |
| KR | 10-2016-0056524 | 5/2016 |
| WO | WO 2005/101532 | 10/2005 |
| WO | WO 2006/043422 | 4/2006 |
| WO | WO 2010/146808 | 12/2010 |
| WO | WO 2014/123092 | 8/2014 |
| WO | WO 2015/156588 | 10/2015 |
| WO | WO 2016/163083 | 10/2016 |

OTHER PUBLICATIONS

European Search Report dated Dec. 13, 2018 issued in Application No. 18188482.6.
United States Notice of Allowance dated Feb. 15, 2019 issued in co-pending related U.S. Appl. No. 15/692,617.
United State Office Action dated Feb. 21, 2019 issued in co-pending related U.S. Appl. No. 15/821,519.
International Search Report (with English Translation) and Written Opinion dated Sep. 20, 2017 issued in Application No. PCT/KR2017/006473.
U.S. Appl. No. 16/415,245, filed May 17, 2019.
United States Office Action dated Aug. 22, 2019 issued in co-pending related U.S. Appl. No. 15/821,519.
European Search Report dated Jul. 25, 2019 issued in EP Application No. 17851126.7.
U.S. Notice of Allowance dated Oct. 23, 2019 issued in co-pending U.S. Appl. No. 16/100,785.
U.S. Appl. No. 15/692,617, filed Aug. 31, 2017.
U.S. Appl. No. 16/310,340, filed Dec. 14, 2018.
U.S. Appl. No. 16/331,015, filed Mar. 6, 2019.
U.S. Appl. No. 15/821,519, filed Nov. 22, 2017.
U.S. Appl. No. 16/331,039, filed Mar. 6, 2019.
U.S. Appl. No. 16/100,785, filed Aug. 10, 2018.
European Search Report dated May 14, 2019 issued in Application No. 17815692.3.
U.S. Office Action dated May 17, 2019 issued in related U.S. Appl. No. 16/100,785.
European Search Report dated Jul. 11, 2019 issued in EP Application No. 17849159.3.
Japanese Office Action dated Mar. 27, 2019 issued in Application No. 2017-168498.
United States Office Action dated Feb. 21, 2020 issued in co-pending related U.S. Appl. No. 15/821,519.
Japanese Office Action dated Feb. 4, 2020 issued in Application No. 2018-152495.
Japanese Office Action dated Oct. 8, 2019 issued in Application No. 2018-152495.
United States Office Action dated May 22, 2020 issued in co-pending related U.S. Appl. No. 16/415,245.

* cited by examiner

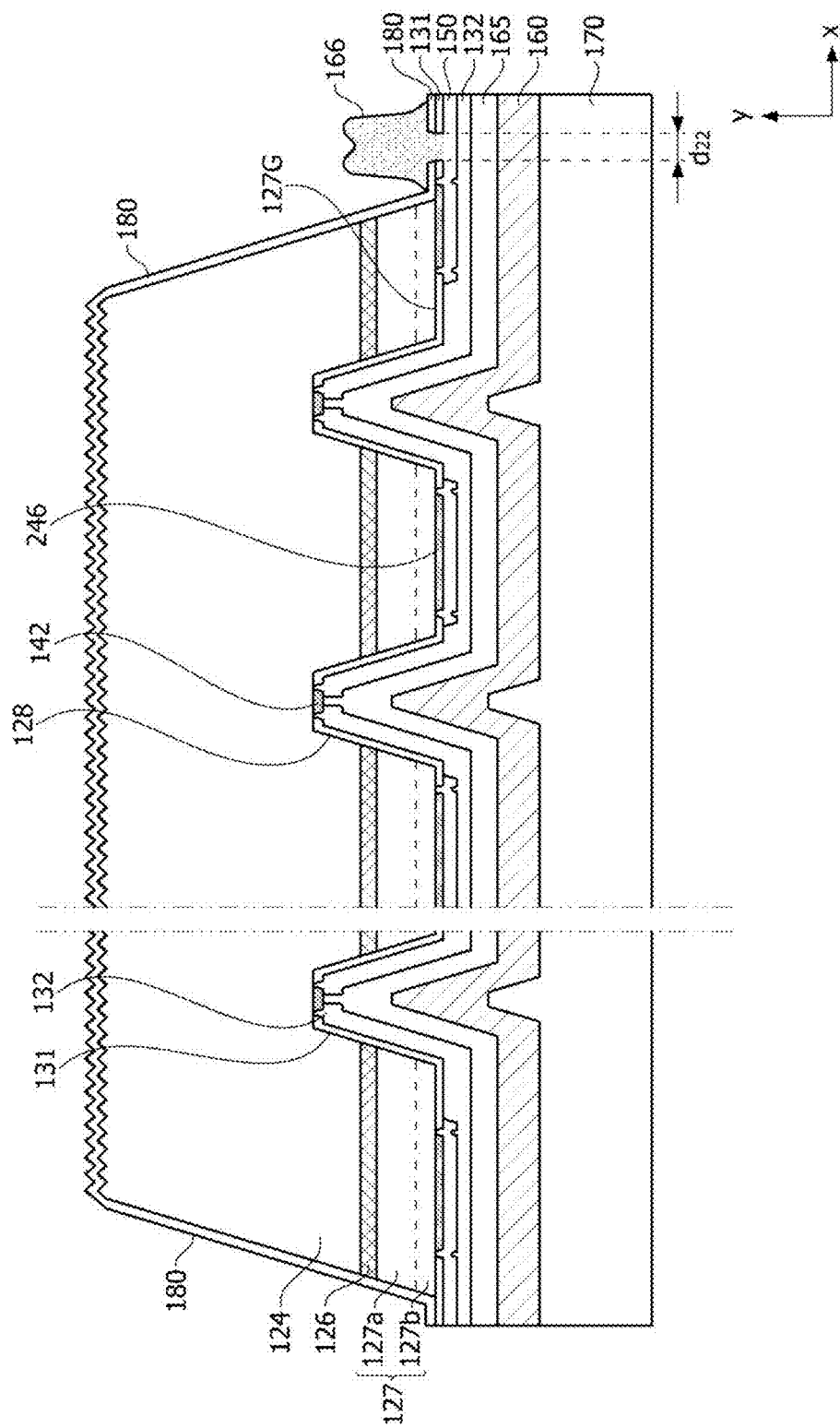

SEMICONDUCTOR DEVICE HAVING A LIGHT EMITTING STRUCTURE

CROSS-REFERENCE TO RELATED PATENT APPLICATIONS

This application is a U.S. National Stage Application under 35 U.S.C. § 371 of PCT Application No. PCT/KR2017/006473, filed Jun. 20, 2017, which claims priority to Korean Patent Application No. 10-2016-0076586, filed Jun. 20, 2016, Korean Patent Application No. 10-2016-0087728, filed Jul. 11, 2016, and Korean Patent Application No. 10-2016-0115894, filed Sep. 8, 2016, whose entire disclosures are hereby incorporated by reference.

TECHNICAL FIELD

Embodiments relate to semiconductor devices.

BACKGROUND ART

Semiconductor devices including compounds such as GaN and AlGaN have many merits such as wide and adjustable band gap energy and thus may be variously used as light emitting devices, light receiving devices, various kinds of diodes, or the like.

In particular, light emitting devices using group III-V or II-VI compound semiconductors or light emitting devices such as a laser diode may implement various colors such as red, green, blue, and ultraviolet due to the development of thin film growth technology and device materials, and may implement efficient white light rays by using fluorescent materials or combining colors. These light emitting devices also have advantages with respect to low power consumption, semi-permanent life span, fast response time, safety, and environmental friendliness compared to conventional light sources such as a fluorescent lamp, an incandescent lamp, or the like.

In addition, when light receiving devices such as optical detectors or solar cells are produced using group III-V or II-VI compound semiconductors, an optical current may be generated by light absorption in various wavelength ranges through development of device materials. Thus, light may be used in various wavelength ranges from gamma rays to radio wavelength regions. Also, the light receiving devices have the advantages of fast response time, stability, environmental friendliness, and ease of adjustment of device materials and may be easily used to power control or microwave circuits or communication modules.

Accordingly, semiconductor devices are being extensively used in the transmission modules of optical communication means, light emitting diode backlights substituted for cold cathode fluorescence lamps (CCFL) forming the backlights of liquid crystal display (LCD) devices, white light emitting diode lamps to be substituted for fluorescent bulbs or incandescent bulbs, car headlights, traffic lights, and sensors for detecting gas or fire. In addition, semiconductor devices may also be extensively used in high-frequency application circuits or other power control devices and even communication modules.

In particular, a light emitting device that emits ultraviolet wavelength light may be used for curing, medical, and sterilization purposes due to its curing or sterilizing action.

However, a light emitting device that emits ultraviolet wavelength light has a high aluminum composition, and thus electric current is not well spread in a semiconductor layer. Accordingly, this causes a decrease in optical output power and an increase in operating voltage.

DETAILED DESCRIPTION OF THE INVENTION

Technical Problem

An embodiment provides a semiconductor device having enhanced optical output power.

Another embodiment provides a semiconductor device capable having an adjustable orientation angle.

Another embodiment provides a semiconductor device having a low operating voltage.

Technical Solution

A semiconductor device according to an embodiment includes a light emitting structure including a first conductive semiconductor layer, a second conductive semiconductor layer, an active layer disposed between the first conductive semiconductor layer and the second conductive semiconductor layer, and a plurality of recesses passing through the second conductive semiconductor layer and the active layer and extending to a portion of the first conductive semiconductor layer; a plurality of first electrodes disposed inside the plurality of recesses and electrically connected with the first conductive semiconductor layer; and a second electrode electrically connected with the second conductive semiconductor layer, wherein a ratio of a first area of where the plurality of first electrodes are in contact with the first conductive semiconductor layer and a second area of where the second electrode is in contact with the second conductive semiconductor layer (first area:second area) ranges from 1:3 to 1:10.

The first area may range from 7.4% to 20% of a maximum horizontal sectional area of the light emitting structure.

The second area may range from 35% to 70% of the maximum horizontal sectional area of the light emitting structure.

The plurality of recesses may have an area ranging from 13% to 30% of the maximum horizontal sectional area of the light emitting structure.

The active layer may generate ultraviolet wavelength light.

The recesses may each have a diameter ranging from 38 μm to 60 μm.

The recesses may each have a side surface with an incline angle ranging from 70 degrees to 90 degrees.

The first electrodes may each have a diameter ranging from 24 μm to 50 μm.

The first conductive semiconductor layer may include a low resistance layer disposed adjacent to the active layer and a high resistance layer disposed on the low resistance layer. The high resistance layer may have a higher aluminum composition than the low resistance layer. The first electrodes may be disposed on the low resistance layer.

The plurality of recesses may each have a top surface including a first region in which a first electrode layer is in contact with the first conductive semiconductor layer, a second region in which a first insulation layer is in contact with the first conductive semiconductor layer, and a third region in which a second insulation layer is in contact with the first conductive semiconductor layer.

The second region may have a width ranging from 11 μm to 28 μm.

The third region may have a width ranging from 1 μm to 4 μm.

A semiconductor device according to another embodiment of the present invention includes a light emitting structure including a first conductive semiconductor layer, an active layer, and a second conductive semiconductor layer disposed in a first direction and a plurality of recesses passing through the second conductive semiconductor layer and the active layer and extending to a portion of the first conductive semiconductor layer; and a plurality of first electrodes disposed inside the plurality of recesses and electrically connected with the first conductive semiconductor layer, wherein when a direction perpendicular to the first direction is defined as a second direction, a maximum sectional area of the plurality of recesses in the second direction ranges from 20% to 30% of a maximum sectional area of the light emitting structure in the second direction.

Advantageous Effects of the Invention

According to an embodiment, it is possible to enhance optical output power of the semiconductor device.

It is also possible to adjust an orientation angle of the semiconductor device.

It is also possible to lower an operating voltage of the semiconductor device.

Various advantageous merits and effects of the present invention are not limited to the above-descriptions and will be easily understood while embodiments of the present invention are described in detail.

DESCRIPTION OF THE DRAWINGS

FIG. 24 is a conceptual diagram of a semiconductor device according to a thirteenth embodiment of the present invention.

MODE OF THE INVENTION

The following embodiments may be modified or combined with each other, and the scope of the present invention is not limited to the embodiments.

Details described in a specific embodiment may be understood as descriptions associated with other embodiments unless otherwise stated or contradicted even if there is no description thereof in the other embodiments.

For example, when features of element A are described in a specific embodiment and features of element B are described in another embodiment, an embodiment in which element A and element B are combined with each other should be understood as falling within the scope of the present invention unless otherwise stated or contradicted even if not explicitly stated.

In the descriptions of embodiments, when an element is referred to as being above or under another element, the two elements may be in direct contact with each other, or one or more other elements may be disposed between the two elements. In addition, the term "above or under" used herein may represent a downward direction in addition to an upward direction with respect to one element.

Hereinafter, example embodiments will be described in detail with reference to the accompanying drawings so that they can be easily practiced by those skilled in the art.

Figure 1:
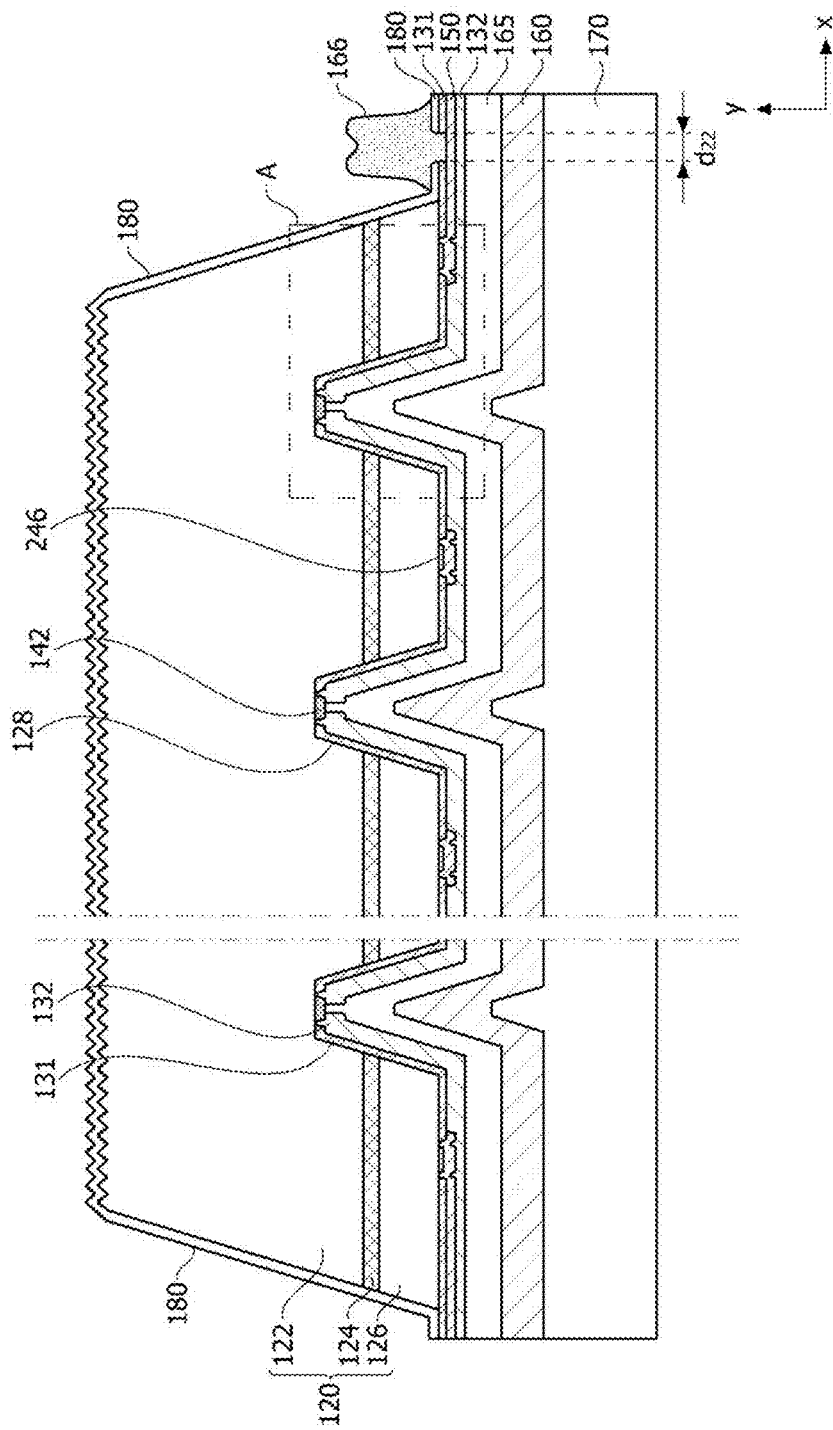
FIG. 1 is a conceptual view of a semiconductor device according to a first embodiment of the present invention.
Figure 2:
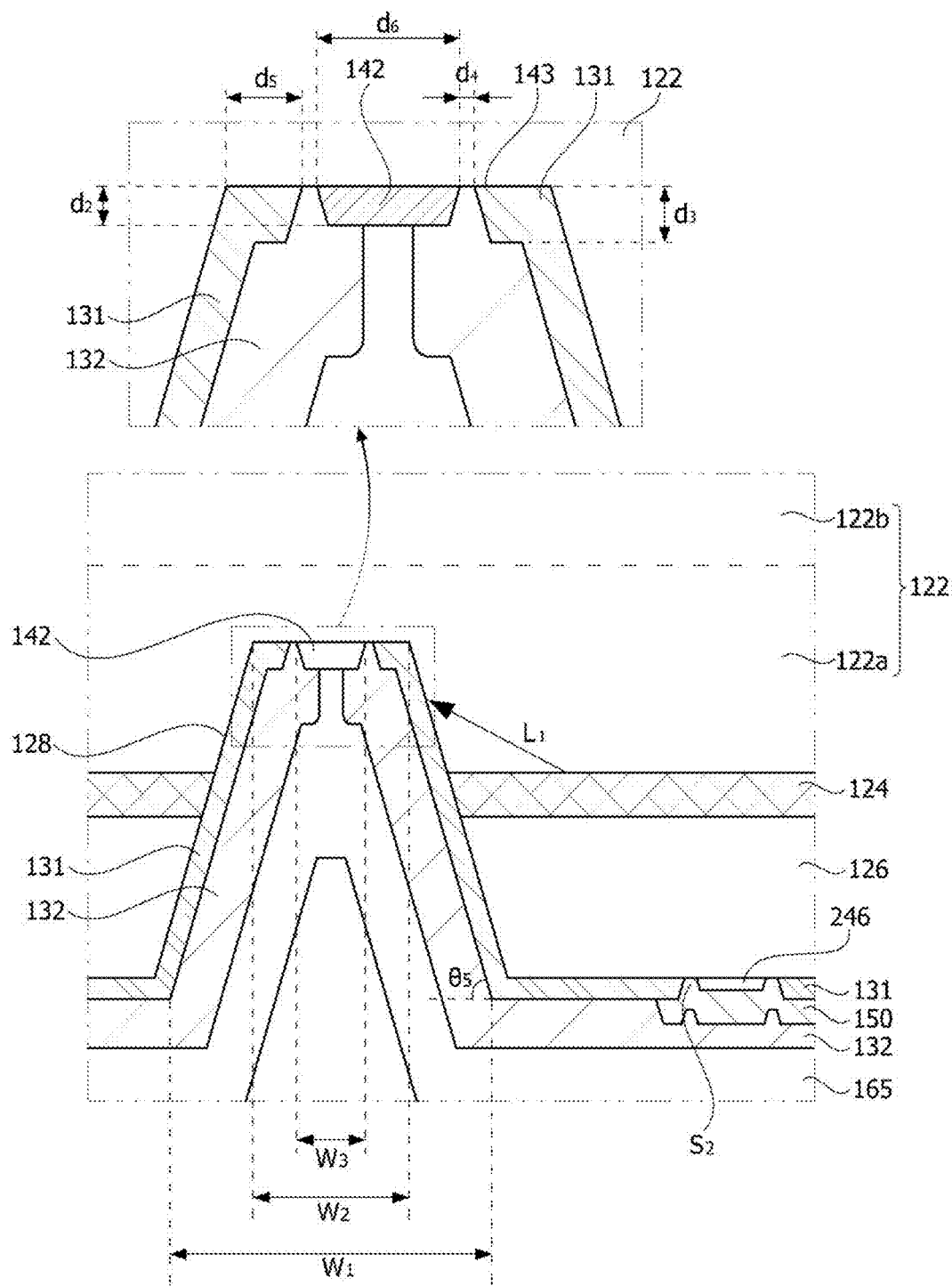
FIG. 2 is an enlarged view of a part A of FIG. 1.

FIG. 1 is a conceptual view of a semiconductor device according to a first embodiment of the present invention, and FIG. 2 is an enlarged view of a part A of FIG. 1.

Referring to FIG. 1, a semiconductor device according to an embodiment includes a light emitting structure 120 including a first conductive semiconductor layer 122, a second conductive semiconductor layer 126, and an active layer 124, a first electrode 142 electrically connected with the first conductive semiconductor layer 122, and a second electrode 246 electrically connected with the second conductive semiconductor layer 126.

The first conductive semiconductor layer 122, the active layer 124, and the second conductive semiconductor layer 126 may be disposed in a first direction (Y direction). Here, the first direction (Y direction), which is a thickness direction of each layer, is defined as a vertical direction, and a second direction (X direction) perpendicular to the first direction (Y direction) is defined as a horizontal direction.

The light emitting structure 120 according to an embodiment may output ultraviolet wavelength light. For example, the light emitting structure 120 may output near-ultraviolet wavelength light (UV-A), far-ultraviolet wavelength light (UV-B), or deep-ultraviolet wavelength light (UV-C). The wavelength range may be determined by the aluminum composition of the light emitting structure 120.

For example, the near-ultraviolet wavelength light (UV-A) may have a wavelength ranging from 320 nm to 420 nm, the far-ultraviolet wavelength light (UV-B) may have a wavelength ranging from 280 nm to 320 nm, and the deep-ultraviolet wavelength light (UV-C) may have a wavelength ranging from 100 nm to 280 nm.

The light emitting structure 120 may include a plurality of recesses 128 extending to a portion of the first conductive semiconductor layer 122 through the second conductive semiconductor layer 126 and the active layer 124.

The first electrode 142 may be disposed on top of each of the recesses 128 and electrically connected with the first conductive semiconductor layer 122. The second electrode 246 may be formed under the second conductive semiconductor layer 126. The second electrode 246 may be partitioned by the recesses 128.

Each of the first electrode 142 and the second electrode 246 may be an ohmic electrode. Each of the first electrode 142 and the second electrode 246 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto.

A second electrode pad 166 may be disposed in an edge region of the semiconductor device. The second electrode pad 166 may have a recessed central portion and thus have a top surface including a concave part and a convex part. A wire (not shown) may be bonded to the concave portion of the top surface. Accordingly, since the bonding area increases, the second electrode pad 166 may be strongly bonded to the wire.

The second electrode pad 166 may reflect light. Accordingly, the second electrode pad 166 may have higher light extraction efficiency as the second electrode pad 166 is located closer to the light emitting structure 120.

A shortest distance between the second electrode pad 166 and the light emitting structure 120 may range from 5 μm to 30 μm. When the shortest distance is less than 10 μm, it is difficult to secure a processing margin. When the shortest distance is greater than 30 μm, the disposition area of the second electrode pad 166 in the entire device increases, and thus the area of the light emitting layer 24 may decrease, and the amount of light may decrease.

The convex portion of the second electrode pad 166 may be higher than the active layer 126. Accordingly, the second electrode pad 166 may enhance light extraction efficiency and control an orientation angle by upwardly reflecting light emitted from the active layer 126 in a direction horizontal to the device.

The first insulation layer 131 is partially open under the second electrode pad 166 so that the second conductive layer 150 and the second electrode 246 may be electrically connected to each other. A passivation layer 180 may be formed on top of and on the side of the light emitting structure 120. The passivation layer 180 may be in contact with the first insulation layer 131 in a region adjacent to the second electrode 246 or in a lower portion of the second electrode 246.

An opening of the first insulation layer 131 where the second electrode 246 is in contact with the second conductive layer 150 may have a width d22 ranging, for example, from am to 90 μm. When the width d22 is less than 40 μm, the operating voltage may rise. When the width d22 is greater than 90 μm, it may be difficult to secure a processing margin for preventing exposure of the second conductive layer 150. When the second conductive layer 150 is exposed from the second electrode 246, device reliability may be reduced. Accordingly, the width d22 may preferably range from 60% to 95% of the entire width of the second electrode 246.

Referring to FIG. 2, when the aluminum composition of the light emitting structure 120 increases, electric current spreading characteristics may be deteriorated in the light emitting structure 120. Also, the active layer 124 has a large amount of light emitted to the side than a GaN-based blue light emitting device (TM mode). The TM mode may be performed by an ultraviolet semiconductor device.

According to an embodiment, a larger number of recesses 128 may be formed by an ultraviolet semiconductor device than by a typical GaN semiconductor, and then the first electrode 142 may be disposed on each of the recesses 128.

The first insulation layer 131 may electrically insulate the first electrode 142 from the active layer 126 and the second conductive semiconductor layer 127. Also, the first insulation layer 131 may electrically insulate the second electrode 246 and the second conductive layer 150 from the first conductive layer 165.

The first insulation layer 131 may be made of at least one material selected from a group consisting of $SiO_2$, $Si_xO_y$, $Si_3N_4$, $Si_xN_y$, $SiO_xN_y$, $Al_2O_3$, $TiO_2$, and AlN, but is not limited thereto. The first insulation layer 131 may be formed as a single or multiple layers. For example, the first insulation layer 131 may be a distributed Bragg reflector (DBR) having a multi-layered structure including an Si oxide or a Ti compound. However, the present invention is not limited thereto, and the first insulation layer 131 may include various reflective structures.

When the first insulation layer 131 has an insulation function, the first insulation layer 131 may upwardly reflect light L1 emitted horizontally from the active layer 124, thereby enhancing light extraction efficiency. As will be described below, the light extraction efficiency may increase as the number of recesses 128 increases.

The first electrode 142 may have a diameter W3 ranging from 24 μm to 50 μm. When this range is satisfied, it may be advantageous in spreading electric current, and it is possible to place a large number of first electrodes 142.

When the diameter W3 of the first electrode 142 is less than 24 μm, electric current injected into the first conductive semiconductor layer 122 may not be sufficient. When the diameter W3 is greater than 50 μm, the number of first electrodes 142 disposed in the area of the first conductive semiconductor layer 122 may not be sufficient, and thus it may be disadvantageous in terms of electric current spreading characteristics.

Each of the recesses 128 may have a diameter W1 ranging from 38 μm to 60 μm. The diameter W1 of the recesses 128 may be defined as the maximum diameter formed on the bottom of the second conductive semiconductor layer 126.

When the diameter W1 of each of the recesses 128 is less than 38 μm, it is difficult to secure a processing margin for forming the first electrode 142 disposed inside the recess 128. When the diameter W1 is greater than 60 μm, the removed volume of the light emitting layer 124 adjacent to the first electrode 142 increases, and thus the light emitting efficiency may be reduced.

The recess 128 may have a top surface 143 with a diameter W2 ranging from 30 μm to 58 μm.

For example, the diameter W1 of each of the recesses 128 may be 56 μm, and the diameter W2 of the top surface may be 54 μm. Each of the recesses 128 may have an incline angle θ5 ranging from 70 degrees to 90 degrees. When this range is satisfied, this may be advantageous in forming the first electrode 142 on the top surface, and it is possible to form a large number of recesses 128.

When the incline angle θ5 is smaller than 70 degrees, the removed volume of light emitting layer 124 increases, and thus the light emitting efficiency may be reduced. It is possible to adjust the area of the first electrode 142 and the area of the second electrode 246 by using the incline angle θ5 of each of the recesses 128.

The thickness d2 of the first electrode 142 may be less than the thickness d3 of the first insulation layer 131, and the first electrode 142 and the first insulation layer 131 may have a separation distance d4 ranging from 0 μm to 4 μm.

When the thickness d2 of the first electrode 142 is smaller than the thickness d3 of the first insulation layer 131, it is possible to solve a problem such as a detachment or crack caused by a reduction in step coverage characteristics caused when the first conductive layer 165 is disposed. Also, since the first electrode 142 and the first insulation layer 131 have a separation distance d4, it is possible to enhance gap-fill characteristics of the second insulation layer 132.

The separation distance d4 between the first electrode 142 and the first insulation layer 131 may range from 0 μm to 4 μm.

When the separation distance d4 between the first electrode 142 and the first insulation layer 131 is greater than 4 μm, the width of the first insulation layer 131 disposed over each of the recesses 128 decreases. Accordingly, it is difficult to secure a processing margin, and thus reliability may be reduced. Also, the width W3 of the first electrode 142 decreases so much that the operating voltage characteristics may be deteriorated. The top surface 143 of each of the recesses 128 may include a first region d5 in which the first insulation layer 131 is in contact with the first conductive semiconductor layer 122, a second region d4 in which the second insulation layer 132 is in contact with the first conductive semiconductor layer 122, and a third region d6 in which the first electrode 142 is in contact with the first conductive semiconductor layer 122. The third region d6 may be equal to the width W of the first electrode 142.

When the first insulation layer 142 and the second insulation layer 132 are made of the same material, the first insulation layer 142 and the second insulation layer 132 may not be distinguished by physical and/or chemical composition. In this case, the sum of the width of the first region d5 and the width of the second region d4 may be defined as the width of the first region d5 or the width of the second region d4.

The third region d6 may be narrowed as the first region d5 is widened, and the third region d6 may be widened as the first region d5 is widened.

The width of the first region d5 may range from 11 μm to 28 μm. When the width is less than 11 μm, it is difficult to secure a processing margin, and thus device reliability may be reduced. When the width is greater than 28 μm, the width W3 of the first electrode 142 decreases so much that electrical characteristics may be deteriorated.

The width of the third region d6 may be determined by adjusting the widths of the first region d5 and the second region d4. In order to uniformly spread electric current over the device and optimize injection of electric current, the width of each of the recesses 128 may be freely designed to be within the aforementioned range.

Also, the area of each of the recesses 128 may be determined by adjusting the widths of the first region S5, the second region d4, and the third region d6. When the area of each of the recesses 128 increases, the disposition area of the second electrode 246 decreases. Thus, the ratio of the first electrode 142 to the second electrode 246 may be determined, and the width of each of the recesses 128 may be freely designed to be within the aforementioned range in order to optimize electric current density by matching densities of electrons and holes.

The second electrode 246 may be thinner than the first insulation layer 131.

The second electrode 246 may be separated from the first insulation layer 131 by a first separation distance S2 ranging from 1 μm to 4 μm. When the first separation distance S4 is less than 1 μm, it is difficult to secure a processing margin and thus there may be a reduction in reliability. When the separation distance S2 is greater than 4 μm, the disposition area of the second electrode 246 is so small that the operating voltage may rise.

The second conductive layer 150 may cover the second electrode 246. Accordingly, the second electrode pad 166, the second conductive layer 150, and the second electrode 246 may form one electrical channel.

The second conductive layer 150 may fully surround the second electrode 246 and may be in contact with the side surface and the top surface of the first insulation layer 131. The second conductive layer 150 may be made of a material with high adhesion strength to the first insulation layer 131 and may also be made of at least one material selected from a group consisting of Cr, Al, Ti, Ni, and Au, or an alloy thereof. The second conductive layer 150 may be formed as a single or multiple layers.

When the second conductive layer 150 is in contact with the side surface and the top surface of the first insulation layer 131, it is possible to enhance thermal and electrical reliability of the second electrode 246. Also, the second conductive layer 150 may have a reflection function for upwardly reflecting light emitted from a gap between the first insulation layer 131 and the second electrode 246.

The second conductive layer 150 may be disposed a second separation distance between the first insulation layer 131 and the second electrode 246. The second conductive layer 150 may be disposed in contact with the side surface and the top surface of the second electrode 246 and the side surface and the top surface of the first insulation layer 131 at the second separation distance.

Also, a region where a Schottky junction is formed by the second conductive semiconductor layer 126 coming into contact with the second conductive layer 150 may be within the second separation distance. By forming the Schottky junction, it is possible to facilitate spreading of electric current.

The second insulation layer 132 may electrically insulate the second electrode 246 and the second conductive layer 150 from the first conductive layer 165. The first conductive layer 165 may extend into a recess formed on the second insulation layer 132 and may be electrically connected to the first electrode 142.

The first insulation layer 131 may have a smaller thickness than the second insulation layer 132. For example, the thickness of the first insulation layer 131 may range from 3,000 angstroms to 7,000 angstroms. When the thickness is less than 3,000 angstroms, there may be a reduction in electrical reliability. When the thickness is greater than 7,000 angstroms and the second conductive layer 150 is disposed on the top surface and side surface of the first insulation layer 131, the second conductive layer 150 may have poor step coverage characteristics, thereby causing a detachment or crack. When a detachment or crack is caused, there may be a reduction in electrical reliability or a reduction in light extraction efficiency.

The thickness of the second insulation layer 132 may range from 4,000 angstroms to 10,000 angstroms. When the thickness is less than 4,000 angstroms, there may be a deterioration in electrical reliability when the device operates. When the thickness is greater than 10,000 angstroms, there may be a reduction in reliability due to a pressure or a thermal stress applied to the device when the device is processed, and also the cost of the device may increase due to a long processing time. The thicknesses of the first insulation layer 131 and the second insulation layer 132 are not limited thereto.

The first conductive semiconductor layer 122 may be made of a group III-V or group II-VI compound semiconductor. Also, the first conductive semiconductor layer 122 may be doped with a first dopant. The first conductive semiconductor layer 122 may be made of a material selected from among semiconductor materials having an empirical formula $In_{x1}Al_{y1}Ga_{1-x1-y1}N$ (0≤x1≤1, 0≤y1≤1, and 0≤x1+y1≤1), for example, GaN, AlGaN, InGaN, InAlGaN, and so on. Also, the first dopant may be an n-type dopant such as Si, Ge, Sn, Se, and Te. When the first dopant is an n-type dopant, the first conductive semiconductor layer 122 doped with the first dopant may be an n-type semiconductor layer.

The first conductive semiconductor layer 122 may have a low resistance layer 122a having a relatively low aluminum composition and a high resistance layer 122b having a relatively high aluminum composition. The aluminum composition of the high resistance layer 122b may range from 60% to 70%, and the aluminum composition of the low resistance layer 122a may range from 40% to 50%. The low resistance layer 122a may be disposed adjacent to the active layer 124.

The first electrode 142 may be disposed inside the low resistance layer 122a. That is, it is preferable that the recesses 128 be formed in the low resistance layer 122a. This is because the high resistance layer 122b has a high aluminum composition and relatively low electric current spreading characteristics. Accordingly, the first electrode 142 may be in contact with and thus ohmic with the low resistance layer 122a inside each of the recesses 128, and light emitted to the high resistance layer 122b is not absorbed by the high resistance layer 122b, and thus it is possible to enhance the light emitting efficiency.

The active layer 124 is a layer in which electrons (or holes) injected through the first conductive semiconductor layer 122 are combined with holes (or electrons) injected through the second conductive semiconductor layer 126. The active layer 124 may transition to a lower energy level due to recombination between an electron and a hole and generate light having a wavelength corresponding to the transition.

The active layer 124 may have, but is not limited to, any one of a single-well structure, a multi-well structure, a single-quantum-well structure, a multi-quantum-well (MQW) structure, a quantum dot structure, and a quantum wire structure. The active layer may contain Al.

The second conductive semiconductor layer 126 may be formed on the active layer 124 and may be made of a group III-V or group II-VI compound semiconductor. Also, the second conductive semiconductor layer 127 may be doped with a second dopant. The second conductive semiconductor layer 126 may be made of a semiconductor material having an empirical formula $In_{x5}Al_{y2}Ga_{1-x5-y2}N$ (0≤x5≤1, 0≤y2≤1, and 0≤x5+y2≤1) or a material selected from among AlInN, AlGaAs, GaP, GaAs, GaAsP, and AlGaInP. When the second dopant is a p-type dopant such as Mg, Zn, Ca, Sr, and Ba, the second conductive semiconductor layer 126 doped with the second dopant may be a p-type semiconductor layer.

When the second conductive semiconductor layer 126 is made of AlGaN, hole injection may not be facilitated due to low electric conductivity. Accordingly, GaN, which has relatively high electric conductivity and has the same polarity as the second conductive semiconductor layer 126, may be disposed on the bottom of the second conductive semiconductor layer 126. However, the present invention is not limited thereto. As will be described below, a surface layer of the second conductive semiconductor layer 126 in contact with the second electrode may be made of AlGaN.

Referring to FIG. 1 again, the second conductive layer 150 may electrically connect the second electrode 246 to the second electrode pad 166.

The second conductive layer 150 may be made of at least one material selected from a group consisting of Cr, Al, Ti, Ni, and Au, or an alloy thereof. Also, the second conductive layer 150 may be formed as a single or multiple layers.

The first conductive layer 165 and a junction layer 160 may be disposed depending on the shape of the bottom surface of the light emitting structure 120 and the shape of the recesses 128. The first conductive layer 165 may be made of a material with high reflectance. For example, the first conductive layer 165 may contain aluminum. When the first conductive layer 165 contains aluminum, the first conductive layer 165 may serve to upwardly reflect light emitted from the active layer 124 toward a substrate 170, thereby enhancing light extraction efficiency.

The junction layer 160 may contain a conductive material. For example, the junction layer 160 may contain a material selected from a group consisting of gold, tin, indium, aluminum, silicon, silver, nickel, and copper, or an alloy thereof.

The substrate 170 may be made of a conductive material. For example, the substrate 170 may contain a metal or a semiconductor material. The substrate 170 may be made of a metal with high electrical conductivity and/or thermal conductivity. In this case, heat generated during operation of the semiconductor device may be quickly released to the outside.

The substrate 170 may contain a material selected from a group consisting of silicon, molybdenum, tungsten, copper, and aluminum, or an alloy thereof.

The second electrode pad 166 may be made of a conductive material. The second electrode pad 166 may have a single-layered or multi-layered structure and may contain titanium Ti, nickel Ni, silver Ag, and gold Au. For example, the second electrode pad 166 may have a structure of Ti/Ni/Ti/Ni/Ti/Au.

The passivation layer 180 may be disposed on the top surface and the side surface of the light emitting structure 120. The passivation layer 180 may have a thickness ranging from 2,000 angstroms to 5,000 angstroms. When the thickness is less than 2,000 angstroms, the thickness is not enough to protect the device from external moisture or foreign substances, and thus there may be a reduction in electrical an optical reliability of the device. When the thickness is greater than 5,000 angstroms, there may be a reduction in optical and electrical reliability due to an increased stress applied to the device or the cost of the device may increase due to a long processing time.

A square wave pattern may be formed on top of the light emitting structure 120. The square wave pattern may enhance extraction efficiency for light emitted from the light emitting structure 120. The square wave pattern may have a different average height depending on ultraviolet wavelengths. For UV-C, the average height ranges from 300 nm to 800 nm. When the average height ranges from 500 nm to 600 nm, it is possible to enhance light extraction efficiency.

Figure 3:
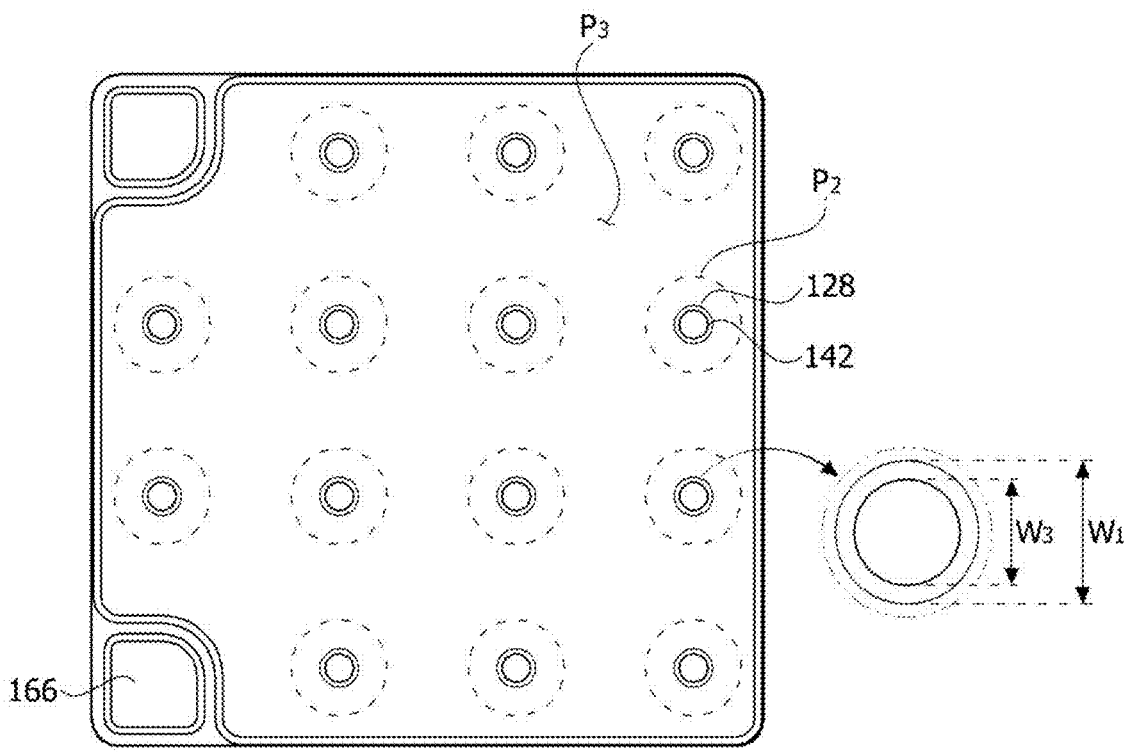
FIG. 3 is a plan view of the semiconductor device according to the first embodiment of the present invention.
Figure 4:
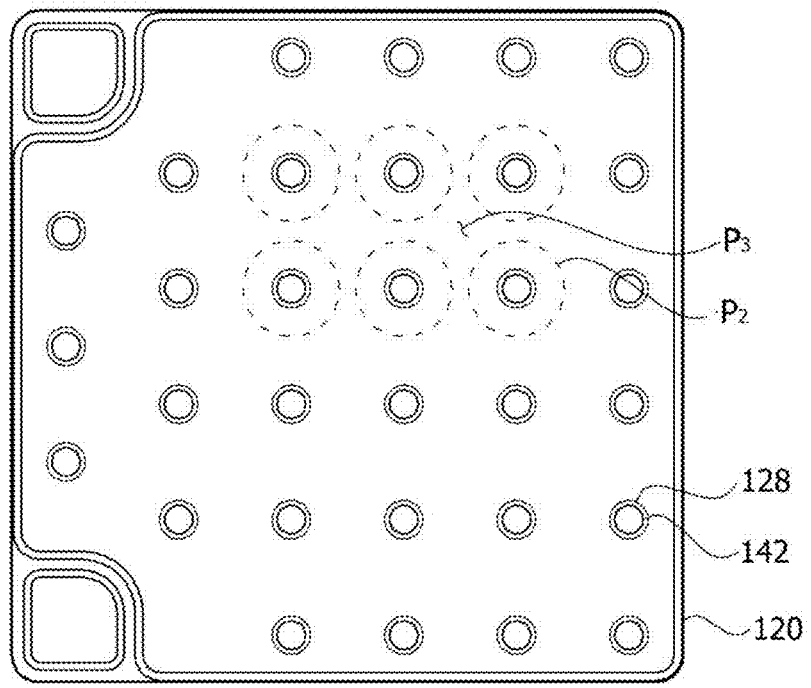
FIG. 4 is a plan view of a semiconductor device according to a second embodiment of the present invention.
Figure 5:
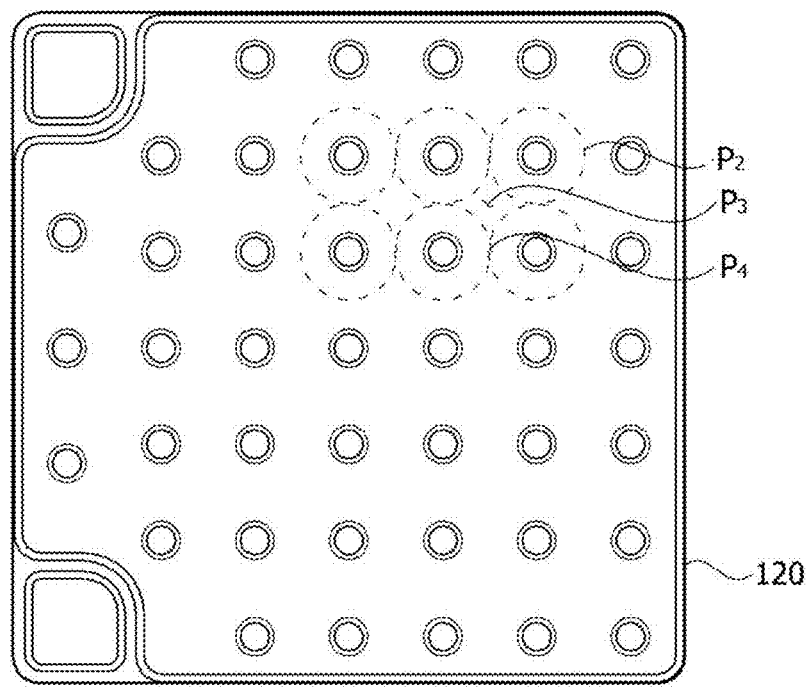
FIG. 5 is a plan view of a semiconductor device according to a third embodiment of the present invention.
Figure 6:
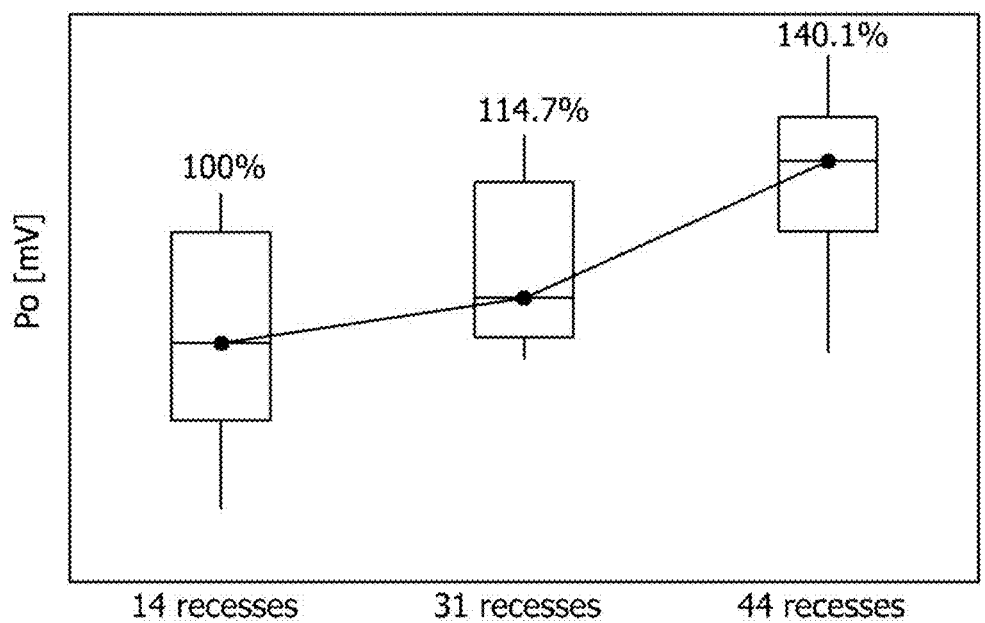
FIG. 6 is a graph obtained by measuring optical output power of the semiconductor devices according to the first to third embodiments.
Figure 7:
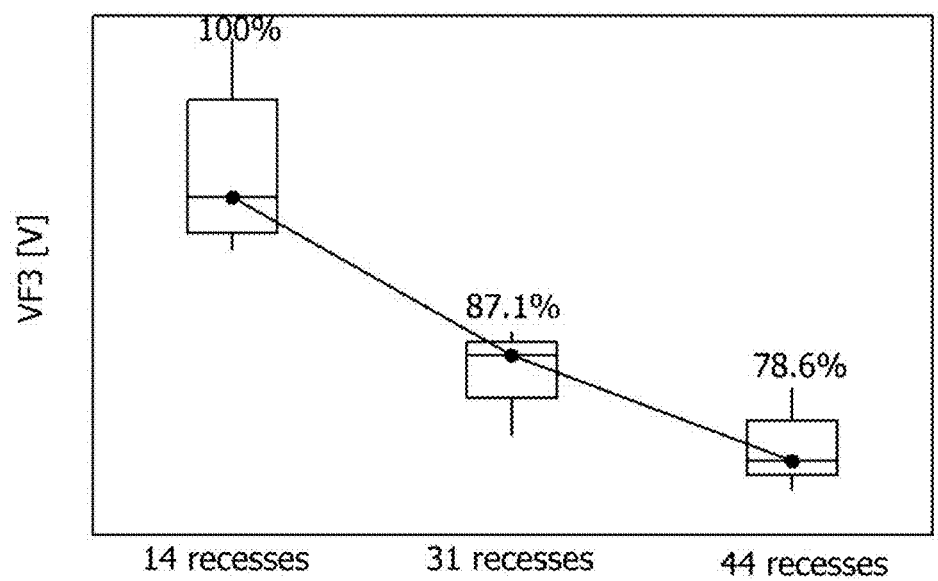
FIG. 7 is a graph obtained by measuring operating voltages of the semiconductor devices according to the first to third embodiments.

FIG. 3 is a plan view of the semiconductor device according to the first embodiment of the present invention, FIG. 4 is a plan view of a semiconductor device according to a second embodiment of the present invention, FIG. 5 is a plan view of a semiconductor device according to a third embodiment of the present invention, FIG. 6 is a graph obtained by measuring optical output power of the semiconductor devices according to the first to third embodiments, and FIG. 7 is a graph obtained by measuring operating voltages of the semiconductor devices according to the first to third embodiments.

Referring to FIG. 3, when an aluminum composition increases, electric current spreading characteristics may be deteriorated. Accordingly, electric current may be spread to only points adjacent to the first electrode 142, and electric current density may rapidly decrease at points apart from the electrode 142. Accordingly, an effective light emitting region P2 may be narrowed. The region from a point adjacent to the first electrode 142 having the highest electric current density to a boundary point having an electric current density of 40% or less may be defined as the effective light emitting region P2. For example, a point spaced 5 μm to 40 μm from the center of each of the recesses 128 may be defined as a boundary point. However, the level of injected electric current may change depending on the aluminum composition, In particular, a low electric current density region P3, which is a region between adjacent first electrodes 142, has a low electric current density and thus may hardly contributes to light emission. Therefore, according to an embodiment, a larger number of first electrodes 142 may be disposed in the low electric current density region C3, which has a low electric current density, thereby enhancing optical output power.

For example, it can be seen from FIG. 4 that the area of the low electric current density region P3 may be decreased compared to FIG. 4. Also, it can be seen from FIG. 5 that the area of the low electric current density region P3 may be further decreased compared to FIG. 4.

Generally, since a GaN semiconductor layer has relatively good electric current spreading characteristics, it is preferable that the area of the recess and the area of the first electrode be minimized. This is because the area of the active layer decreases as the area of the recess and the area of the first electrode increase. However, according to an embodiment, the electric current spreading characteristics are relatively low because the aluminum composition is high. Accordingly, it may be preferable to increase the number of first electrodes while sacrificing the area of the active layer.

The ratio of the diameter W1 of the recess to the entire size of the chip may range from 1:0.038 to 1:0.060. When the ratio is less than 1:0.038, it is difficult to secure a processing margin for forming the first electrode 142 disposed inside each of the recesses 128. When the ratio is greater than 1:0.060, the removed volume of the light emitting layer 124 adjacent to the first electrode 142 increases, and thus there may be a reduction in light emission efficiency. For example, the size of the chip may be 1,000 μm, but is not limited thereto.

Also, the ratio of the diameter W3 of the first electrode to the entire size of the chip may range from 1:0.024 to 1:0.050. When the ratio is less than 1:0.024, electric current injected into the first conductive semiconductor layer 122 may not be sufficient. When the ratio is greater than 1:0.050, the number of first electrodes 142 disposed in the area of the first conductive semiconductor layer 122 may not be sufficient, and thus it may be disadvantageous in terms of the electric current spreading characteristics.

Referring to FIG. 6, it can be seen from the second embodiment in which the number of recesses 128 is 31 that the optical output power is enhanced to 114.7% of the optical output power (100%) of the first embodiment in which the number of recesses 128 is 14. Also, it can be seen that the optical output power is enhanced to 140.1% when the number of recesses is 44. That is, it can be seen that the entire area of the active layer is reduced, but the area of the active layer that participates in light emission is increased.

Referring to FIG. 7, it can be seen from the second embodiment in which the number of recesses 128 is 31 that the operating voltage is lowered to 87% of the operating voltage (100%) of the first embodiment in which the number of recesses 128 is 14. Also, it can be seen that the operating voltage is lowered to 78% when the number of recesses is 44. That is, it can be seen that the electric current spreading characteristics are enhanced due to an increase in total area of the first electrodes, thus lowering the operating voltage.

Figure 8:
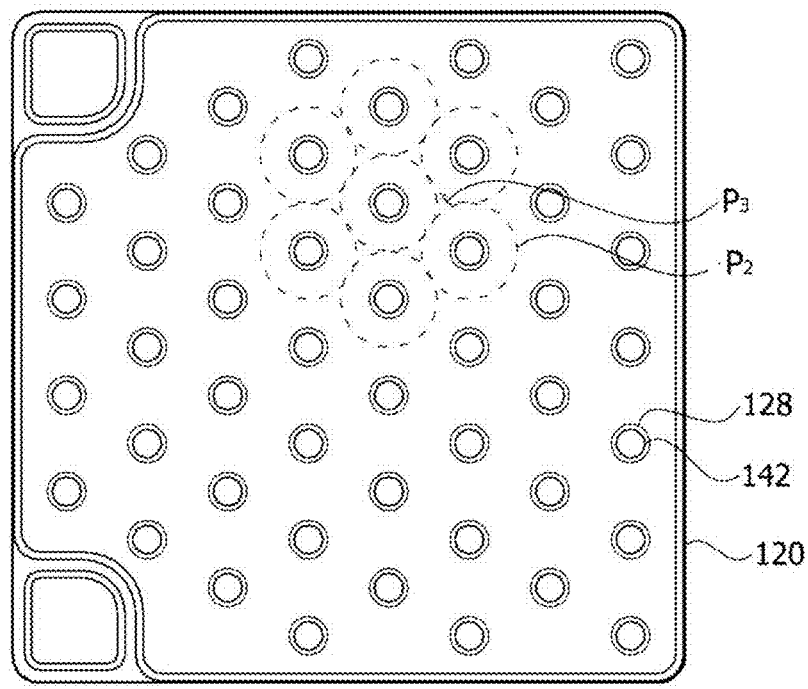
FIG. 8 is a plan view of a semiconductor device according to a fourth embodiment of the present invention.
Figure 9:
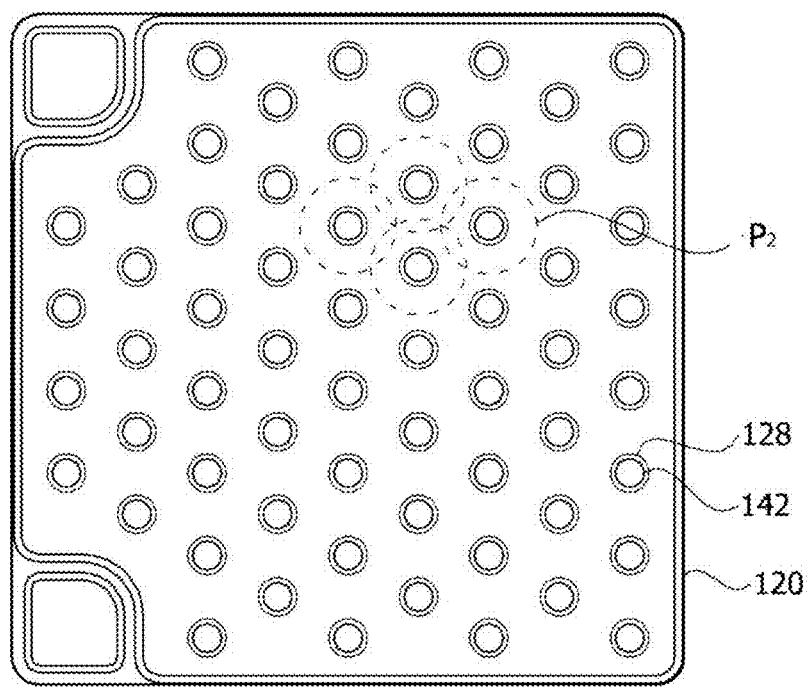
FIG. 9 is a plan view of a semiconductor device according to a fifth embodiment of the present invention.
Figure 10:
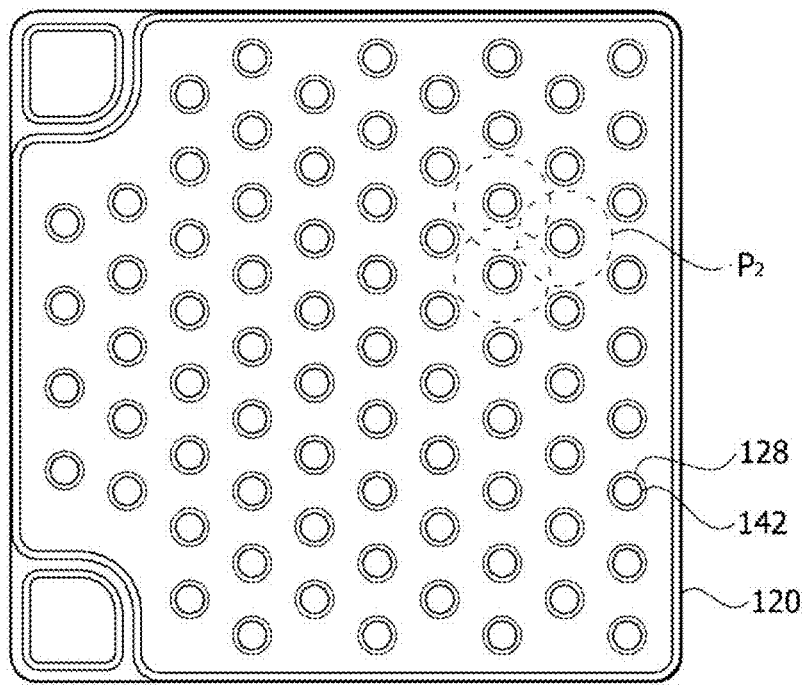
FIG. 10 is a plan view of a semiconductor device according to a sixth embodiment of the present invention.
Figure 11:
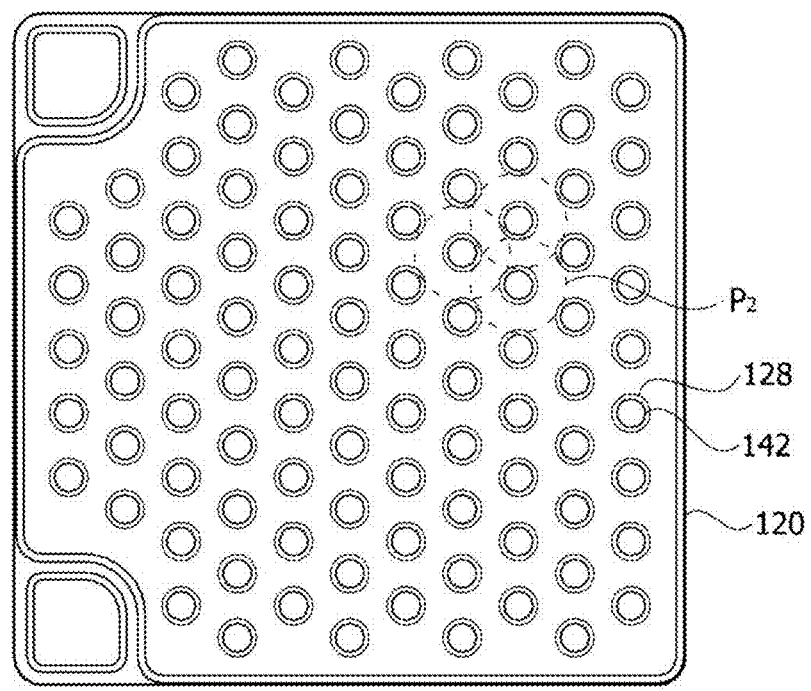
FIG. 11 is a plan view of a semiconductor device according to a seventh embodiment of the present invention.
Figure 12:
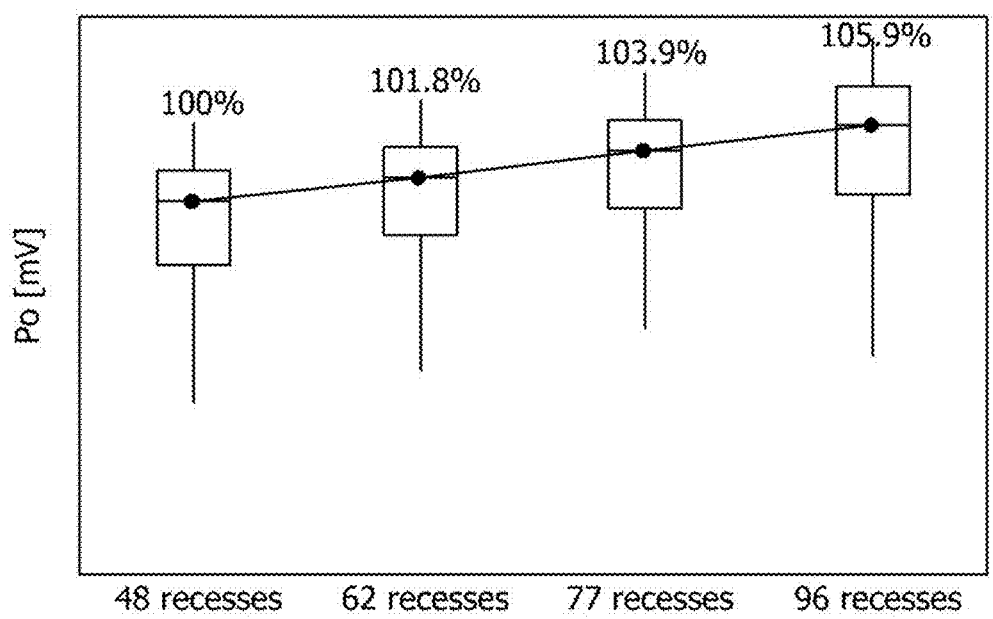
FIG. 12 is a graph obtained by measuring optical output power of the semiconductor devices according to the fourth to seventh embodiments.
Figure 13:
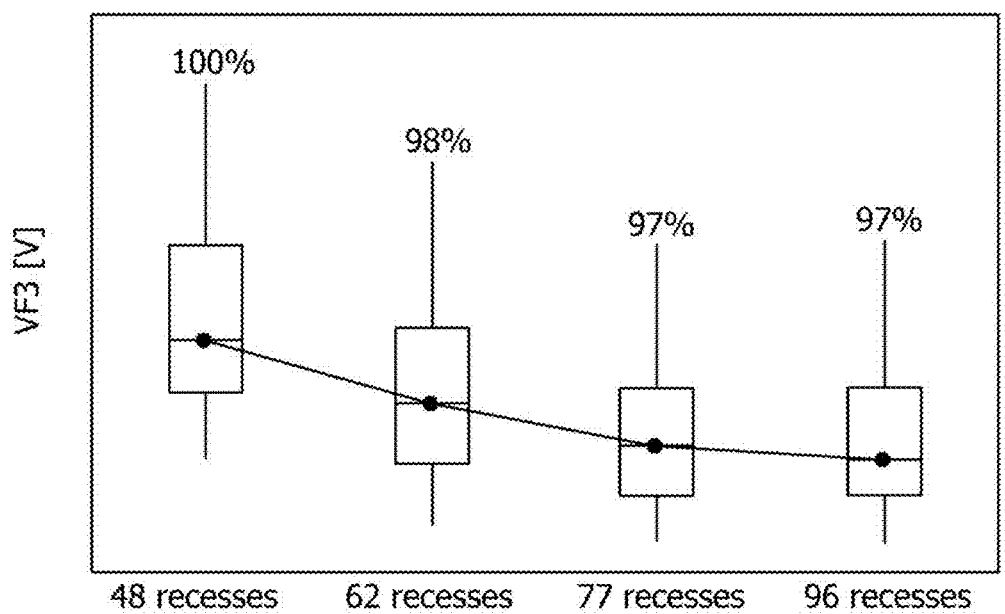
FIG. 13 is a graph obtained by measuring operating voltages of the semiconductor devices according to the fourth to seventh embodiments.

FIG. 8 is a plan view of a semiconductor device according to a fourth embodiment of the present invention, FIG. 9 is a plan view of a semiconductor device according to a fifth embodiment of the present invention, FIG. 10 is a plan view of a semiconductor device according to a sixth embodiment of the present invention, FIG. 11 is a plan view of a semiconductor device according to a seventh embodiment of the present invention, FIG. 12 is a graph obtained by measuring optical output power of the semiconductor devices according to the fourth to seventh embodiments, and FIG. 13 is a graph obtained by measuring operating voltages of the semiconductor devices according to the fourth to seventh embodiments.

Referring to FIG. 8, when the number of recesses 128 is 48, the recesses 128 may be arranged in a zigzag form instead of being straightly arranged in a horizontal or vertical direction. In this case, it can be seen that the area of the low electric current density region P3 may be further decreased.

Referring to FIGS. 9 to 11, it can be seen that effective light emitting regions P2 overlaps with each other when the number of recesses 128 exceeds 62. Accordingly, most of the active layer may participate in light emission.

A first area of where a plurality of first electrodes 142 are in contact with the first conductive semiconductor layer 122 may range from 7.4% to 20% or from 10% to 20% of the maximum horizontal sectional area of the light emitting structure 120. The first area may be the total area of where the first electrodes 142 are in contact with the first conductive semiconductor layer 122.

When the first area of the plurality of first electrodes 142 is less than 7.4%, electric current spreading characteristics cannot be sufficient, and thus the optical output power decreases. When the first area is greater than 20%, the areas of the active layer 126 and the second electrode 246 excessively decrease, and thus the operating voltage rises and the optical output power decreases.

Also, the total area of the plurality of recesses 128 may range from 13% to 30% of the maximum horizontal sectional area of the light emitting structure 120. When the total area of the recesses 128 does not fall within this range, it is difficult to keep the total area of the first electrodes 142 within the range of 7.4% to 20%. Also, there are an increase in operating voltage and a decrease in optical output power.

A second area of where the second electrode 246 is in contact with the second conductive semiconductor layer 126 may range from 35% to 70% of the maximum horizontal sectional area of the light emitting structure 120. The second area may be the total area of where the second electrode 246 is in contact with the second conductive semiconductor layer 126.

When the second area is less than 35%, the area of the second electrode is so small that the operating voltage may rise and hole injection efficiency may decrease. When the second area exceeds 70%, the first area cannot be effectively widened, and thus electron injection efficiency may decrease.

That is, the first area is inversely proportional to the second area. When the number of recesses is increased to increase the number of first electrodes, the area of the second electrode decreases. In order to increase the light output power, the spreading characteristics of electrons and holes should be balanced. Accordingly, it is important to determine an appropriate ratio between the first area and the second area.

Referring to FIG. 12, it can be seen that when comparing with the fourth embodiment in which the optical output power is 100% and the number of recesses 128 is 48, optical output power is enhanced when the number of recesses 128 is increased. Also, referring to FIG. 13, it can be seen that when comparing with the fourth embodiment in which the optical output power is 100% and the number of recesses 128 is 48, operating voltage is lowered when the number of recesses 128 is increased.

As shown in Table 1 below, the areas of the light emitting structures of the first to seventh embodiments, the area of a p-ohmic electrode (the second area), the area of recesses, the area of an n-ohmic electrode (the first area), and the number of recesses were measured.

The maximum horizontal area of the light emitting structure may be an area obtained by summing the area of the light emitting structure and the area of the recesses. That is, the maximum horizontal area (the sum of the areas of the light emitting structure and the recesses) of the light emitting structure may be 100%, and each area may be calculated on the basis of the maximum horizontal area of the light emitting structure.

The area of the light emitting structure may be the maximum area of the light emitting structure excluding the area of the recesses. That is, as the area of the recesses increases, the area of the light emitting structure decreases.

The area of the recesses is a proportion of the total area occupied by the recesses.

The area of a p-ohmic electrode may be a proportion of the area of the second electrode decreasing as the number of recesses increases.

The area of an n-ohmic electrode may be a proportion of the area of the first electrode increasing as the number of recesses increases.

TABLE 1

|  | Area of light emitting structure [%] | Area of p-ohmic electrode [%] | Area of recesses [%] | Area of n-ohmic electrode [%] | Area ratio (n electrode:p electrode) | Number of recesses |
|---|---|---|---|---|---|---|
| Embodiment 1 | 96.1 | 88.1 | 3.9 | 2.2 | 1:40 | 14 |
| Embodiment 2 | 91.3 | 79.4 | 8.7 | 4.8 | 1:16.5 | 31 |
| Embodiment 3 | 87.5 | 73.5 | 12.5 | 7.0 | 1:10.5 | 44 |
| Embodiment 4 | 86.4 | 70.7 | 13.6 | 7.4 | 1:9.55 | 48 |

TABLE 1-continued

|  | Area of light emitting structure [%] | Area of p-ohmic electrode [%] | Area of recesses [%] | Area of n-ohmic electrode [%] | Area ratio (n electrode:p electrode) | Number of recesses |
|---|---|---|---|---|---|---|
| Embodiment 5 | 82.4 | 63.4 | 17.6 | 9.7 | 1:6.53 | 62 |
| Embodiment 6 | 78.1 | 55.6 | 21.9 | 12.1 | 1:4.59 | 77 |
| Embodiment 7 | 72.5 | 45.6 | 27.5 | 15.1 | 1:3.01 | 96 |

Referring to the first to seventh embodiments, it can be seen that as the number of recesses 128 increases, the area of the light emitting structure and the area of the second electrode (a p-ohmic electrode) decrease and the total area of the recesses 128 and the area of the first electrode (an n-ohmic electrode) gradually increase.

The ratio of the first area of where the plurality of first electrodes 142 are in contact with the first conductive semiconductor layer to the second area of where the second electrode 246 is in contact with the second conductive semiconductor layer (first area:second area) may range from 1:3 to 1:7.

When the area ratio is greater than 1:10, the first area is so relatively small that the electric current spreading characteristics may be deteriorated. For example, in the first embodiment, the first area is only about 1.8%, and thus the electric current injection efficiency may be reduced. As a result, light is emitted only in regions adjacent to the first electrode.

In the first to seventh embodiments, the size of the chip, the size of the recesses, and the size of the first electrodes may be controlled in the same way. For example, the recesses 128 may have a diameter of 56 µm, and the first electrodes may have a diameter of 42 µm. As the number of recesses and the number of first electrodes increase, the first area increases and the second area decreases.

Figure 14:
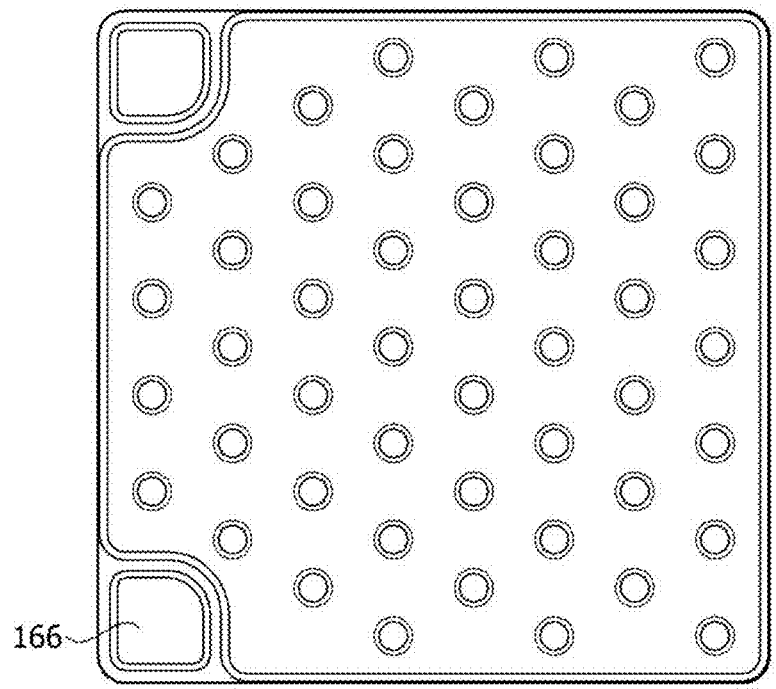
FIG. 14 is a plan view of a semiconductor device according to an eighth embodiment of the present invention.
Figure 15:
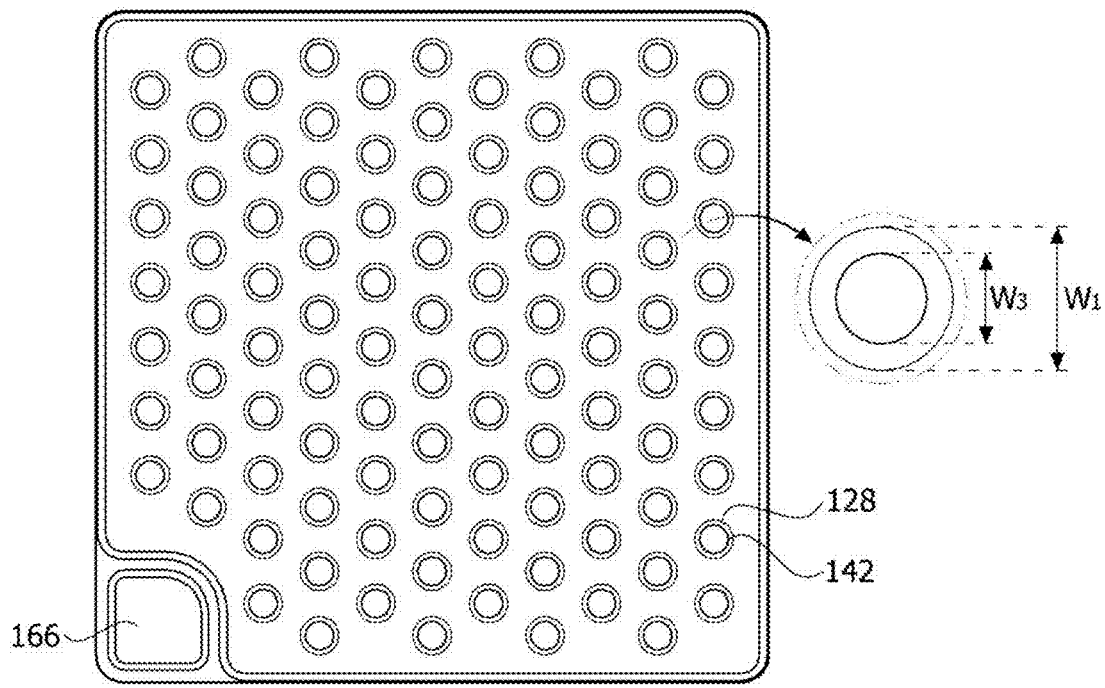
FIG. 15 is a plan view of a semiconductor device according to a ninth embodiment of the present invention.
Figure 16:
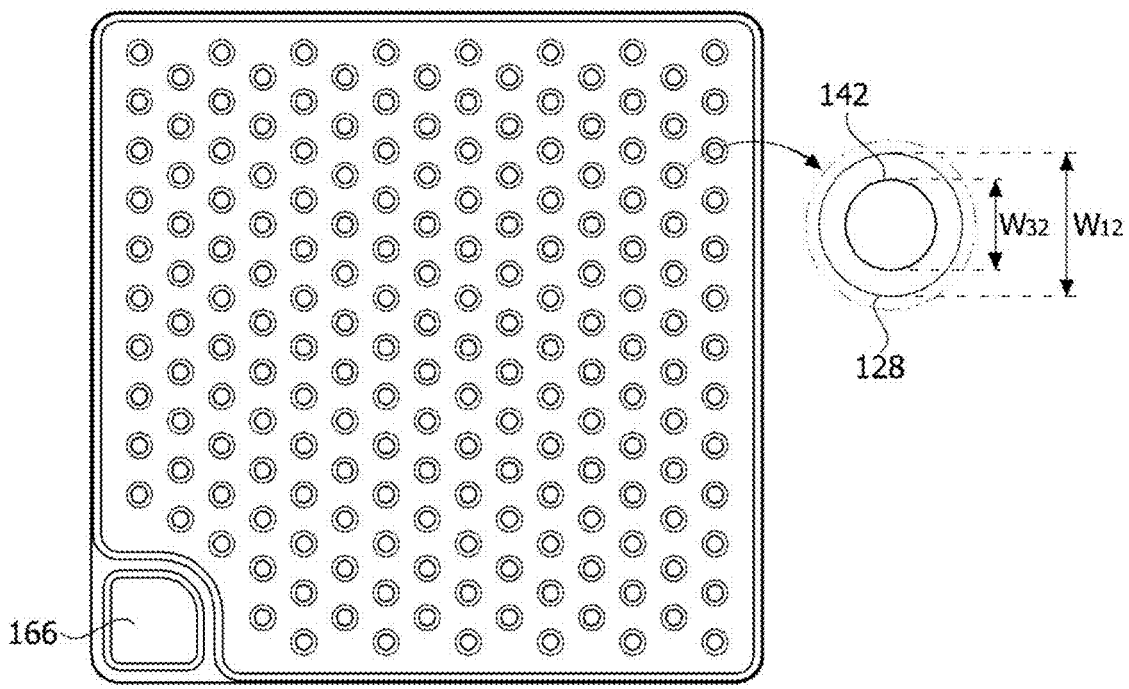
FIG. 16 is a plan view of a semiconductor device according to a tenth embodiment of the present invention.
Figure 17:
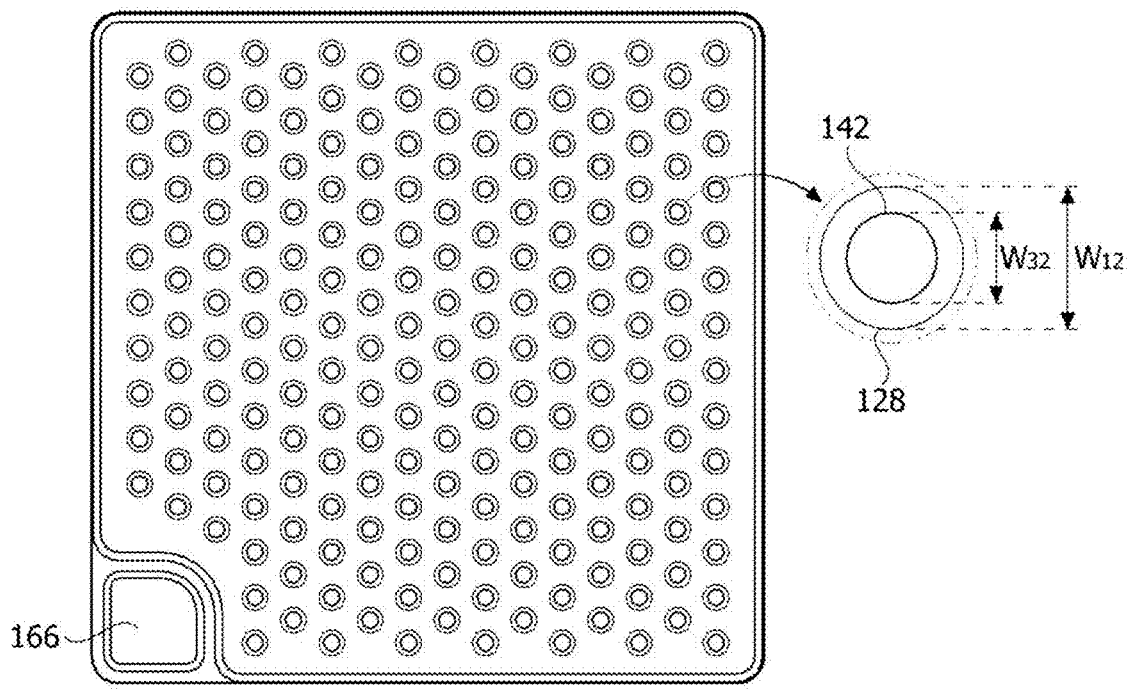
FIG. 17 is a plan view of a semiconductor device according to an eleventh embodiment of the present invention.
Figure 18:
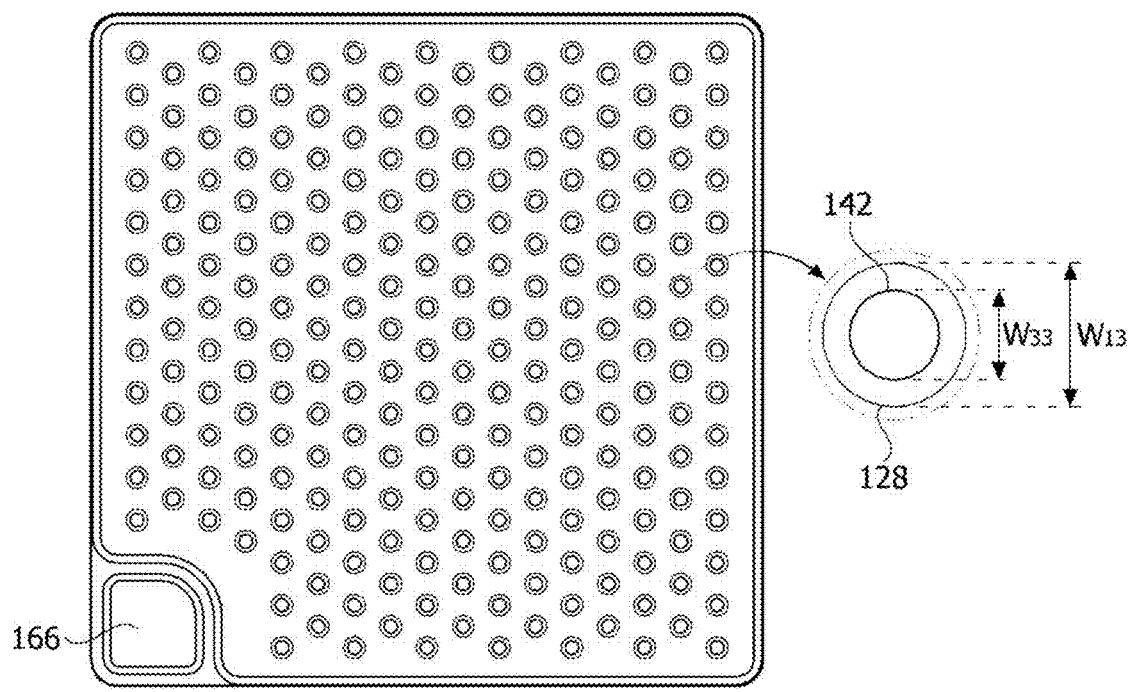
FIG. 18 is a plan view of a semiconductor device according to a twelfth embodiment of the present invention.
Figure 19:
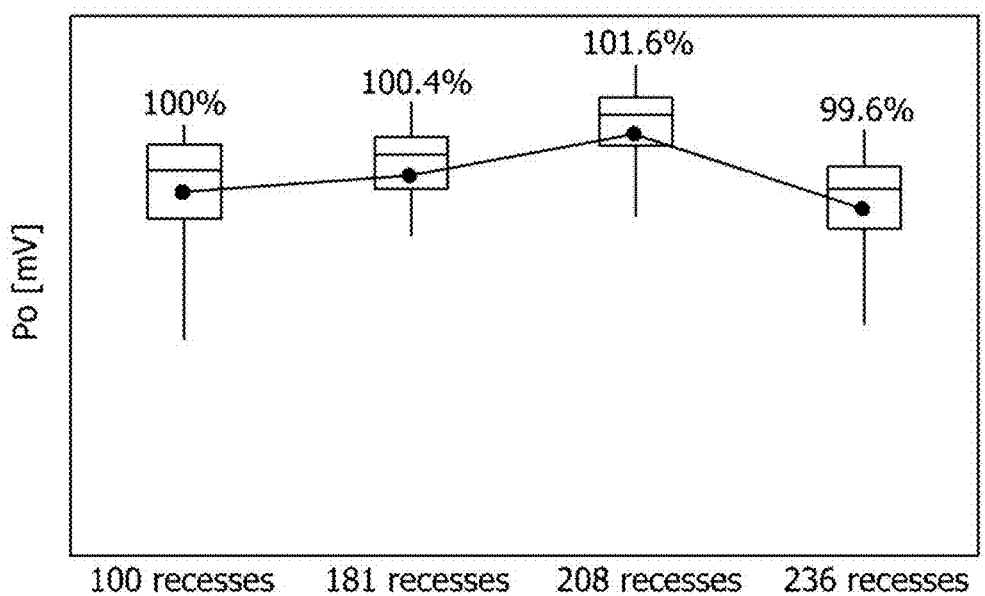
FIG. 19 is a graph obtained by measuring optical output power of the semiconductor devices according to the ninth to twelfth embodiments.
Figure 20:
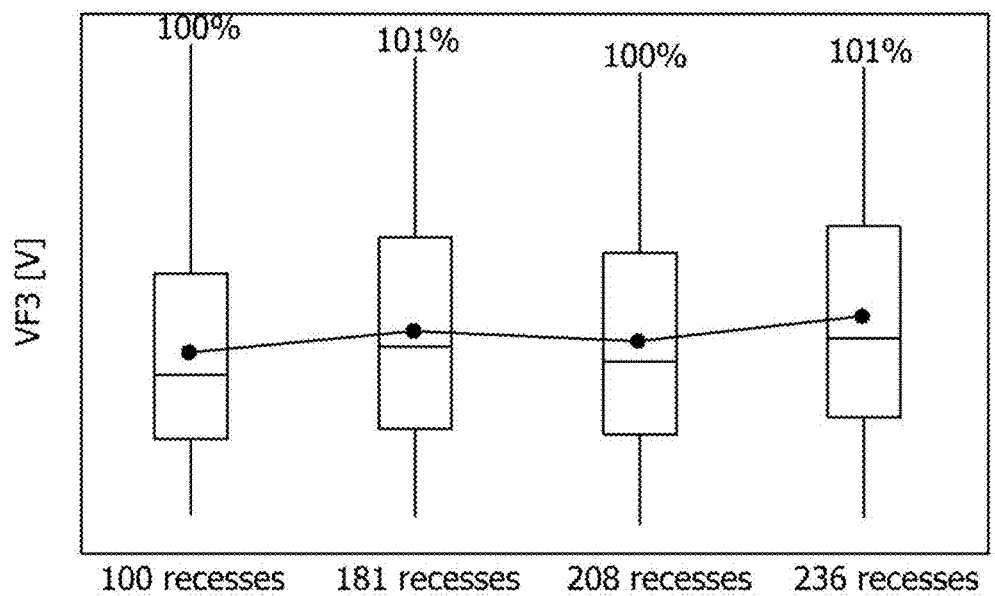
FIG. 20 is a graph obtained by measuring operating voltages of the semiconductor devices according to the ninth to twelfth embodiments.

FIG. 14 is a plan view of a semiconductor device according to an eighth embodiment of the present invention, FIG. 15 is a plan view of a semiconductor device according to a ninth embodiment of the present invention, FIG. 16 is a plan view of a semiconductor device according to a tenth embodiment of the present invention, FIG. 17 is a plan view of a semiconductor device according to an eleventh embodiment of the present invention, FIG. 18 is a plan view of a semiconductor device according to a twelfth embodiment of the present invention, FIG. 19 is a graph obtained by measuring optical output power of the semiconductor devices according to the ninth to twelfth embodiments, and FIG. 20 is a graph obtained by measuring operating voltages of the semiconductor devices according to the ninth to twelfth embodiments.

Referring to FIG. 16, the diameter of the recesses 128 is decreased in order to increase the number of recesses 128 to 181. For example, the recesses 128 may have a diameter W13 of 38 µm, and the first electrodes may have a diameter W32 of 24 µm.

Also, referring to FIG. 18, the diameter of the recesses 128 is further decreased in order to increase the number of recesses 128 to 236. For example, the recesses 128 may have a diameter W13 of 32 µm, and the first electrodes may have a diameter W33 of 20 µm.

Referring to FIG. 19, it can be seen that the optical output power is slightly higher than the optical output power (100%) of the ninth embodiment when the number of recesses 128 is increased to 181 and 208. However, it can be seen that the light output power is decreased when the number of recesses 128 is increased to 236.

Referring to FIG. 20, it can be seen that the operating voltage is higher than the operating voltage of the ninth embodiment when the number of recesses 128 is increased to 181 and 236.

As shown in Table 2 below, the areas of the light emitting structures of the eighth to twelfth embodiments, the area of a p-ohmic electrode, the total area of recesses, the total area of n-ohmic electrodes, and the number of recesses were measured.

As defined in Table 1, the maximum horizontal area of the light emitting structure may be an area obtained by summing the area of the light emitting structure and the area of the recesses. That is, the maximum horizontal area (the sum of the areas of the light emitting structure and the recesses) of the light emitting structure may be 100%, and each area may be calculated on the basis of the maximum horizontal area of the light emitting structure.

TABLE 2

|  | Area of light emitting structure [%] | Area of p-ohmic electrode [%] | Area of recesses [%] | Area of n-ohmic electrode [%] | Area ratio (n electrode:p electrode) | Number of recesses |
|---|---|---|---|---|---|---|
| Embodiment 8 | 85.4 | 69.4 | 14.6 | 8.2 | 1:8.4 | 48 |
| Embodiment 9 | 71.5 | 60.7 | 28.5 | 16.0 | 1:3.78 | 100 |
| Embodiment 10 | 75.9 | 42.9 | 24.1 | 9.6 | 1:4.46 | 181 |
| Embodiment 11 | 72.3 | 35.0 | 27.7 | 11.0 | 1:3.18 | 208 |
| Embodiment 12 | 77.6 | 36.5 | 22.4 | 8.7 | 1:4.19 | 236 |

Referring to Table 2, it can be seen from the tenth to twelfth embodiments that the total area of recesses 128 and the total area of first electrodes are decreased despite an increase of the number of recesses 128.

That is, it can be seen that it is difficult to keep the ratio of the first area to the second area below 1:3 even though large numbers of recesses 128 and first electrodes 142 are disposed by reducing the diameters of the recesses 128 and the first electrodes 142.

Summarizing Table 1 and Table 2, when the ratio of the first area of where the plurality of first electrodes are in contact with the first conductive semiconductor layer to the second area of where the second electrode is in contact with the second conductive semiconductor layer (first area:second area) may range from 1:3 to 1:7 µm, it is possible to optimize the number or area of recesses, thus facilitating ease of production and also effectively increasing optical output power. It is also possible to effectively lower the operating voltage.

The ratio of the first area to the second area may be controlled in various ways. For example, when the number or area of recesses is increased, the first area may increase, and the second area may decrease.

However, the present invention is not limited thereto, and the ratio of the first area to the second area may be adjusted by controlling various factors.

For example, as shown in FIG. 2, the area of the first electrode may be controlled by controlling the width d5 of the first insulation layer disposed on top of the recesses, and the area of the second electrode may be controlled by controlling a separation distance between the second electrode 246 and the first insulation layer 131 extending to a lower portion of the second conductive semiconductor layer 126.

In the ninth to eleventh embodiments, when the total area of the recesses formed on the second conductive semiconductor layer is controlled to range from 20% to 30% of the maximum horizontal sectional area of the light emitting structure, it is possible to effectively increase the optical output power and lower the operating voltage.

The plurality of recesses may have an interval greater than 9.0 μm or 13.5 μm. As a result of measurement, an interval between second electrodes (an interval between recesses) is 56 μm in the eighth embodiment, 19 μm in the ninth embodiment, 13.5 μm in the tenth embodiment, 9.0 μm in the eleventh embodiment, and 8.5 μm in the twelfth embodiment. For the tenth to twelfth embodiments, the area of the active layer decreases, but the interval between second electrodes is narrowed. Thus, the optical output power is reduced, and the operating voltage increases.

Figure 21:
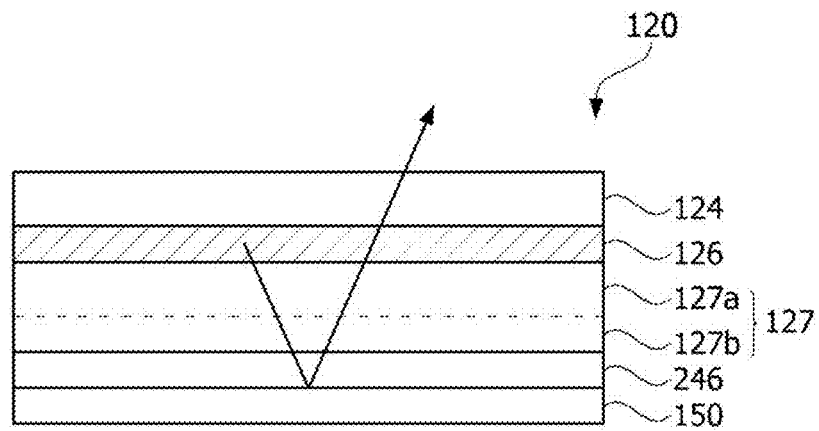
FIG. 21 is a conceptual view of a light emitting structure according to an embodiment of the present invention.
Figure 22:
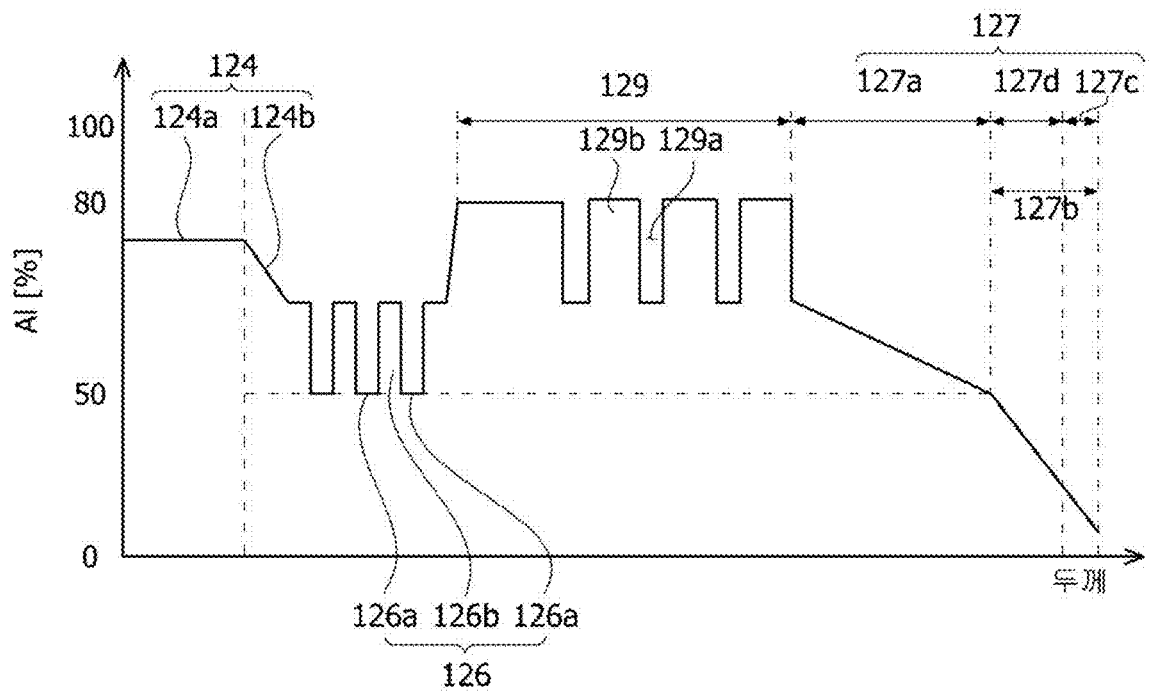
FIG. 22 is a graph obtained by measuring an aluminum composition of the light emitting structure.

FIG. 21 is a conceptual view of a light emitting structure according to an embodiment of the present invention, and FIG. 22 is a graph obtained by measuring an aluminum composition of the light emitting structure of FIG. 21.

The light emitting structure 120 according to an embodiment of the present invention may output ultraviolet wavelength light. For example, the light emitting structure may output near-ultraviolet wavelength light (UV-A), far-ultraviolet wavelength light (UV-B), or deep-ultraviolet wavelength light (UV-C). The wavelength range may be determined by the aluminum composition of the light emitting structure 120.

For example, the near-ultraviolet wavelength light (UV-A) may have a wavelength ranging from 320 nm to 420 nm, the far-ultraviolet wavelength light (UV-B) may have a wavelength ranging from 280 nm to 320 nm, and the deep-ultraviolet wavelength light (UV-C) may have a wavelength ranging from 100 nm to 280 nm.

Referring to FIG. 21, a semiconductor device according to an embodiment includes a light emitting structure 120 including a first conductive semiconductor layer 124, a second conductive semiconductor layer 127, and an active layer 126 disposed between the first conductive semiconductor layer 124 and the second conductive semiconductor layer 127.

The first conductive semiconductor layer 124 may be made of a group III-V or group II-VI compound semiconductor and may be doped with a first dopant. The first conductive semiconductor layer 124 may be made of a material selected from among semiconductor materials having an empirical formula $In_{x1}Al_{y1}Ga_{1-x1-y1}N$ ($0 \leq x1 \leq 1$, $0 \leq y1 \leq 1$, and $0 \leq x1+y1 \leq 1$), for example, GaN, AlGaN, InGaN, InAlGaN, and so on. Also, the first dopant may be an n-type dopant such as Si, Ge, Sn, Se, and Te. When the first dopant is an n-type dopant, the first conductive semiconductor layer 124 doped with the first dopant may be an n-type semiconductor layer.

The active layer 126 is disposed between the first conductive semiconductor layer 124 and the second conductive semiconductor layer 127. The active layer 126 is a layer in which electrons (or holes) injected through the first conductive semiconductor layer 124 are combined with holes (or electrons) injected through the second conductive semiconductor layer 127. The active layer 126 may transition to a lower energy level due to recombination between an electron and a hole and generate light having an ultraviolet wavelength.

The active layer 126 may have, but is not limited to, any one of a single-well structure, a multi-well structure, a single-quantum-well structure, a multi-quantum-well (MQW) structure, a quantum dot structure, and a quantum wire structure.

The second conductive semiconductor layer 127 may be formed on the active layer 126 and may be made of a group III-V or group II-VI compound semiconductor. Also, the second conductive semiconductor layer 127 may be doped with a second dopant. The second conductive semiconductor layer 127 may be made of a semiconductor material having an empirical formula $In_{x5}Al_{y2}Ga_{1-x5-y2}N$ ($0 \leq x5 \leq 1$, $0 \leq y2 \leq 1$, and $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, and Ba, the second conductive semiconductor layer 127 doped with the second dopant may be a p-type semiconductor layer.

The second conductive semiconductor layer 127 may include a 2-1 conductive semiconductor layer 127a having a high aluminum composition and a 2-2 conductive semiconductor layer 127b having a relatively low aluminum composition.

The second electrode 246 may be brought into ohmic contact with the 2-2 conductive semiconductor layer 127b. The second electrode 246 may include a transparent electrode having relatively low ultraviolet light absorption. For example, the second electrode 246 may be formed of ITO, but is not limited thereto.

Electric current may be injected from the second conductive layer 150 into the second conductive semiconductor layer 127. Also, the second conductive layer 150 may reflect light emitted from the active layer 126.

According to an embodiment, the second electrode 246 may be in direct contact with a semiconductor layer (e.g., P—AlGaN) having a band gap larger than energy of ultraviolet wavelengths. Conventionally, the second electrode 246 is disposed on a GaN layer having a small band gap to facilitate an ohmic connection, and thus most ultraviolet light is absorbed by the GaN layer. However, according to an embodiment, the second electrode 246 is in direct ohmic contact with P—AlGaN, and thus most light may pass through the second conductive semiconductor layer 127.

However, there is absorption of ultraviolet light by most second electrodes. Accordingly, there is a need to improve light extraction efficiency while maintaining ohmic contact by the second electrode.

Referring to FIG. 22, an electron-blocking layer 129 may be disposed between the active layer 126 and the second conductive semiconductor layer 127. The electron-blocking layer 129 may block electrons supplied from the first conductive semiconductor layer 124 from flowing out to the second conductive semiconductor layer 127, thus increasing the probability that electrons and holes in the active layer 126 will be recombined with each other. The electron-blocking layer 129 may have a higher energy band gap than the active layer 126 and/or the second conductive semiconductor layer 127.

The electron-blocking layer 129 may be made of a material selected from among semiconductor materials having an empirical formula $In_{x1}Al_{y1}Ga_{1-x1-y1}N$ ($0 \le x1 \le 1$, $0 \le y1 \le 1$, and $0 \le x1+y1 \le 1$), for example, AlGaN, InGaN, InAlGaN, and so on, but is not limited thereto. The electron-blocking layer 129 may have a first layer 129b having a high aluminum composition and a second layer 129a having a low aluminum composition alternately disposed therein.

The first conductive semiconductor layer 124, the active layer 126 including a barrier layer 126b and a well layer 126a, the 2-1 conductive semiconductor layer 127a, and the 2-2 conductive semiconductor layer 127b may all contain aluminum. Accordingly, the first conductive semiconductor layer 124, the barrier layer 126b, the well layer 126a, the 2-1 conductive semiconductor layer 127a, and the 2-2 conductive semiconductor layer 127b may be made of AlGaN. However, the present invention is not limited thereto.

The 2-1 conductive semiconductor layer 127a may have a thickness greater than 10 nm and less than 200 nm. When the thickness of the 2-1 conductive semiconductor layer 127a is less than 10 nm, resistance thereof increases in a horizontal direction, and thus there may be a reduction in electric current injection efficiency. Also, when the thickness of the 2-1 conductive semiconductor layer 127a is greater than 200 nm, resistance thereof increases in a vertical direction, and thus there may be a reduction in electric current injection efficiency.

The 2-1 conductive semiconductor layer 127a may have a higher aluminum composition than the well layer 126a. In order to generate ultraviolet light, the aluminum composition of the well layer 126a may range from about 30% to about 50%. When the 2-1 conductive semiconductor layer 127a has a lower aluminum composition than the well layer 126a, the 2-1 conductive semiconductor layer 127a absorbs light, and thus there may be a reduction in light extraction efficiency.

The aluminum composition of the 2-1 conductive semiconductor layer 127a may be greater than 40% and less than 80%. When the aluminum composition of the 2-1 conductive semiconductor layer 127a is less than 40%, absorption of light by the 2-1 conductive semiconductor layer 127a occurs. When the aluminum composition of the 2-1 conductive semiconductor layer 127a is greater than 80%, there is a deterioration in electric current injection efficiency. For example, when the aluminum composition of the well layer 126a is 30%, the aluminum composition of the 2-1 conductive semiconductor layer 127a may be 40%.

The 2-2 conductive semiconductor layer 127b may have a lower aluminum composition than a layer having the lowest aluminum composition among a plurality of well layers 126a. When the 2-2 conductive semiconductor layer 127b has a higher aluminum composition than the well layer 126a, resistance between the second electrode and the 2-2 conductive semiconductor layer 127b increases, and thus it may be difficult to sufficiently inject electric current.

The aluminum composition of the 2-2 conductive semiconductor layer 127b may be greater than 1% and less than 50%. When the aluminum composition is greater than 50%, the 2-2 conductive semiconductor layer 127b may not be sufficiently ohmic with a p-ohmic electrode. When the aluminum composition is less than 1%, the aluminum composition is almost a GaN composition, and thus the 2-2 conductive semiconductor layer 127b absorbs light.

The thickness of the 2-2 conductive semiconductor layer 127b may be greater than 1 nm and less than 30 nm. As described above, the 2-2 conductive semiconductor layer 127b has an aluminum composition low enough to be ohmic and thus may absorb ultraviolet light. Accordingly, it may be advantageous in terms of optical output power to control the 2-2 conductive semiconductor layer 127b to be as thin as possible.

When the thickness of the 2-2 conductive semiconductor layer 127b is controlled to be 1 nm or less, the 2-2 conductive semiconductor layer 127b is so thin that the 2-2 conductive semiconductor layer 127b may not be disposed in some sections, and also the 2-1 conductive semiconductor layer 127a may be partially exposed from the light emitting structure 120. Accordingly, it may be difficult for the 2-2 conductive semiconductor layer 127b to be formed as a single layer and also perform its role. Also, when the thickness is greater than 30 nm, the amount of absorbed light is so large that optical output power efficiency may decrease.

The 2-2 conductive semiconductor layer 127b may include a 2-3 conductive semiconductor layer 127c and a 2-4 conductive semiconductor layer 127d. The 2-3 conductive semiconductor layer 127c may be a surface layer in contact with the p-ohmic electrode, and the 2-4 conductive semiconductor layer 127d may be a layer for adjusting the aluminum composition.

The second-quadruple conductive semiconductor layer 127d may be disposed between the 2-1 conductive semiconductor layer 127a having a relatively high aluminum content and the 2-3 conductive semiconductor layer 127c having a relatively low aluminum content. Accordingly, it is possible to prevent a deterioration of crystallinity due to a rapid change in aluminum content.

The aluminum composition of the 2-3 conductive semiconductor layer 127c may be greater than 1% and less than 20%. Alternatively, the aluminum composition may be greater than 1% and less than 10%.

When the aluminum composition is less than 1%, the 2-3 conductive semiconductor layer 127c may have a light absorption rate that is too high. When the aluminum composition is greater than 20%, contact resistance of the second electrode (the p-ohmic electrode) increases, and thus the electric current injection efficiency may be reduced.

However, the present invention is not limited thereto, and the aluminum composition of the 2-3 conductive semiconductor layer 127c may be adjusted in consideration of the electric current injection characteristics and the light absorption rate. Alternatively, the aluminum composition may be adjusted according to optical output power required by a product.

For example, when the electric current injection characteristics are more important than the light absorption rate, the aluminum composition may be adjusted to be in the range of 1% to 10%. When the optical output power characteristics are more important than the electrical characteristics in products, the aluminum composition of the 2-3 conductive semiconductor layer 127c may be adjusted to be in the range of 1% to 20%.

When the aluminum composition of the 2-3 conductive semiconductor layer 127c is greater than 1% and less than 20%, resistance between the 2-3 conductive semiconductor layer 127c and the second electrode decreases, and thus the operating voltage may be lowered. Accordingly, it is possible to enhance the electrical characteristics. The thickness of the 2-3 conductive semiconductor layer 127c may be greater than 1 nm and less than 10 nm. Accordingly, it is possible to alleviate the light absorption problem.

The 2-2 conductive semiconductor layer 127b may have a smaller thickness than the 2-1 conductive semiconductor layer 127a. The thickness of the 2-1 conductive semiconductor layer 127a and the thickness of the 2-2 conductive semiconductor layer 127b may have a ratio ranging from 1.5:1 to 20:1. When the thickness ratio is less than 1.5:1, the 2-1 conductive semiconductor layer 127a is so thin that the electric current injection efficiency may decrease. Also, when the thickness ratio is greater than 20:1, the 2-2 conductive semiconductor layer 127b is so thin that there may be a reduction in ohmic reliability.

The 2-1 conductive semiconductor layer 127a may have an aluminum composition decreasing away from the active layer 126. Also, the 2-2 conductive semiconductor layer 127b may have an aluminum composition decreasing away from the active layer 126. Accordingly, the aluminum composition of the 2-3 conductive semiconductor layer 127c may be in the range of 1% to 10%.

However, the present invention is not limited thereto, and the aluminum compositions of the 2-1 conductive semiconductor layer 127a and the 2-2 conductive semiconductor layer 127b may, instead of having a continuous decrease, include some sections in which there is no decrease.

In this case, the 2-2 conductive semiconductor layer 127b may have a greater reduction in aluminum composition than the 2-1 conductive semiconductor layer 127a. That is, the 2-2 conductive semiconductor layer 127b may have a greater variation in aluminum composition in a thickness direction than the 2-1 conductive semiconductor layer 127a. Here, the thickness direction may refer to a direction from the first conductive semiconductor layer 124 to the second conductive semiconductor layer 127 or a direction from the second conductive semiconductor layer 127 to the first conductive semiconductor layer 124.

The 2-1 conductive semiconductor layer 127a should have a greater thickness than the 2-2 conductive semiconductor layer 127b and have a higher aluminum composition than the well layer 126a. Accordingly, the 2-1 conductive semiconductor layer 127a may have a relatively gradual reduction in aluminum composition.

However, the 2-2 conductive semiconductor layer 127b has a small thickness and has a large variation in aluminum composition. Accordingly, the 2-2 conductive semiconductor layer 127b may have a relatively high reduction in aluminum composition.

Figure 23A:
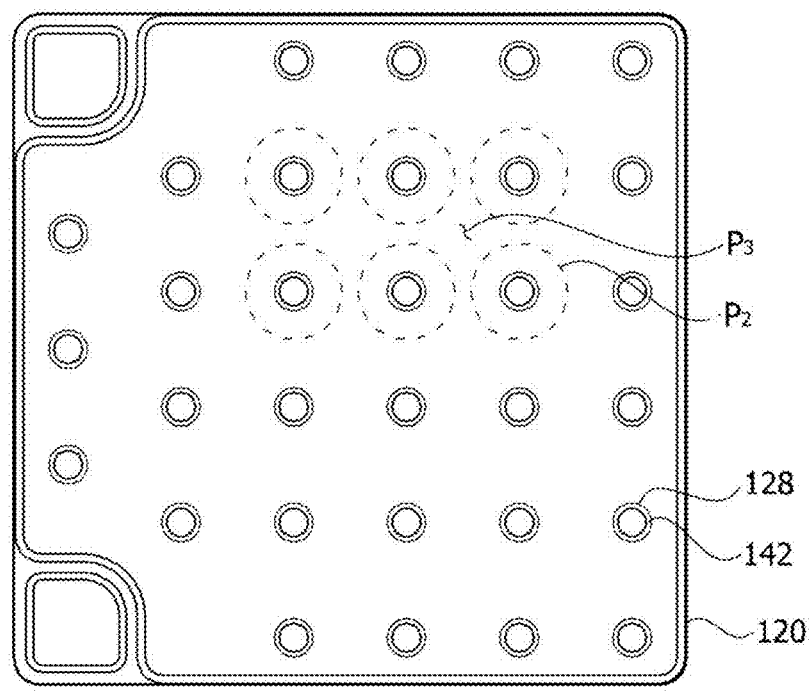
FIGS. 23A and 23B are views illustrating a configuration in which optical output power is enhanced according to a change in number of recesses.
Figure 23B:
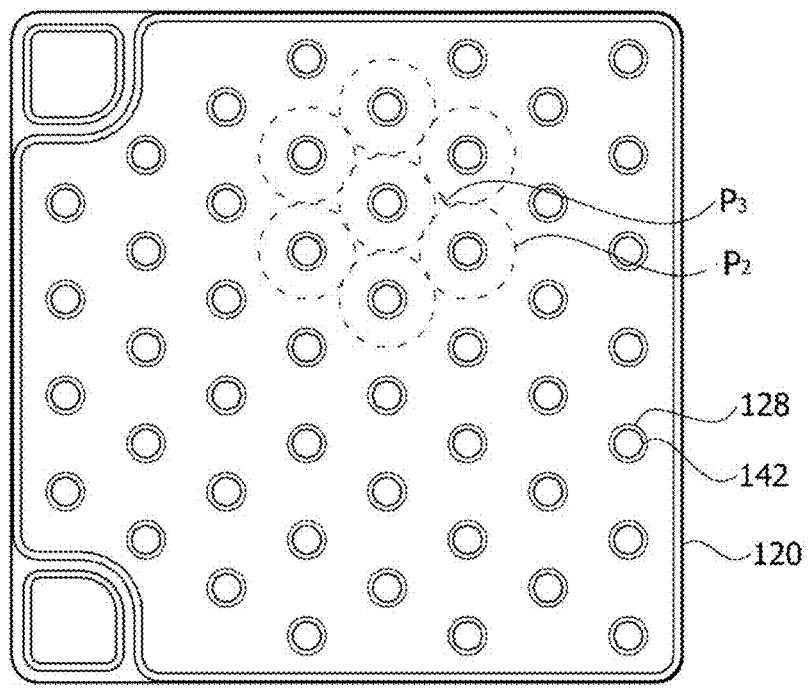

FIGS. 23A and 23B are views illustrating a configuration in which optical output power is enhanced depending on a change in number of recesses.

When the aluminum composition of the light emitting structure 120 increases, there may be a deterioration in electric current spreading characteristics in the light emitting structure 120. Also, the active layer has a large amount of light emitted to the side than a GaN-based blue light emitting device (TM mode). The TM mode may usually be performed by an ultraviolet semiconductor device.

The ultraviolet semiconductor device has reduced electric current spreading characteristics compared to a blue GaN semiconductor device. Accordingly, the ultraviolet semiconductor device needs to have a relatively large number of first electrodes 142 disposed therein compared to the blue GaN semiconductor device.

When the aluminum composition increases, the electric current spreading characteristics may deteriorate. Referring to FIG. 23A, electric current is spread at only points adjacent to the first electrodes 142, and electric current density may rapidly decrease at points far from the first electrodes 142. Accordingly, an effective light emitting region P2 may be narrowed.

The effective light emitting region P2 may be defined as a region from the center of the first electrode 142 having the highest electric current density to a boundary having an electric current density of 40% or less. For example, the effective light emitting region P2 may be adjusted to be within 40 μm from the center of each of the recesses 128 depending on the level of injected electric current and the aluminum composition.

A low electric current density region P3 may have a low electric current density and thus may hardly contribute to light emission. Therefore, according to an embodiment, it is possible to enhance the optical output power by placing a larger number of first electrodes 142 in the low electric current density region P3, which has a low electric current density, or by using a reflective structure.

Generally, since a GaN-based semiconductor layer that emits blue light has relatively good electric current spreading characteristics, it is preferable that the areas of the recesses 128 and the first electrodes 142 be minimized. This is because the area of the active layer 126 decreases as the areas of the recesses 128 and the first electrodes 142 increase. However, according to an embodiment, the electric current spreading characteristics are relatively low because the aluminum composition is high. Accordingly, it may be preferable to place the reflective structure in the low electric current density region P3 and reduce the low electric current density region P3 by increasing the number of first electrodes 142 while sacrificing the area of the active layer 126.

Referring to FIG. 23B, when the number of recesses 128 is 48, the recesses 128 cannot be straightly arranged in a horizontal or vertical direction and may be arranged in a zigzag form. In this case, the area of the low electric current density region P3 may be further decreased, and thus most of the active layer 126 may participate in light emission.

When the number of recesses 128 ranges from 70 to 110, electric current may be efficiently spread, and thus it is additionally possible to lower the operating voltage and enhance the optical output power. For a semiconductor device that emits UV-C light, when the number of recesses 128 is less than 70, electric characteristics and optical characteristics may be deteriorated. When the number of recesses 128 is greater than 110, it is possible to enhance electric characteristics, but optical characteristics may be deteriorated due to a reduction of the volume of a light emitting layer. In this case, each of the recesses 128 may have a diameter ranging from 20 μm to 70 μm.

The above-configurations may be applied to the area of recesses, the area of first electrodes, the area of a second electrode, and a ratio therebetween.

FIG. 24 is a conceptual diagram of a semiconductor device according to a thirteenth embodiment of the present invention.

The configuration of the light emitting structure 120 that has been described with reference to FIG. 21 or 22 may be applied to a light emitting structure 120 of FIG. 24 at it is.

A plurality of recesses 128 may extend from a first surface of a second conductive semiconductor layer 127 to a portion of a first conductive semiconductor layer 124 through an active layer 126. A first insulation layer 131 may be disposed inside each of the recesses 128 to electrically insulate a first conductive layer 165 from the second conductive semiconductor layer 127 and the active layer 126.

A first electrode 142 may be disposed on top of each of the recesses 128 and electrically connected with the first conductive semiconductor layer 124. A second electrode 246 may be formed under the second conductive semiconductor layer 127.

As described above, a first surface 127G of where the second conductive semiconductor layer 127 is in contact with the second electrode 246 may have an aluminum composition ranging from 1% to 10%, and thus it is possible to facilitate injection of electric current.

Each of the first electrode 142 and the second electrode 246 may be an ohmic electrode. Each of the first electrode 142 and the second electrode 246 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto.

A second electrode pad 166 may be disposed in an edge region of the semiconductor device. The second electrode pad 166 may have a recessed central portion and thus have a top surface including a concave part and a convex part. A wire (not shown) may be bonded to the concave portion of the top surface. Accordingly, since the bonding area increases, the second electrode pad 166 and the wire may be strongly bonded to each other.

The second electrode pad 166 may serve to reflect light. Thus, as the second electrode pad 166 is closer to the light emitting structure 120, it is possible to enhance light extraction efficiency.

The convex portion of the second electrode pad 166 may be higher than the active layer 126. Accordingly, the second electrode pad 166 may enhance light extraction efficiency and control an orientation angle by upwardly reflecting light emitted from the active layer 126 in a direction horizontal to the device.

The first insulation layer 131 is partially open under the second electrode pad 166 so that the second conductive layer 150 and the second electrode 246 may be electrically connected to each other.

A passivation layer 180 may be formed on top of and on the side of the light emitting structure 120. The passivation layer 180 may be in contact with the first insulation layer 131 in a region adjacent to the second electrode 246 or in the lower portion of the second electrode 246.

An opening of the first insulation layer 131 where the second electrode pad 166 is in contact with the second conductive layer 150 may have a width d22 ranging, for example, from 40 μm to 90 μm. When the width d22 is less than 40 μm, the operating voltage may rise. When the width d22 is greater than 90 μm, it may be difficult to secure a processing margin for preventing exposure of the second conductive layer 150. When the second conductive layer 150 is exposed outside the second electrode 246, there may be a reduction in reliability of the device. Accordingly, the width d22 may preferably range from 60% to 95% of the entire width of the second electrode pad 166.

The first insulation layer 131 may electrically insulate the first electrode 142 from the active layer 126 and the second conductive semiconductor layer 127. Also, the first insulation layer 131 may electrically insulate the second conductive layer 150 from the first conductive layer 165.

The first insulation layer 131 may be made of at least one material selected from a group consisting of $SiO_2$, $Si_xO_y$, $Si_3N_4$, $Si_xN_y$, $SiO_xN_y$, $Al_2O_3$, $TiO_2$, and AlN, but is not limited thereto. The first insulation layer 131 may be formed as a single or multiple layers. For example, the first insulation layer 131 may be a distributed Bragg reflector (DBR) having a multi-layered structure including an Si oxide or a Ti compound. However, the present invention is not limited thereto, and the first insulation layer 131 may include various reflective structures.

When the first insulation layer 131 performs a reflection function, the first insulation layer 131 may upwardly reflect light emitted horizontally from the active layer 126, thereby enhancing light extraction efficiency. As the number of recesses 128 increases, an ultraviolet semiconductor device may have more effective light extraction efficiency than a semiconductor device that emits blue light.

The second conductive layer 150 may cover the second electrode 246. Accordingly, the second electrode pad 166, the second conductive layer 150, and the second electrode 246 may form one electrical channel.

The second conductive layer 150 may cover the second electrode 246 and may be in contact with the side surface and the bottom surface of the first insulation layer 131. The second conductive layer 150 may be made of a material with high adhesion strength to the first insulation layer 131 and may also be made of at least one material selected from a group consisting of Cr, Al, Ti, Ni, and Au, or an alloy thereof. The second conductive layer 150 may be formed as a single or multiple layers.

When the second conductive layer 150 is in contact with the side surface and the top surface of the first insulation layer 131, it is possible to enhance thermal and electrical reliability of the second electrode 246. Also, the second conductive layer 150 may have a reflection function for upwardly reflecting light emitted from a gap between the first insulation layer 131 and the second electrode 246.

A second insulation layer 132 may electrically insulate the second conductive layer 150 from the first conductive layer 165. The first conductive layer 165 may be electrically connected to the first electrode 142 through the second insulation layer 132.

The first conductive layer 165 and a junction layer 160 may be disposed depending on the shape of the bottom surface of the light emitting structure 120 and the shape of the recesses 128. The first conductive layer 165 may be made of a material with high reflectance. For example, the first conductive layer 165 may contain aluminum. When the first conductive layer 165 contains aluminum, the first conductive layer 165 may serve to upwardly reflect light emitted from the active layer 126, thereby enhancing light extraction efficiency.

The junction layer 160 may contain a conductive material. For example, the junction layer 160 may contain a material selected from a group consisting of gold, tin, indium, aluminum, silicon, silver, nickel, and copper, or an alloy thereof.

A substrate 170 may be made of a conductive material. For example, the substrate 170 may contain a metal or a semiconductor material. The substrate 170 may be made of a metal with high electrical conductivity and/or thermal conductivity. In this case, heat generated during operation of the semiconductor device may be quickly released to the outside.

The substrate 170 may contain a material selected from a group consisting of silicon, molybdenum, tungsten, copper, and aluminum, or an alloy thereof.

A square wave pattern may be formed on top of the light emitting structure 120. The square wave pattern may enhance extraction efficiency for light emitted from the light emitting structure 120. The square wave pattern may have a different average height depending on ultraviolet wavelengths. For UV-C, the average height ranges from 300 nm to 800 nm. When the average height ranges from 500 nm to 600 nm, it is possible to enhance light extraction efficiency.

Figure 25:
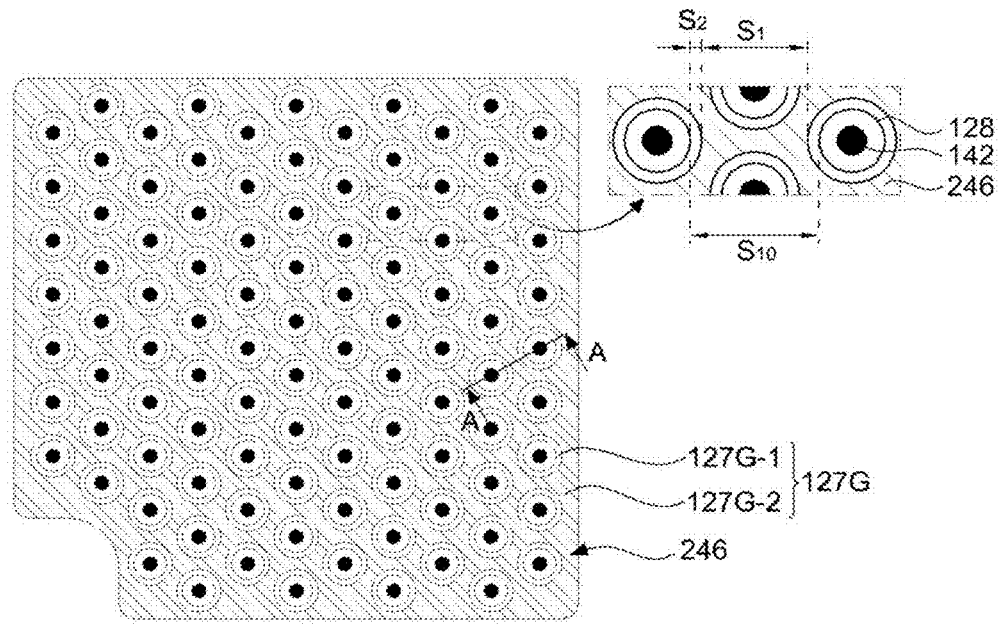
FIG. 25 is a plan view of FIG. 24.
Figure 26:
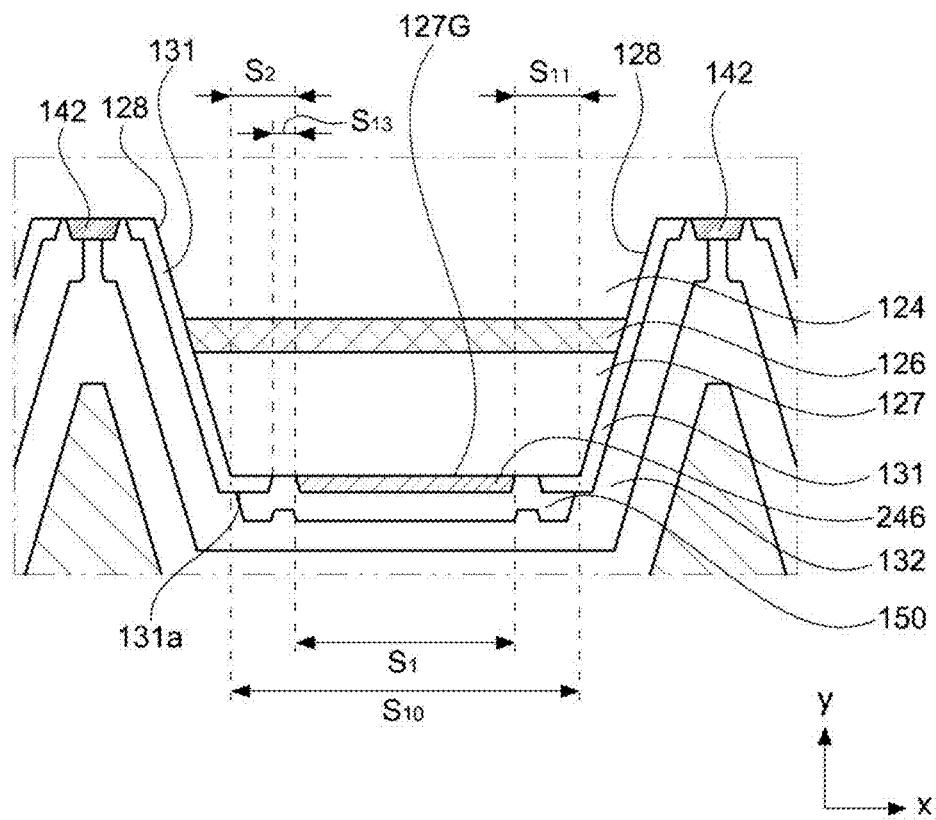
FIG. 26 is a sectional view taken along A-A of FIG. 25.

FIG. 25 is a plan view of FIG. 24, and FIG. 26 is a sectional view taken along A-A of FIG. 25.

Referring to FIGS. 25 and 26, the first surface 127G of the second conductive semiconductor layer 127 may include a plurality of first regions 127G-1 surrounding the plurality of recesses 128 and a second region 127G-2 disposed between the plurality of first regions 127G-1, when viewed from the top. Here, each of the first regions 127G-1 may be a ring-shaped region between the second region 127G-2 and an outer circumferential surface of each of the recesses 128.

Each of the recesses 128 may have a diameter ranging from 20 μm to 70 μm. When the diameter is less than 20 μm, it is difficult to secure a processing margin for forming the first electrode 142 disposed therein. When the diameter is greater than 70 μm, the area of the active layer 126 is so small that the light emission efficiency may deteriorate. Here, the diameter of the recesses 128 may be the maximum diameter formed on the second conductive semiconductor layer 127.

The diameter of each of the first regions 127G-1 is 1.0 to 1.5 times that of the recess 128. When the diameter exceeds 1.5 times, the contact area of the second electrode 246 is so small that the electric current spreading efficiency may be reduced. The first region 127G-1 may indicate a distance S11 between the maximum outer diameter of each of the recesses 128 and the second electrode 246.

The second region 127G-2 may be the entire region except the plurality of first regions 127G-1. The second electrode 246 may be entirely disposed on the second region 127G-2.

A first area of where a plurality of first electrodes 142 are in contact with the first conductive semiconductor layer 124 may range from 7.4% to 20% or from 10% to 20% of the maximum horizontal sectional area of the light emitting structure 120. The first area may be the sum of areas of where the first electrodes 142 are in contact with the first conductive semiconductor layer 124.

When the first area of the plurality of first electrodes 142 is less than 7.4%, electric current spreading characteristics cannot be sufficient, and thus the optical output power decreases. When the first area is greater than 20%, the areas of the active layer 126 and the second electrode 246 excessively decrease, and thus the operating voltage increases and the optical output power decreases.

Also, the total area of the plurality of recesses 128 may range from 10% to 30% or from 13% to 30% of the maximum horizontal sectional area of the light emitting structure 120. When the total area of the recesses 128 does not fall within this range, it is difficult to keep the total area of the first electrodes 142 within the range of 7.4% to 20%. Also, there are an increase in operating voltage and a decrease in optical output power.

The area of the second conductive semiconductor layer 127 may be equal to the maximum horizontal area of the light emitting structure 120 minus the total area of the recesses 128. For example, the area of the second conductive semiconductor layer 127 may range from 70% to 90% of the maximum horizontal area of the light emitting structure 120.

A second area (the second region of FIG. 25) of where the second electrode 246 and the second conductive semiconductor layer 127 are in contact with each other may range from 50% to 70% of the maximum horizontal sectional area of the light emitting structure 120. The second area may be the total area of where the second electrode 246 is in contact with the second conductive semiconductor layer 127.

When the second area is less than 50%, the area of the second electrode 246 is so excessively small that there may be an increase in operating voltage and a decrease in hole injection efficiency. When the second area exceeds 70%, the first area cannot be effectively widened, and thus there may be a decrease in electron injection efficiency. An area (the first region of FIG. 25) of where the second electrode 246 and the second conductive semiconductor layer 127 are not in contact with each other may range from 1% to 20%.

The first area is inversely proportional to the second area. That is, when the number of recesses 128 is increased to increase the number of first electrodes 142, the area of the second electrode 246 decreases. Accordingly, in order to improve the electrical and optical characteristics, the spreading characteristics of electrons and holes should be balanced. Accordingly, it is important to determine an appropriate ratio between the first area and the second area.

The ratio of the first area of where the plurality of first electrodes 142 are in contact with the first conductive semiconductor layer 124 to the second area of where the second electrode 246 is in contact with the second conductive semiconductor layer 127 (first area second area) may range from 1:3 to 1:7.

When the area ratio is greater than 1:7, the first area is so relatively small that the electric current spreading characteristics may deteriorate. Also, when the area ratio is less than 1:3, the second area is so relatively small that the electric current spreading characteristics may deteriorate.

The ratio of the entire area of the plurality of first regions 127G-1 to the area of the second region 127G-2 may range from 1:2.5 to 1:70 or from 1:30 to 1:70. When the area ratio is less than 1:2.5, the area of the first region 127G-1 is so excessively large that a sufficient ohmic area of the second electrode 246 cannot be secured. When the area ratio is greater than 1:70, the area of the first region 127G-1 is so small that it may be difficult to secure a processing margin.

The second electrode 246 may contain a metal or metal oxide with low resistance. However, the second electrode 246 reflects or transmits visible light, but absorbs ultraviolet light. Accordingly, there is a need to reflect light emitted from the active layer 126 to the second conductive semiconductor layer 127 by decreasing the area of the second electrode 246. For example, it is possible to secure the reflective region by narrowing the second region 127G-2 where the second electrode 246 is disposed and widening the first region 127G-1 or also possible to selectively place a reflective structure by partitioning the second region 127G-2 into a plurality of regions.

The second conductive layer 150 is disposed on the first regions 127G-1 and the second region 127G-2, and thus light incident onto the first regions 127G-1 may be reflected by the second conductive layer 150. In this case, it is important to secure a maximum reflective region while securing the contact area of the second electrode 246 needed to spread electric current.

The area of the second region 127G-2 may range from 35% to 60% of the maximum area of the light emitting structure 120. When the area of the second region 127G-2 is less than 35%, the contact area of the second electrode 246 is so small that the electric current spreading efficiency may be reduced. Also, when the area of the second region 127G-2 exceeds 60%, the area of the first region 127G-1 is so small that the light extraction efficiency may decrease.

The area of the first region 127G-1 other than the area of the recesses 128 may range from 10% to 55% of the maximum area of the light emitting structure 120. When the area of the first region 127G-1 is less than 10%, it is difficult to have sufficient reflective efficiency. When the area of the first region 127G-1 is greater than 55%, the area of the second region 127G-2 is so small that there may be a decrease in electric current spreading efficiency.

Accordingly, the ratio of the area of the first region 127G-1 to the area of the second region 127G-2 may range from 1:0.7 to 1:6. When this relationship is satisfied, sufficient electric current spreading efficiency is secured, and thus it is possible to enhance the optical output power. Also, a sufficient reflective region is secured, and thus it is possible to enhance the light extraction effect.

Referring to FIG. 26, the first surface 127G of the second conductive semiconductor layer 127 may include a 1-1 surface S10 disposed between two adjacent recesses 128. The 1-1 surface S10 may include a second section S2 where the second electrode 246 is not disposed and a first section S1 where an electrode is disposed. The 1-1 surface S10 may have a width ranging from 17 μm to 45 μm.

When the width of the 1-1 surface S10 is less than 17 μm, a separation distance between the recesses 128 is so small that the disposition area of the second electrode 246 may be reduced and thus there may be a deterioration in electrical characteristics. When the width is greater than 45 μm, the separation distance between the recesses 128 is so large that the disposition area of the first electrode 142 may be reduced and thus electrical characteristics may deteriorate.

The second section S2 may be a unit section that forms the first region 127G-1. Also, the first section S1 may be a unit section that forms the second region 127G-2. The first section S1 may have a greater width in a first direction than the second section S2. The width of the second section S2 in the first direction (a distance from a recess to the second electrode) may range from 1 μm to 15 μm.

When the width of the second section S2 is less than 1 μm, it may be difficult for the first insulation layer 131a to be disposed on the second conductive semiconductor layer 127 due to a processing margin for spreading of electric current. Accordingly, the electrical characteristics may deteriorate. When the width is greater than 15 μm, a distance between the second electrode 246 and the first electrode 142 is so large that the electrical characteristics may be deteriorated. Accordingly, the width of the second section S2 in the first direction may be within the aforementioned range in consideration of the processing margin and the electrical characteristics.

The first insulation layer 131 may include an extension part 131a extending to the first surface 127G, and the second electrode 246 may have a separation region S13 of 0 μm to 4 jam from the extension part 131a of the first insulation layer 131. When the separation region S13 is greater than 4 μm, the disposition area of the second electrode 246 is so small that there may be an increase in operating voltage.

The second conductive layer 150 may fully surround the second electrode 246 and may be in contact with the side surface and the bottom surface of the first insulation layer 131. When the second conductive layer 150 is in contact with the side surface and the top surface of the first insulation layer 131, it is possible to enhance thermal and electrical reliability of the second electrode 246. Also, it is possible to have a function of upwardly reflecting incident ultraviolet light.

The second conductive layer 150 may have a region where a Schottky junction is formed with the second conductive semiconductor layer 127 in the separation region S13. Accordingly, it is possible to facilitate spreading of electric current.

The first surface 127G may have an average roughness kept at or below 7 nm. When the average roughness is greater than 7 nm, a boundary surface between the second electrode 246 and the second conductive layer 150 is so rough that there may be a decrease in reflectance. The average roughness may be a value obtained by calculating a difference in height of a square wave pattern formed on the first surface 127G. The average roughness may be a root-mean-square (RMS) value measured by using an atomic force microscopy (AFM).

Figure 27:
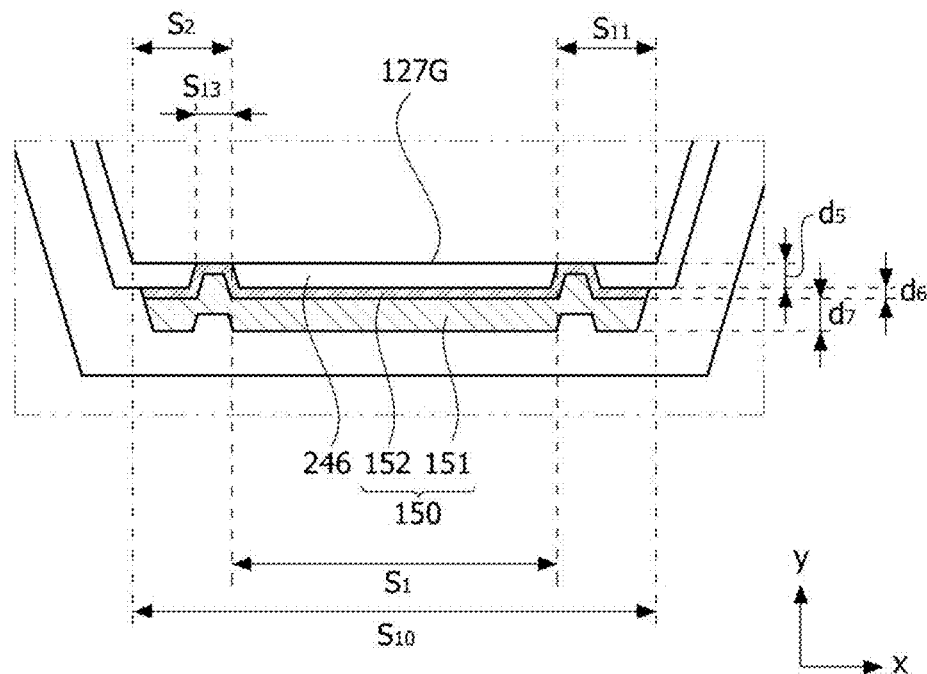
FIG. 27 is a diagram illustrating a configuration of a second conductive layer.
Figure 28:
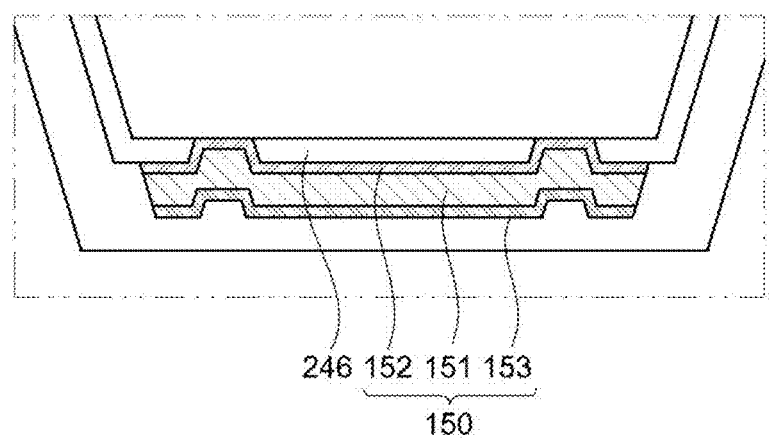
FIG. 28 is a first modification of FIG. 27.
Figure 29:
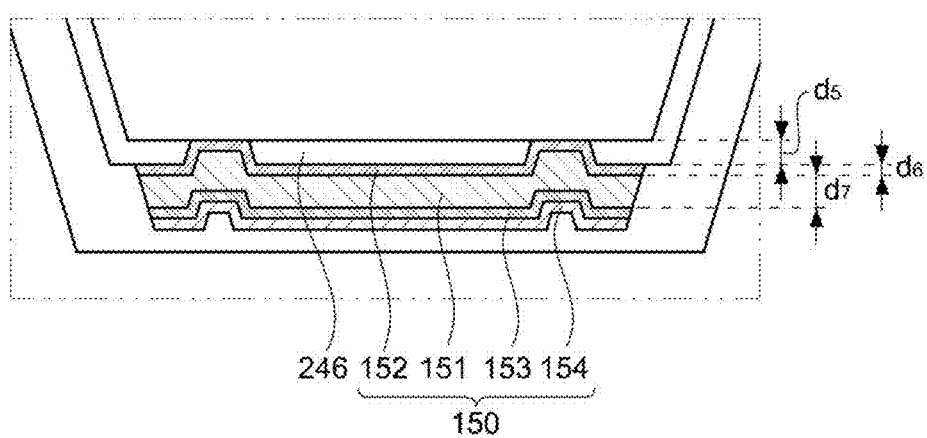
FIG. 29 is a second modification of FIG. 27.

FIG. 27 is a diagram illustrating a configuration of a second conductive layer, FIG. 28 is a first modification of FIG. 27, and FIG. 29 is a second modification of FIG. 27.

Referring to FIG. 27, the second electrode 246 may have a thickness d5 ranging from 1 nm to 15 nm or from 1 nm to 5 nm. When the thickness d5 of the second electrode 246 is less than 15 nm, the amount of absorbed light may be reduced.

The second conductive layer 150 may include a reflective layer 151 containing aluminum and a first intermediate layer 152 disposed between the second electrode 246 and the reflective layer 151. When the second electrode 246 is formed of ITO, oxygen may penetrate into the reflective layer 151 to form $Al_2O_3$. In this case, the reflective efficiency of the reflective layer 151 is reduced. In an embodiment, the first intermediate layer 152 may be disposed between the reflective layer 151 and the second electrode 246 to enhance adhesion strength therebetween and also prevent penetration of oxygen.

The first intermediate layer 152 may contain at least one of chromium (Cr), titanium (Ti), and nickel (Ni). The first intermediate layer 152 may have a thickness d6 ranging from 0.7 μm to 7 nm. The first intermediate layer 152 may further contain aluminum. In this case, it is possible to enhance adhesion strength between the first intermediate layer 152 and the aluminum. Also, the first intermediate layer 152 is in contact with the first surface 127G in a separation region, and thus it is possible to improve electric current spreading characteristics through a Schottky junction.

The thickness ratio (d5:d7) of the second electrode 246 to the reflective layer 151 may range from 1:2 to 1:120. The reflective layer 151 may have a thickness d7 ranging from 30 nm to 120 nm. When the thickness of the reflective layer 151 is less than 30 nm, there is a reduction in reflectance in an ultraviolet wavelength band. Even when the thickness is greater than 120 nm, reflective efficiency hardly increases.

Referring to FIG. 28, a second intermediate layer 153 may be disposed under the reflective layer 151. The second intermediate layer 153 may prevent aluminum from migrating to a neighboring layer. The second intermediate layer 153 may contain at least one of Ni, Ti, No, Pt, and W and may have a thickness ranging from 50 nm to 200 nm.

Referring to FIG. 29, a third intermediate layer 154 may be disposed under the second intermediate layer 153. The third intermediate layer 154 is a layer for bonding to another layer and may contain Au, Ni, etc.

Figure 30:
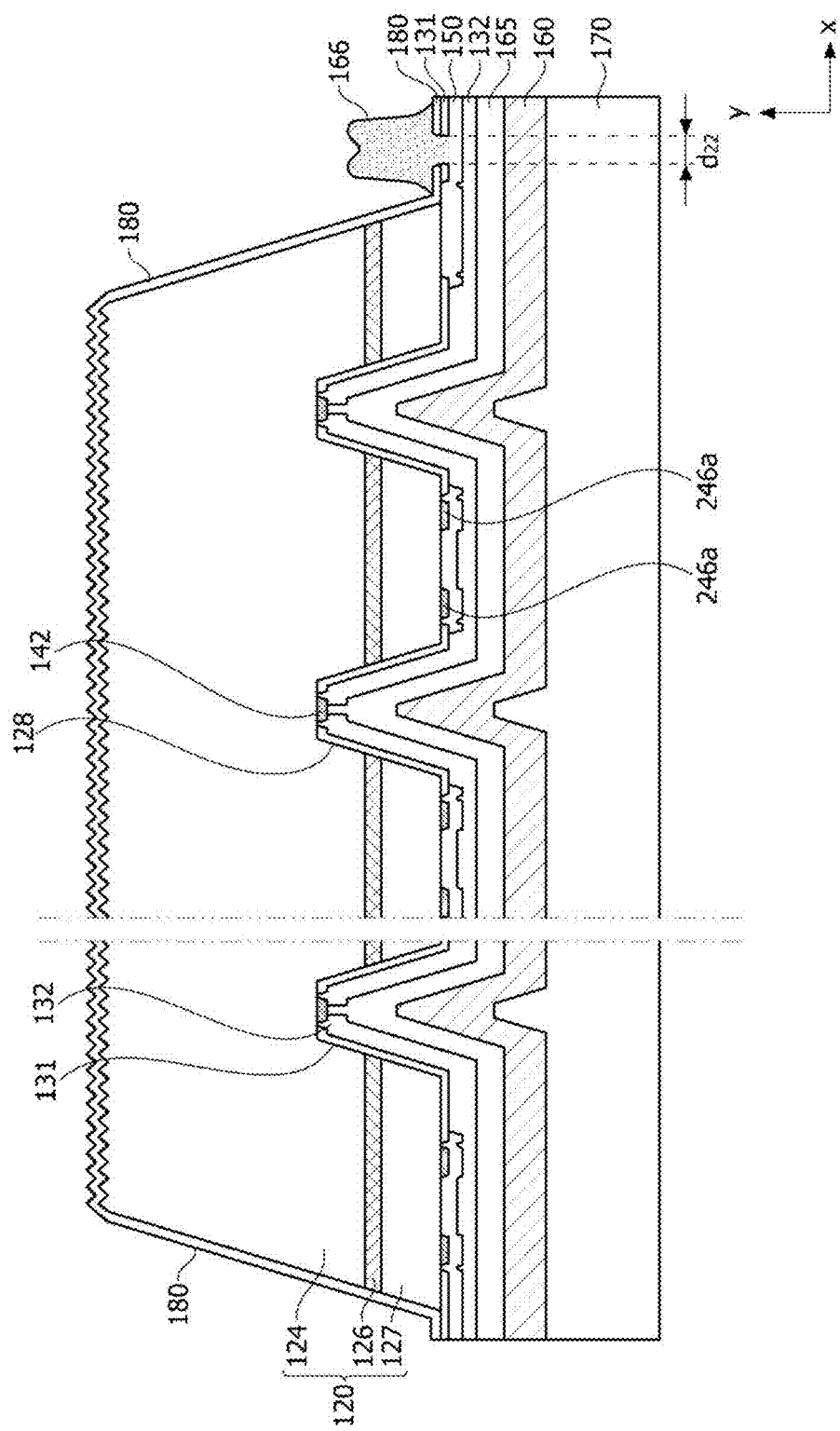
FIG. 30 is a conceptual view of a semiconductor device according to a fourteenth embodiment of the present invention.
Figure 31:
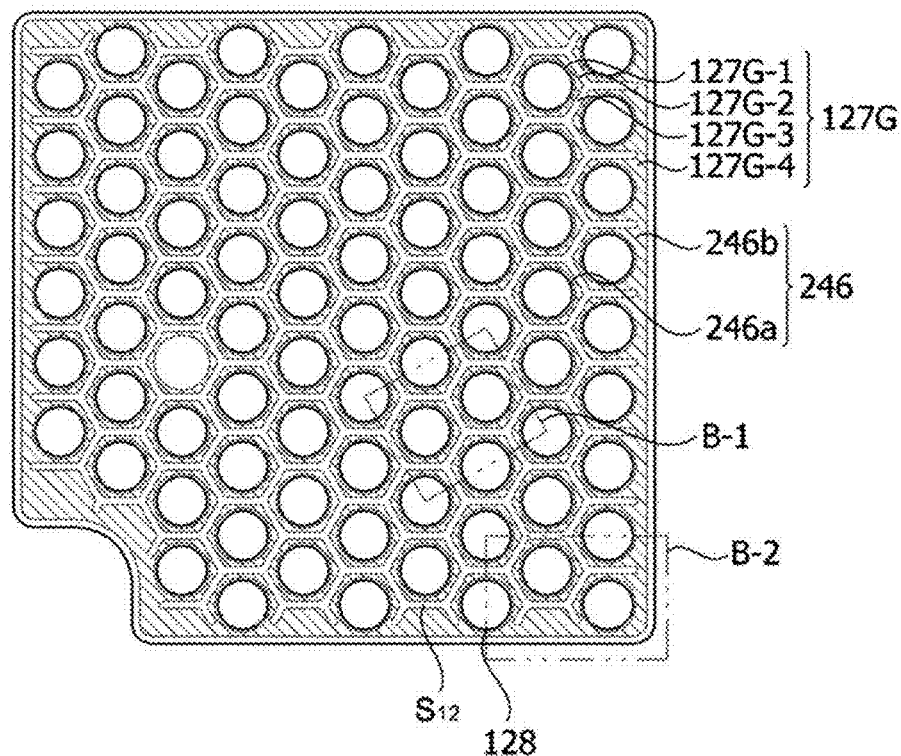
FIG. 31 is a plan view of FIG. 30.
Figure 32:
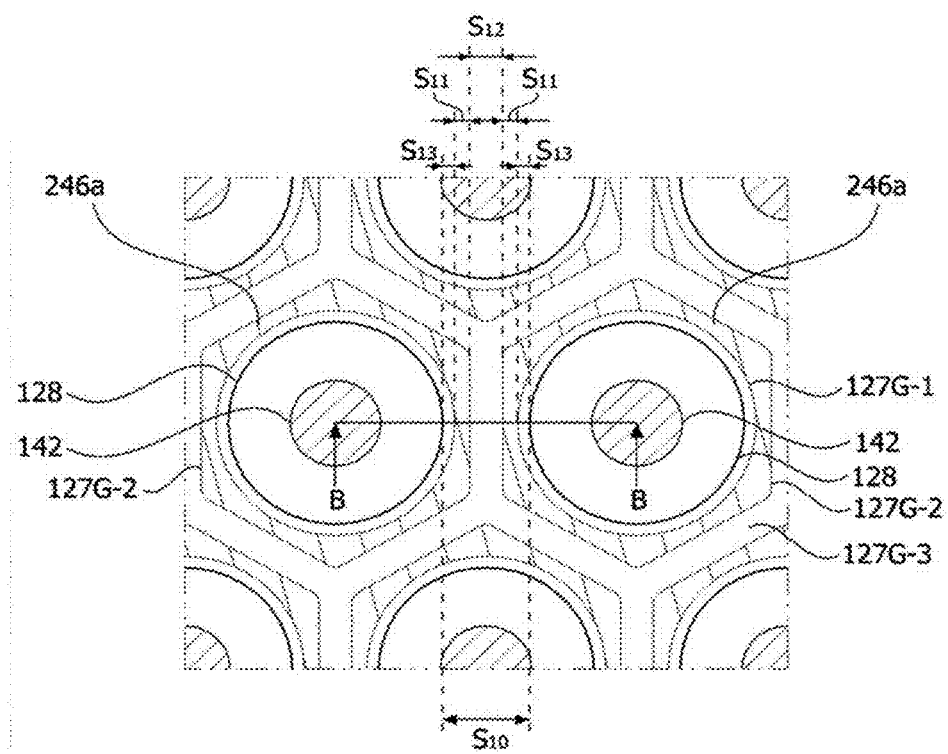
FIG. 32 is an enlarged view of a part B-1 of FIG. 31.
Figure 33:
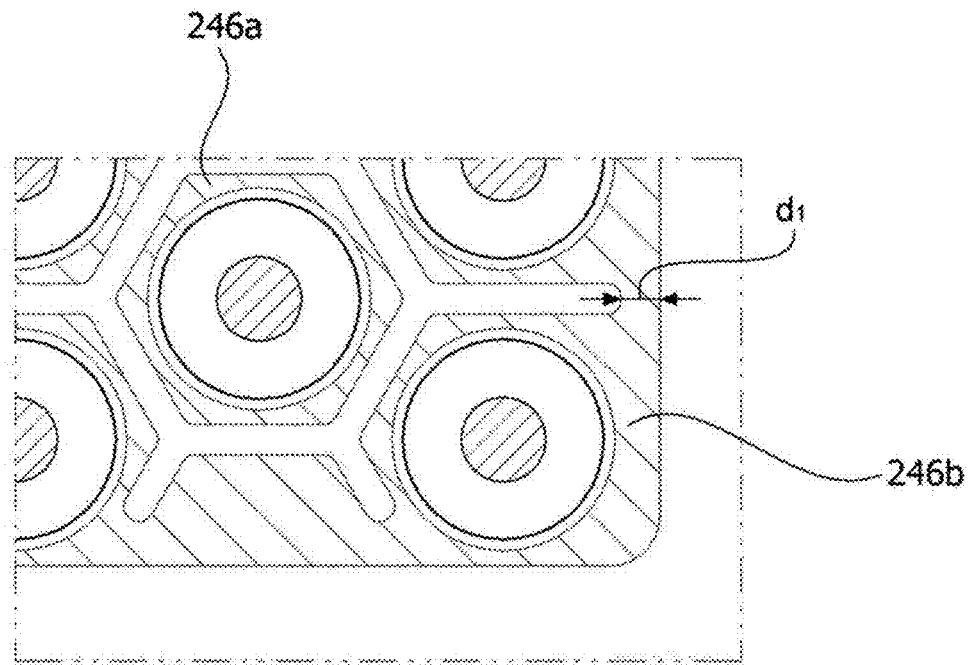
FIG. 33 is an enlarged view of a part B-2 of FIG. 31.

FIG. 30 is a conceptual view of a semiconductor device according to a fourteenth embodiment of the present invention, FIG. 31 is a plan view of FIG. 30, FIG. 32 is an enlarged view of a part B-1 of FIG. 31, and FIG. 33 is an enlarged view of a part B-2 of FIG. 31.

Referring to FIG. 30, the light emitting structure 120 described with reference to FIGS. 1 to 3 and the configuration of each layer described with reference to FIG. 4 may be applied to the semiconductor device according to an embodiment as they are. According to an embodiment, a plurality of second electrodes 246 may be disposed on the first surface 127G of the second conductive semiconductor layer 127 disposed between two recesses 128.

Referring to FIGS. 31 to 33, the first surface 127G may include first regions 127G-1 surrounding the recesses 128, second regions 127G-2 surrounding the first regions 127G-1, and third regions 127G-3 disposed between the second regions 127G-2.

Here, a first region 127G-1 may be a region between a second electrode 246 and a recess 128. For example, the first region 127G-1 may have a ring-shaped area. The area of the first region 127G-1 may range from 1% to 20% of the maximum horizontal area of the light emitting structure 120.

The second regions 127G-2 may have the entire area except the recesses 128 and the first regions 127G-1. For example, the second regions 127G-2 may each have an inner circular shape and an outer polygonal shape. For example, the second regions 127G-2 may each have an outer octagonal shape, but are not limited thereto. The second regions 127G-2 may be partitioned by the third regions 127G-3. The third regions 127G-3 may be disposed between the plurality of second regions 127G-2. The third regions 127G-3 may each be a region with an electric current density of 40% or less with respect to the first electrode 142 having an electric current density of 100%. Accordingly, the third regions 127G-3 may each have a low probability of participating in light emission. According to an embodiment, the third regions 127G-3, which has a low contribution to light emission, may be configured as a reflective region to increase the light extraction efficiency.

The first surface 127G may further include a fourth region 127G-4 disposed between a border region of the first surface 127G and the third regions 127G-3.

The second electrode 246 may include a 2-1 electrode 246a disposed in the second regions 127G-2 and a 2-2 electrode 246b disposed in the fourth region 127G-4.

The second electrode 246 may contain a metal or metal oxide with low resistance. However, the second electrode 246 reflects or transmits visible light, but absorbs ultraviolet light.

Accordingly, there is a need to reflect light emitted from the active layer 126 to the second conductive semiconductor layer 127 by decreasing the area of the second electrode 246 as long as the electrical characteristics are not significantly deteriorated. In this case, it is possible to secure the reflective region by narrowing the second region 127G-2 where the second electrode 246 is disposed and widening the third region 127G-3. Since the second conductive layer 150 is entirely disposed on the first surface 127G, light incident onto the third region 127G-3 may be reflected by the second conductive layer 150.

That is, according to this embodiment, the third region 127G-3, which has a low contribution to light emission, may be utilized as the reflective region.

A first contact area of where the first surface 127G and the second electrode 246 are in contact with each other (the sum of the second region and the fourth region of FIG. 31) may range from 35% to 60% of the maximum area of the light emitting structure 120. When the first contact area is less than 35%, the electric current spreading efficiency may be reduced. Also, when the first contact area exceeds 60%, the area of the third region 127G-3 is so small that the light extraction efficiency may decrease.

A second contact area of where the first surface 127G and the second electrode 246 are not in contact with each other (the sum of the first region and the third region of FIG. 31) may range from 10% to 55% of the maximum area of the light emitting structure 120. When the second contact area is less than 10%, it is difficult to have sufficient reflective efficiency. When the second contact area is greater than 55%, the area of the second region 127G-2 is so small that there may be a decrease in electric current spreading efficiency.

The ratio of the second contact area to the first contact area may range from 1:0.7 to 1:6. When this relationship is satisfied, sufficient electric current spreading efficiency is secured, and thus it is possible to enhance the optical output power. Also, a sufficient reflective region is secured, and thus it is possible to enhance the light extraction effect.

Referring to FIG. 33, the third region 127G-3 and a border of the first surface 127G may be separated by a separation distance d1 ranging from 1.0 μm to 10 μm. When the separation distance d1 is less than 1.0 μm, the margin is so small that the second conductive layer 150 may not be appropriately formed, and thus there may be a reduction in reliability. Also, when the separation distance d1 is greater than 10 μm, the area of the second electrode 246 is so small that the electrical characteristics of the semiconductor device may be deteriorated.

Figure 34:
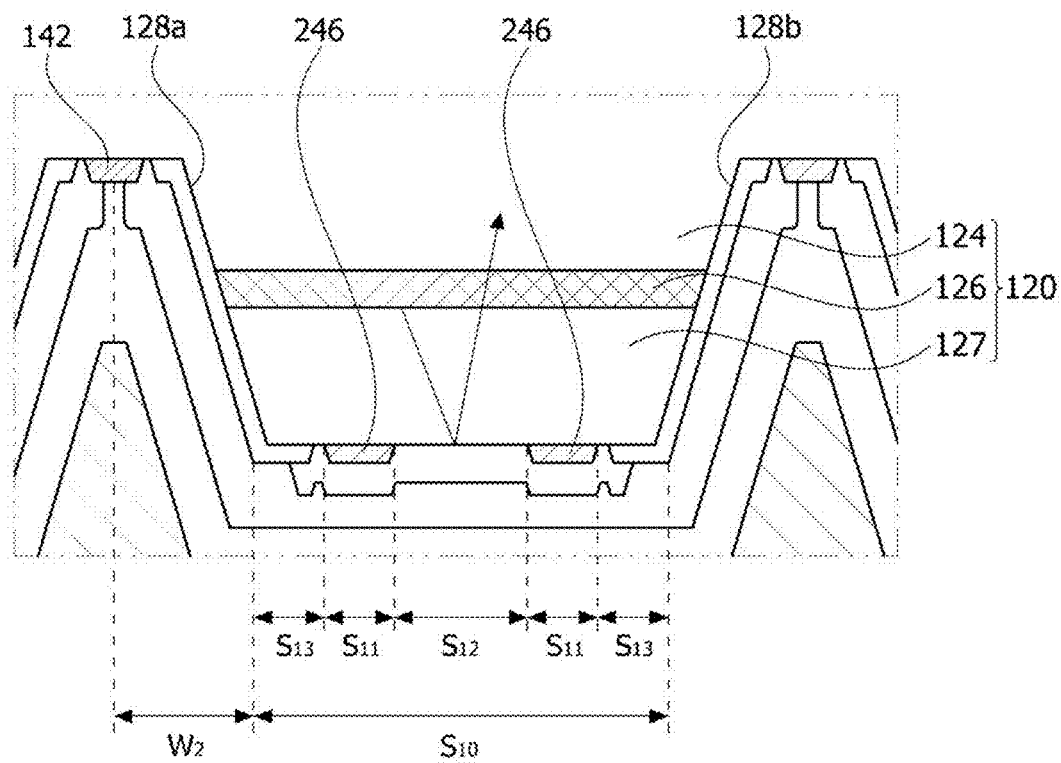
FIG. 34 is a sectional view taken along B-B of FIG. 32.

FIG. 34 is a sectional view taken along B-B of FIG. 32.

Referring to FIG. 34, the first surface 127G of the second conductive semiconductor layer 151 may include a 1-1 surface S10 disposed between two recesses 128 that are most adjacent to each other in a first direction (the X direction). Here, the first direction may be a direction perpendicular to the thickness direction of the light emitting structure 120.

The 1-1 surface S10 may include a first section S11 where two second electrodes 246 are disposed apart from each other in the first direction and a second section S12 disposed between the second electrodes 246. The second conductive layer 150 may be disposed in the first section S11 and the second section S12. The entire width of the 1-1 surface S10 may range from 17 μm to 45 μm.

The entire width of the first section S11 in the first direction may range from 12 μm to 24 μm. The first section S11 may include two partition regions at both sides of the second section S12. The partition regions may have a width ranging from 6 μm to 12 μm.

When the entire width of the first section S11 is less than 12 μm, the area of the second electrode 246 is so small that there may be a decrease in electric current spreading efficiency. When the entire width is greater than 24 μm, the second section S12 is so small that there may be a decrease in reflective efficiency.

The width of the second section S12 in the first direction may range from 5 μm to 16 μm. When the width of the second section S12 in the first direction is less than 5 μm, it is difficult to secure a sufficient reflective region. When the width is greater than 16 μm, the second electrode 246 is narrowed.

The second section S12 may be disposed in a region having an electric current density of 40% or less with respect to the first electrode 142 having an electric current density of 300%. A first distance W2+S13+S11 between the second section S12 and the center of the recess 128 may be at least 17 μm. The radius of the bottom surface of the recess 128 may range from 10 μm to 35 μm, the width of the third section S13 may range from 1 μm to 5 μm, and the width of the first section S11 may range from 6 μm to 12 μm.

Accordingly, the maximum separation distance may be greater than or equal to 52 μm.

The second section S12 may be disposed in a region having an electric current density of 40% or less from among regions disposed at least 17 μm apart from the center of the recess 128. For example, the second section S12 may be disposed in a region disposed 40 μm or more apart from the center of the recess 128.

When a plurality of recesses 128 are present in the semiconductor device, second sections S12 disposed 40 μm or more apart from the recesses 128 may overlap with each other. Accordingly, the overlap area of the second sections S12 may be adjusted according to a distance between the recesses 128.

In this case, the second section S12 may include a point corresponding to ½ of the width of the 1-1 surface S10 in the first direction. The point corresponding to ½ of the width of the 1-1 surface S10 in the first direction is a region between two adjacent recesses 128 and is likely to have a low electric current density. However, the present invention is not limited thereto. When the plurality of recesses have different diameters, the second section S12 may not necessarily include a point corresponding to ½ of the width in the first direction.

The third section S13 may be a region between the second electrode 246 and the recess 128. The width of the third section S13 in the first direction may range from 1 μm to 5 μm.

The ratio of the width of the second section S12 to the entire width of the first section S11 may range from 1:0.7 to 1:5. When the width ratio range is satisfied, the ratio of the second contact area to the first contact area may be maintained in the range of 1:0.7 to 1:6. Accordingly, it is possible to enhance the electric current spreading efficiency and the light extraction effect.

Figure 35:
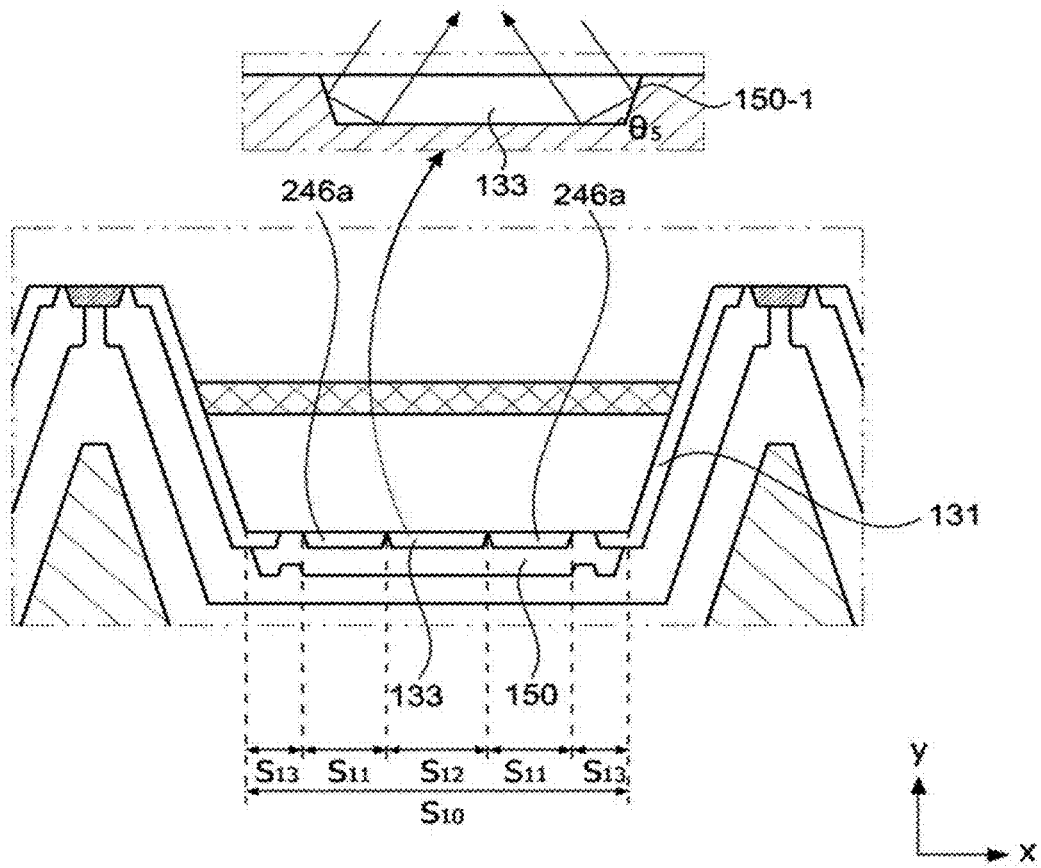
FIG. 35 is a first modification of FIG. 34.

FIG. 35 is a first modification of FIG. 34.

Referring to FIG. 35, the second conductive layer 150 may include a reflective groove 150-1 in the second section S12. Light incident onto the second section S12 may be reflected along a propagation path changed by the reflective groove 150-1. According to such a configuration, it is possible to reflect light in various directions, thus enhancing uniformity.

An inclined surface may have an angle θ5 greater than 90 degrees and less than 150 degrees. When the angle of the inclined surface is less than 90 degrees or greater than 150 degrees, it may be difficult to variously change a reflection angle of incident light. The angle of the inclined surface may be defined as an angle formed between the bottom surface and the inclined surface.

The depth of the reflective groove 150-1 may be the same as the thickness of the first insulation layer 131. The thickness of the first insulation layer 131 may be equal to 110% to 130% of the thickness of the second electrode 246.

A light transmitting layer 133 may be disposed in the reflective groove 150-1. The shape of the light transmitting layer 133 may correspond to the shape of the reflective groove 150-1. Accordingly, the light transmitting layer 133 may have the same thickness as the reflective groove 150-1. For example, the reflective groove 150-1 may be formed by forming the second conductive layer 150 on the light transmitting layer 133.

The material of the light transmitting layer 133 may include various materials capable of transmitting ultraviolet wavelength light. For example, the light transmitting layer 133 may contain an insulation layer material. The light transmitting layer 133 may contain at least one of $SiO_2$, $Si_xO_y$, $Si_3N_4$, $Si_xN_y$, $SiO_xN_y$, $Al_2O_3$, $TiO_2$, and AlN, but is not limited thereto.

Figure 36A:
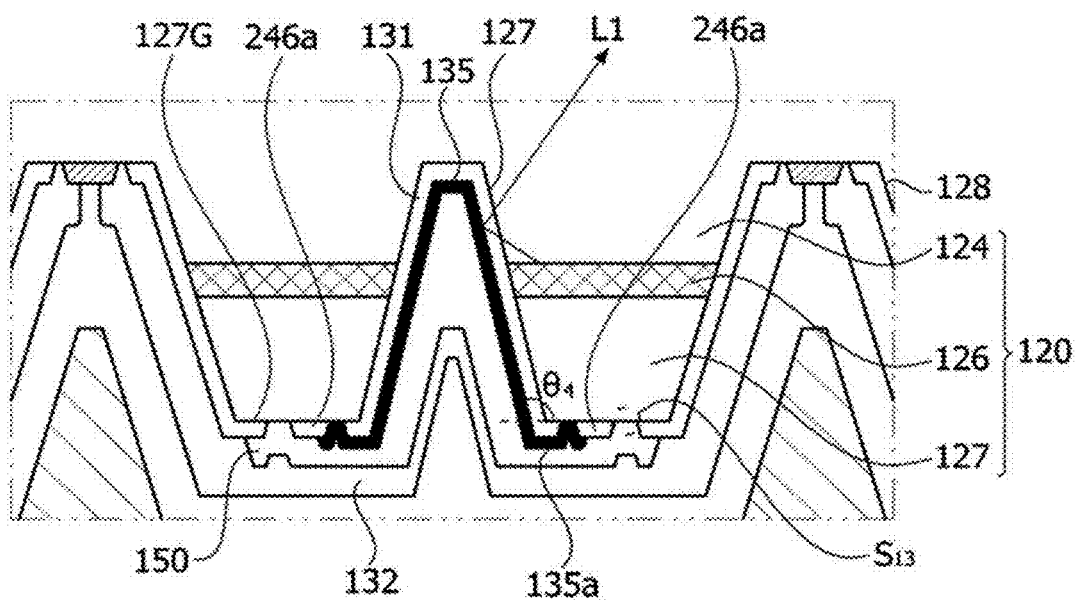
FIG. 36 is a second modification of FIG. 34.
Figure 36B:
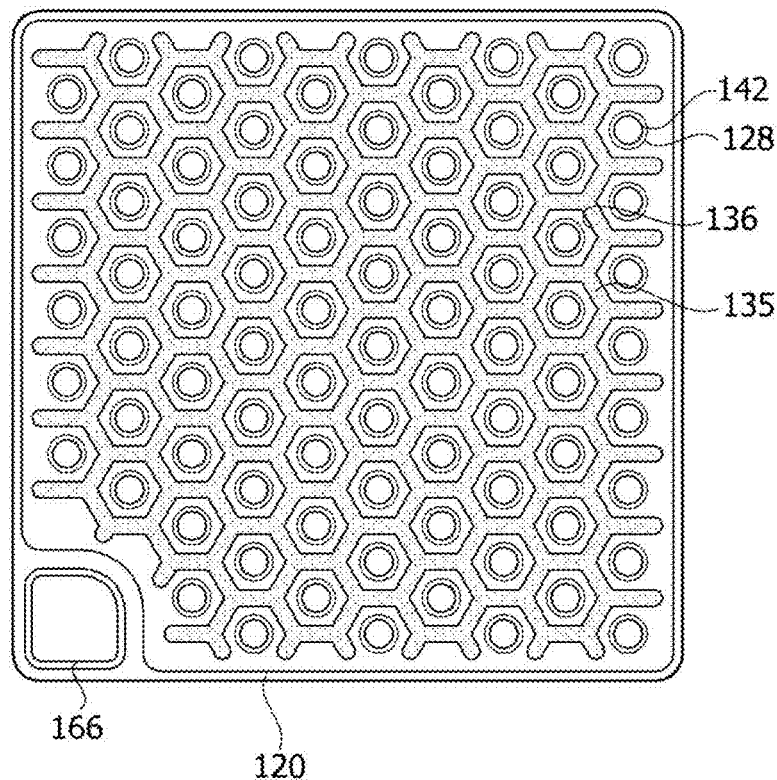

FIG. 36A is a second modification of FIG. 34, and FIG. 36B is a plan view of the second modification.

Referring to FIG. 36A, a sub-recess 127 and a sub-reflective layer 135 disposed inside the sub-recess 127 may be disposed in the second section S12.

The sub-reflective layer 135 may be disposed inside the sub-recess 127. In detail, the sub-reflective layer 135 may be disposed on the first insulation layer 131 inside the sub-recess 127.

As the sub-reflective layer 135, a material with high reflectance in an ultraviolet wavelength band may be selected. The sub-reflective layer 135 may contain a conductive material. For example, the sub-reflective layer 135 may contain aluminum. When the sub-reflective layer 135 has a thickness ranging from about 30 nm to about 120 nm, the sub-reflective layer 135 may reflect 80% or more of ultraviolet wavelength light. Accordingly, it is possible to prevent light emitted from the active layer 126 from being absorbed in the semiconductor layer.

Light L1 obliquely emitted by the sub-reflective layer 135 may be reflected upwardly. Accordingly, it is possible to reduce light absorption in the light emitting structure 120 and enhance the light extraction efficiency. Also, it is also possible to adjust an orientation angle of the semiconductor device.

The sub-reflective layer 135 may cover a portion of the second electrode 246. According to such a configuration, light flowing into a space between the first insulation layer 131 and the second electrode 246 may be reflected upwardly. However, the sub-reflective layer 135, which is made of aluminum, has relatively poor step coverage, and thus it may not be preferable to fully cover the second electrode 246.

The thickness of the second electrode 246 may be less than or equal to 80% of the thickness of the first insulation layer 131. Thus, it is possible to solve a problem such as a crack or detachment of the sub-reflective layer 135 or the second conductive layer 150 due to a reduction in step coverage which may occur when the sub-reflective layer 135 and the second conductive layer 150 are disposed.

The sub-reflective layer 135 may have the same width as the sub-recess 127. The width of the first recess 128 and the width of the sub-recess 127 may indicate the maximum width formed on the first surface 127G of the semiconductor structure 120.

The sub-reflective layer 135 may include an extension part 135a extending toward the second electrode 246 in the sub-recess 127. The extension part 135a may electrically connect second electrodes 246 separated by the sub-recess 127.

The sub-reflective layer 135 may be disposed in a separation distance between the second electrode 246 and the first insulation layer 131, and a region where a Schottky junction is formed between the sub-reflective layer 135 and the second conductive semiconductor layer 127 may be within the separation distance. By forming the Schottky junction, it is possible to facilitate spreading of electric current.

An angle θ4 formed between an inclined portion of the sub-reflective layer 135 and the first surface of the second conductive semiconductor layer 127 may range from 90 degrees to 145 degrees. When the incline angle θ4 is less than 90 degrees, it is difficult to etch the second conductive semiconductor layer 127. When the incline angle θ4 is greater than 145 degrees, the etched area of the active layer is so large that there may be a reduction in light emitting efficiency.

The second conductive layer 150 may cover the sub-reflective layer 135 and the second electrode 246. Accordingly, the second electrode pad 166, the second conductive layer 150, the sub-reflective layer 135, and the second electrode 246 may form one electrical channel. All the above-described configurations may be applied as the configuration of the second conductive layer 150.

Referring to FIG. 36B, the sub-reflective layer 135 may be disposed between the plurality of recesses 128 to define a plurality of light emitting regions. The areas of the light emitting regions may be adjusted depending on the level of injected electric current and the aluminum composition.

Figure 37:
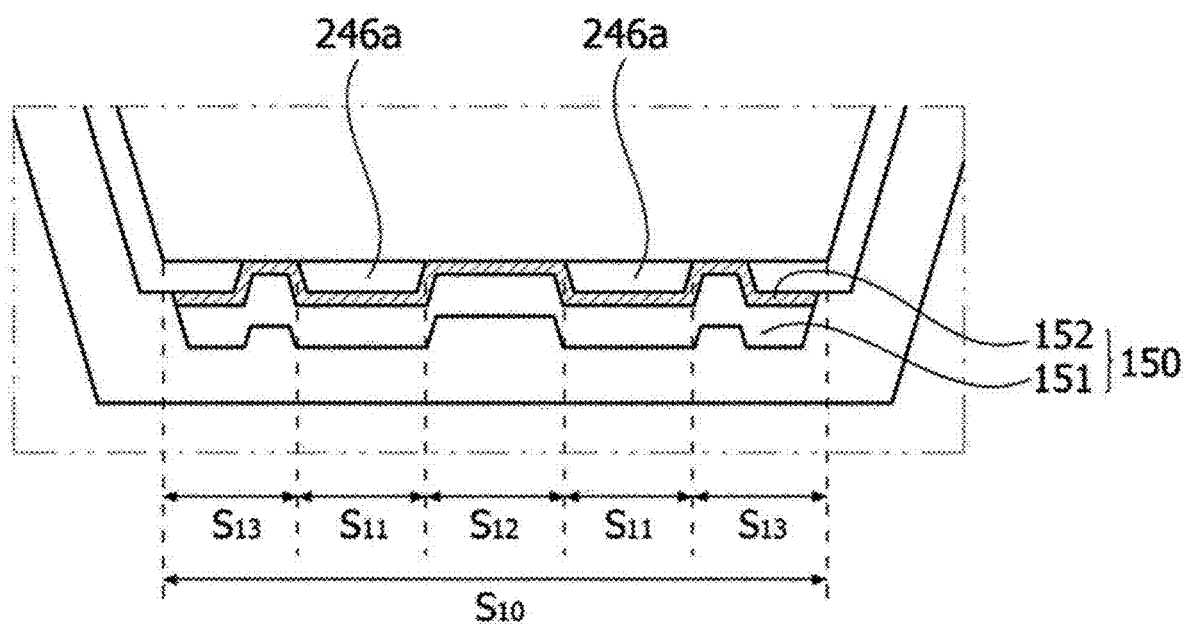
FIG. 37 is a third modification of FIG. 33.

FIG. 37 is a third modification of FIG. 34.

The second conductive layer 150 may include a reflective layer 151 containing aluminum and a first intermediate layer 152 disposed between the second electrode 246 and the reflective layer 151. When the second electrode 246 is formed of ITO, oxygen may penetrate into the reflective layer 151 to form $Al_2O_3$. In this case, the reflective efficiency of the reflective layer 151 is reduced. In an embodiment, the first intermediate layer 152 may be disposed between the reflective layer 151 and the second electrode 246, thereby enhancing adhesion strength therebetween and also preventing penetration of oxygen.

The first intermediate layer 152 may contain at least one of chromium (Cr), titanium (Ti), and nickel (Ni). The first intermediate layer 152 may have a thickness ranging from 0.7 μm to 7 nm. The first intermediate layer 152 may further contain aluminum. In this case, it is possible to enhance adhesion strength between the first intermediate layer 152 and the aluminum.

The first intermediate layer 152 may be in contact with the first surface 127G of the second conductive semiconductor layer 127 in the second section S12 and the third section S13. Accordingly, it is possible to enhance the electric current spreading efficiency by means of a Schottky junction.

The thickness ratio of the second electrode 246 to the reflective layer 151 may range from 1:2 to 1:120. The thickness of the reflective layer 151 may range from 30 nm to 120 nm. When the thickness of the reflective layer 151 is less than 30 nm, there is a reduction in reflectance in an ultraviolet wavelength band. Even when the thickness is greater than 120 nm, reflective efficiency hardly increases.

Figure 38:
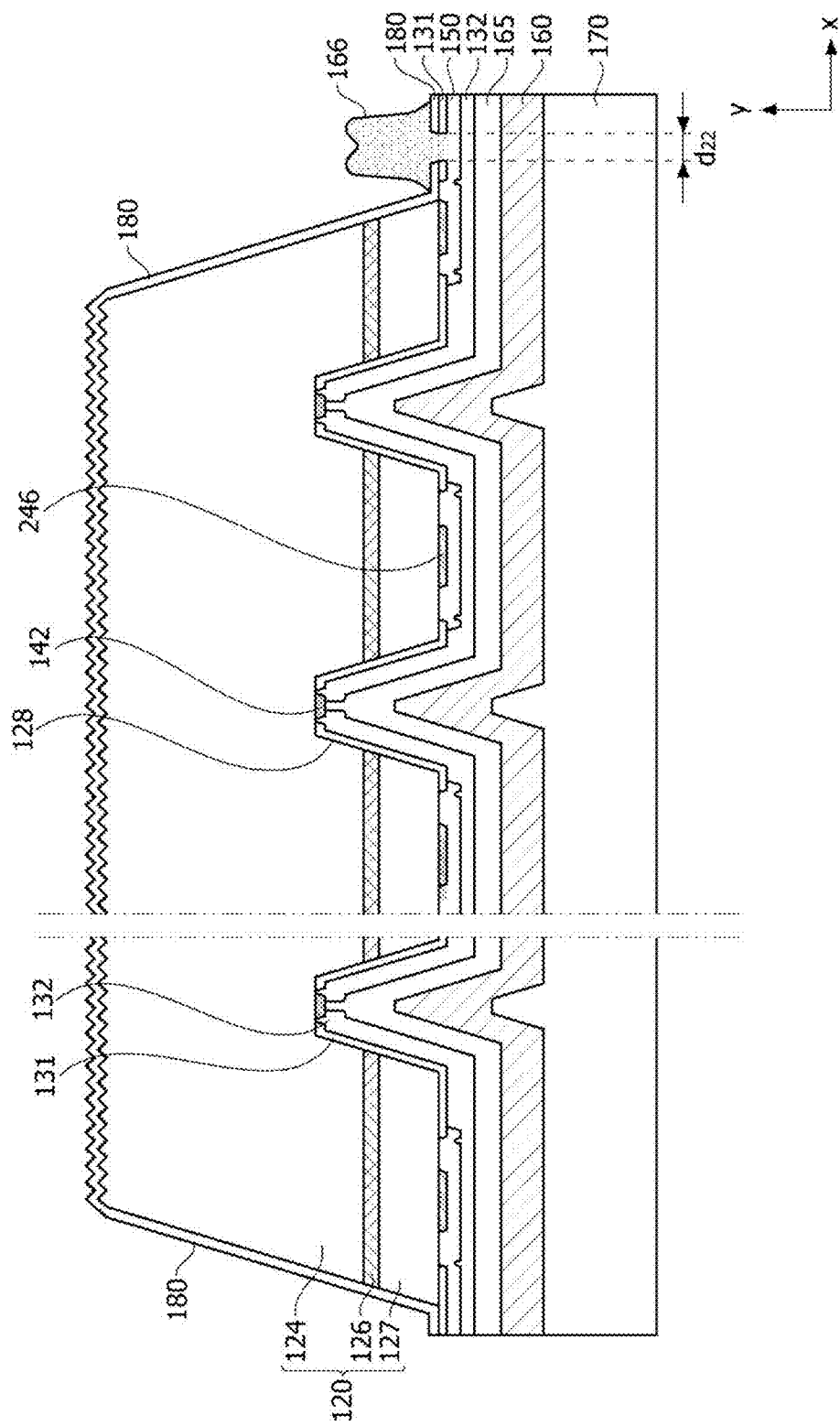
FIG. 38 is a conceptual view of a semiconductor device according to a fifteenth embodiment of the present invention.
Figure 39:
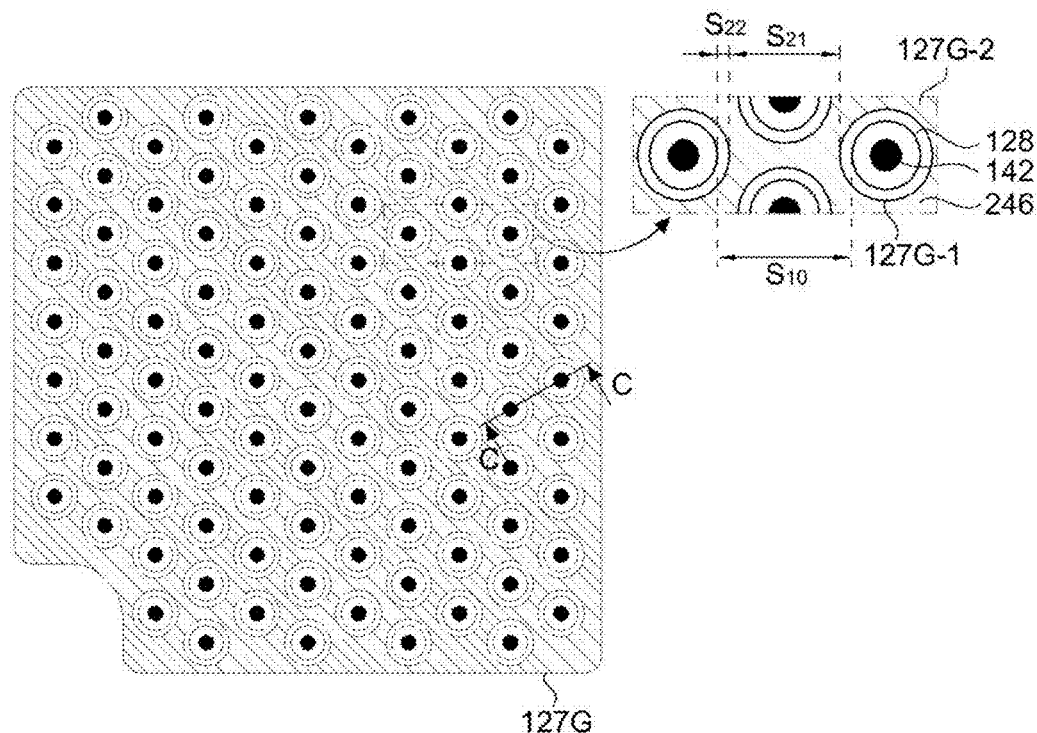
FIG. 39 is a plan view of FIG. 38.

FIG. 38 is a conceptual view of a semiconductor device according to a fifteenth embodiment of the present invention, and FIG. 39 is a plan view of FIG. 38.

Referring to FIG. 38, the light emitting structure 120 described with reference to FIGS. 1 to 3 and the configuration of each of the layers described with reference to FIG. 4 may be applied to the semiconductor device according to this embodiment as they are.

Referring to FIG. 39, the first surface 127G may include first regions 127G-1 having recesses 128 disposed therein and a second region 127G-2 disposed between the first regions 127G-1.

The diameter of the first regions 127G-1 may be 1.0 to 1.5 times that of the recesses 128. When the diameter of the first regions 127G-1 exceeds 1.5 times that of the recesses 128, the area of the second electrode 246 is so small that there may be a reduction in electric current spreading efficiency. The first regions 127G-1 may be a region between the second electrode 246 and the recesses 128.

The second region 127G-2 may be the remaining region other than the first regions 127G-1. The second electrode 246 may be disposed on the second region 127G-2 as a whole.

The second electrode 246 may contain a metal or metal oxide with low resistance. Accordingly, there is absorption of ultraviolet light by the second electrode 246. Accordingly, there is a need to reduce the amount of light absorbed by the second electrode 246 by decreasing the area of the second electrode 246.

The second conductive layer 150 is disposed on the first regions 127G-1 and the second region 127G-2, and thus light incident onto the first regions 127G-1 may be reflected by the second conductive layer 150. Accordingly, it is possible to increase light extraction efficiency by decreasing the area of the second region 127G-2 where the second electrode 246 is disposed and increasing the area of the first regions 127G-1. In this case, it is important to maximally secure a reflection region while securing the area of the second electrode 246 needed to spread electric current.

The area of the second region 127G-2 may range from 35% to 60% of the maximum area of the light emitting structure 120. When the area of the second region 127G-2 is less than 35%, the contact area of the second electrode 246 is so small that the electric current spreading efficiency may be reduced. Also, when the area of the second region 127G-2 exceeds 60%, the area of the first regions 127G-1 is so small that the light extraction efficiency may decrease.

The area of the first regions 127G-1 may range from 10% to 55% of the maximum area of the light emitting structure 120. When the area of the first regions 127G-1 is less than 10%, it is difficult to have sufficient reflective efficiency. When the area of the first regions 127G-1 is greater than 55%, the area of the second region 127G-2 is so small that there may be a decrease in electric current injection efficiency.

Accordingly, the ratio of the area of the first regions 127G-1 to the area of the second region 127G-2 may range from 1:0.7 to 1:6. When this relationship is satisfied, the electric current spreading efficiency is sufficient, and thus it is possible to enhance the optical output power. Also, a sufficient reflective region is secured, and thus it is possible to enhance the light extraction effect.

Figure 40:
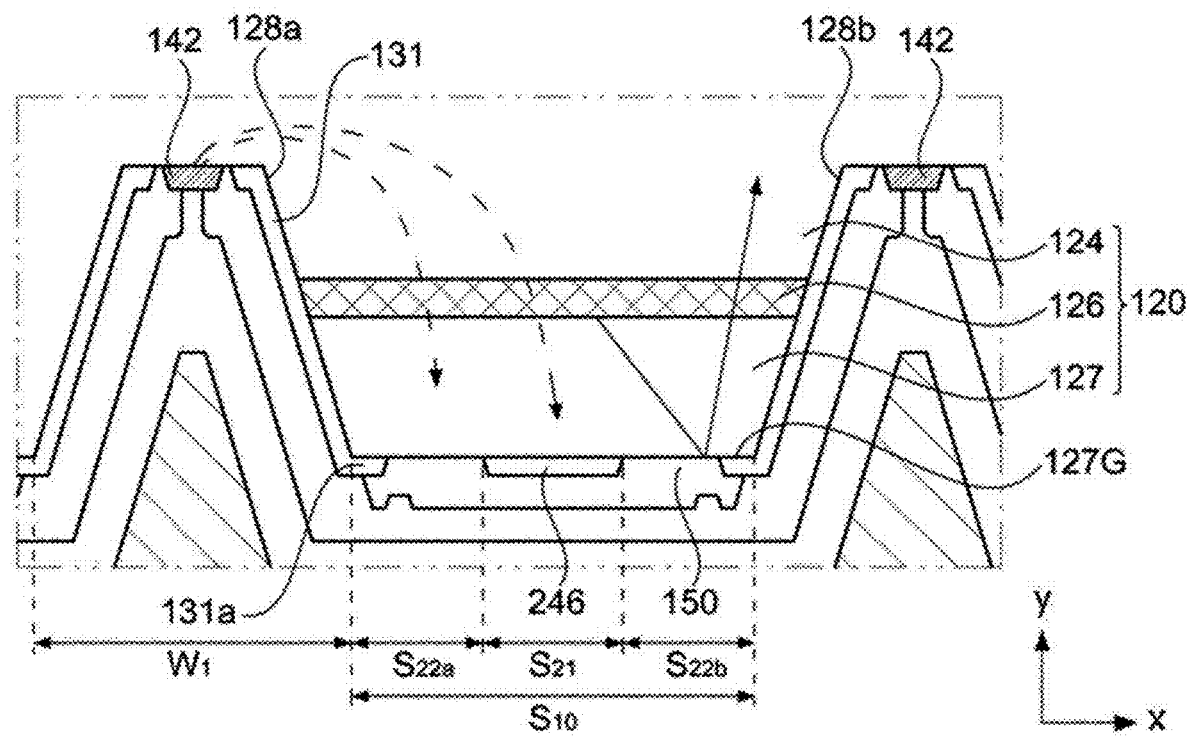
FIG. 40 is a sectional view taken along C-C of FIG. 39.

FIG. 40 is a sectional view taken along C-C of FIG. 39.

The first surface 127G of the second conductive semiconductor layer may include a 1-1 surface S10 disposed between the centers of two first and second recesses 128a and 128b that are most adjacent to each other in the first direction (the X direction). In this case, the first direction may be a direction perpendicular to the thickness direction of the light emitting structure 120.

The 1-1 surface S10 may include a first section S21 and second sections S22a and S22b disposed between the first section S21 and first and second recesses 128a and 128b.

The second sections S22a and S22b may include a 2-1 section S22a disposed between the first section S21 and the first recess 128a and a 2-2 section S22b disposed between the first section S21 and the second recess 128b.

The second electrode 246 may be disposed in the first section S21. When the second electrode 246 is disposed in only the second sections S22a and S22b, the electric current density of the second sections S22a and S22b may increase, but the electric current density of the first section S21 may relatively decrease. Also, when the second electrode 246 is disposed in all of the first section S21 and the second sections S22a and S22b, light absorption may occur in all of the first section S21 and the second sections S22a and S22b. This may not be beneficial to light extraction efficiency.

The second conductive layer may be disposed in the first section S21 and the second sections S22a and S22b. Accordingly, the second sections S22a and S22b where the second electrode 246 is not disposed may perform a reflection function.

According to an embodiment, it is important to appropriately determine a distance between the first electrode 142 and the second electrode 246 in order to secure light extraction efficiency while securing electric current density needed for light emission.

For example, when the area of the first electrode 142 is large, an electric current spreading region is widened, and thus it is possible to increase the area of the second sections S22a and S22b. Accordingly, it is possible to widen the reflective region. However, when the area of the first electrode 142 is small, the electric current spreading region is narrowed, and thus the second sections S22a and S22b may be narrowed.

The ratio of the width of the 2-1 section S22b in the first direction to the diameter W1 of the first recess 128a may range from 1:1.25 to 1:14. When the ratio is smaller than 1:1.25, the diameter of the recesses 128 is reduced, and thus the area of the first electrode 142 decreases. Accordingly, the strength of electric current injected through the first electrode 142 is weakened, and thus the electric current density of the second sections S22a and S22b may be reduced.

When the ratio is greater than 1:14, the diameter of the recesses 128 is excessively increased, and thus the area of the first surface 127G of the second conductive semiconductor layer decreases. That is, the width of the 1-1 surface S10 decreases. As a result, the area of the active layer 126 decreases, and thus the light emitting region is reduced.

The diameter W1 of the recesses 128 may range from 20 μm to 70 μm. When the diameter of the recesses 128 is less than 20 μm, it is difficult to secure a processing margin for forming the first electrode 142 disposed therein. When the diameter of the recesses 128 is greater than 70 μm, the area of the active layer 126 is so small that the light emission efficiency may deteriorate. Here, the diameter of the recesses 128 may be the maximum diameter formed on the first surface 127G of the second conductive semiconductor layer.

The width of the first section S21 in the first direction may range from 6 μm to 12 μm. When the width is less than 6 μm, the area of the second electrode 246 is so small that there may be a decrease in electric current spreading efficiency. When the width is greater than 12 μm, the second sections S22a and S22b are so small that there may be a decrease in reflective efficiency.

The widths of the 2-1 section S22a and the 2-2 section S22b in the first direction may range from 5 μm to 16 μm. That is, the entire width of the second sections S22a and S22b may range from 10 μm to 32 μm. When the widths of the 2-1 section S22a and the 2-2 section S22b in the first direction are less than 5 μm, it is difficult to secure a sufficient reflective region. When the widths are greater than 16 μm, the second electrode 246 is narrowed.

The ratio of the width of the first section S21 to the entire width of the second sections S22a and S22b may range from 1:0.8 to 1:5. When the width ratio range is satisfied, the ratio of the area of the first regions 127G-1 to the area of the second region 127G-2 may be adjusted to be in the range of 1:0.8 to 1:6. Accordingly, it is possible to enhance the electric current spreading efficiency and the light extraction effect.

The first section S21 may include a point corresponding to ½ of the 1-1 surface S10. Since the second electrode 246 is disposed at the center of the 1-1 surface S10, the electric current density of the first section S21 may increase. Also, since the electric current density of the first section S21 increases, electric current is spread in the second sections S22a and S22b disposed therebetween, and it is possible to secure the electric current density needed for light emission. However, the present invention is not limited thereto. When the diameter of the first recess 128a is different from the diameter of the second recess 128b, the first section S21 may deviate from the point corresponding to ½ of the 1-1 surface S10.

Figure 41:
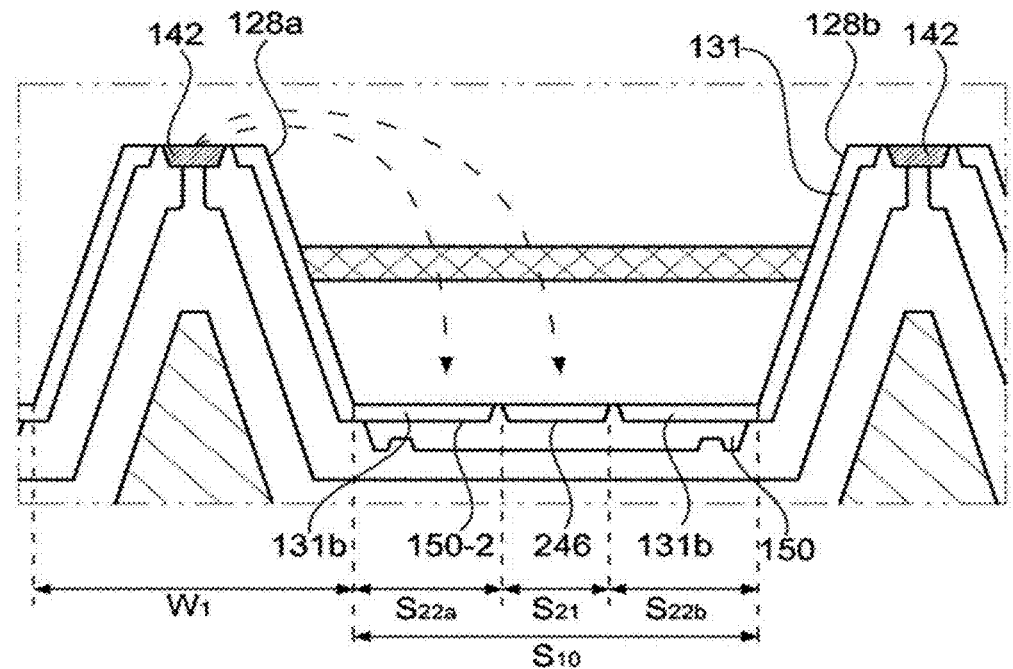
FIG. 41 is a first modification of FIG. 40.
Figure 42:
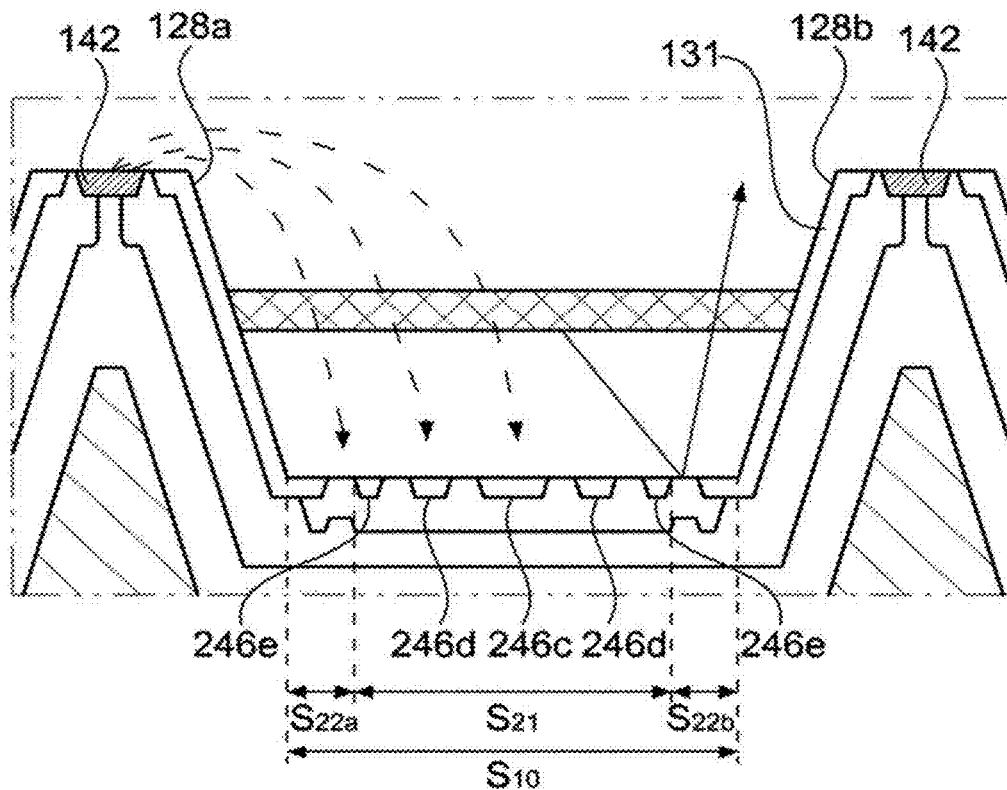
FIG. 42 is a second modification of FIG. 40.

FIG. 41 is a first modification of FIG. 40, and FIG. 42 is a second modification of FIG. 40.

The second conductive layer 150 may include a reflective groove 150-2 in the second sections S22a and S22b. Light incident onto the second sections S22a and S22b may be reflected along a propagation path changed by an inclined surface of the reflective groove 150-2. According to such a configuration, it is possible to enhance light uniformity.

The depth of the reflective groove 150-2 may be the same as the thickness of the first insulation layer 131. The thickness of the first insulation layer 131 may be equal to 110% to 130% of the thickness of the second electrode 246. As described above, the thickness of the second electrode 246 may range from 1 nm to 15 nm.

A light transmitting layer 131b may be disposed in the reflective groove 150-2. The shape of the light transmitting layer 131b may correspond to the shape of the reflective groove 150-2. Accordingly, the thickness of the light transmitting layer 131b may be the same as the thickness of the reflective groove 150-2. For example, the reflective groove 150-2 may be formed by disposing the second conductive layer 150 on the light transmitting layer 131b.

The material of the light transmitting layer 131b may include various materials capable of transmitting ultraviolet wavelength light. For example, the light transmitting layer 131b may contain an insulation layer material. The light transmitting layer 131b may contain at least one of $SiO_2$, $Si_xO_y$, $Si_3N_4$, $Si_xN_y$, $SiO_xN_y$, $Al_2O_3$, $TiO_2$, and AlN, but is not limited thereto.

The light transmitting layer 131b may be formed by the first insulation layer 131 disposed inside the first recess 128a extending to the second conductive semiconductor layer. However, the present invention is not limited thereto, and a separate dielectric layer may be disposed.

Referring to FIG. 42, the second electrode 246 may have a density decreasing away from the center point of the 1-1 surface S10. That is, partitioned second electrodes 246, 246d, and 246e may be disposed to have a size decreasing away from the center. The partitioned second electrodes 246c, 246d, and 246e may be produced through selective etching by means of a mask.

According to such a configuration, it is possible to increase the electric current density of the second sections S22a and S22b while maintaining the electric current density of the first section S21. Also, it is possible to obtain both electric current spreading efficiency and reflective efficiency by maintaining the area ratio of the first section S21 to the second sections S22a and S22b in the range of 1:0.8 to 1:6.

Figure 43:
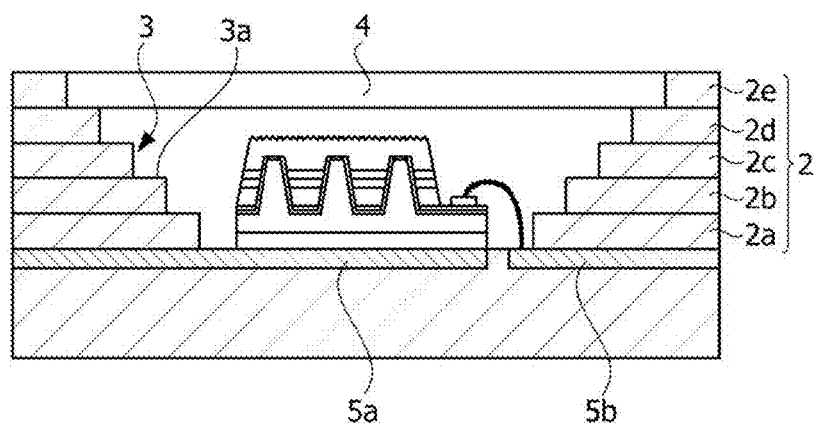
FIG. 43 is a conceptual view of a semiconductor device package according to an embodiment of the present invention.

FIG. 43 is a conceptual diagram of a semiconductor device package according to an embodiment of the present invention.

The semiconductor device may be configured as a package and may be used for cure of a resin, a resist, an SOD, or an SOG. Alternatively, the semiconductor device may be used for medical treatment or may be used for sterilization of an air purifier or a water purifier.

Referring to FIG. 43, the semiconductor device package may include a body 2 with a groove 3, a semiconductor device 1 disposed in the body 2, and a pair of lead frames 5a and 5b disposed in the body 2 and electrically connected to the semiconductor device 1.

The body 2 may contain a material or a coating layer that reflects ultraviolet light. The body 2 may be formed by stacking a plurality of layers 2a, 2b, 2c, and 2d. The plurality of layers 2a, 2b, 2c, and 2d may be made of the same material or contain different materials.

The groove 3 may have a width increasing away from the semiconductor device and may have an inclined surface having a stepped portion formed therein.

A light transmitting layer 4 may cover the groove 3. The light transmitting layer 4 may be made of glass, but is not limited thereto. The material of the light transmitting layer 4 is not particularly limited as long as the material can effectively transmit ultraviolet light. The groove 3 may have an empty space formed therein.

The semiconductor device may be used as a light source of a lighting system, a light source of an image display device, or a light source of a lighting device. That is, the semiconductor device may be applied to various electronic devices configured to provide light by being disposed in housings thereof. For example, when the semiconductor device and an RGB phosphor are mixed and used, it is possible to implement white light with a high color rendering index (CRI).

The above-described semiconductor device may be configured as a light emitting device package and used as a light source of a lighting system. For example, the semiconductor device may be used as a light source of an image display device or a light source of a lighting device.

When the semiconductor device is used as a backlight unit of an image display device, the semiconductor device may be used as an edge-type backlight unit or a direct-type backlight unit. When the semiconductor device is used as a light source of a lighting device, the semiconductor device may be used as a lamp or a bulb. Alternatively, the semiconductor device may be used as a light source of a mobile terminal.

Figure 44:
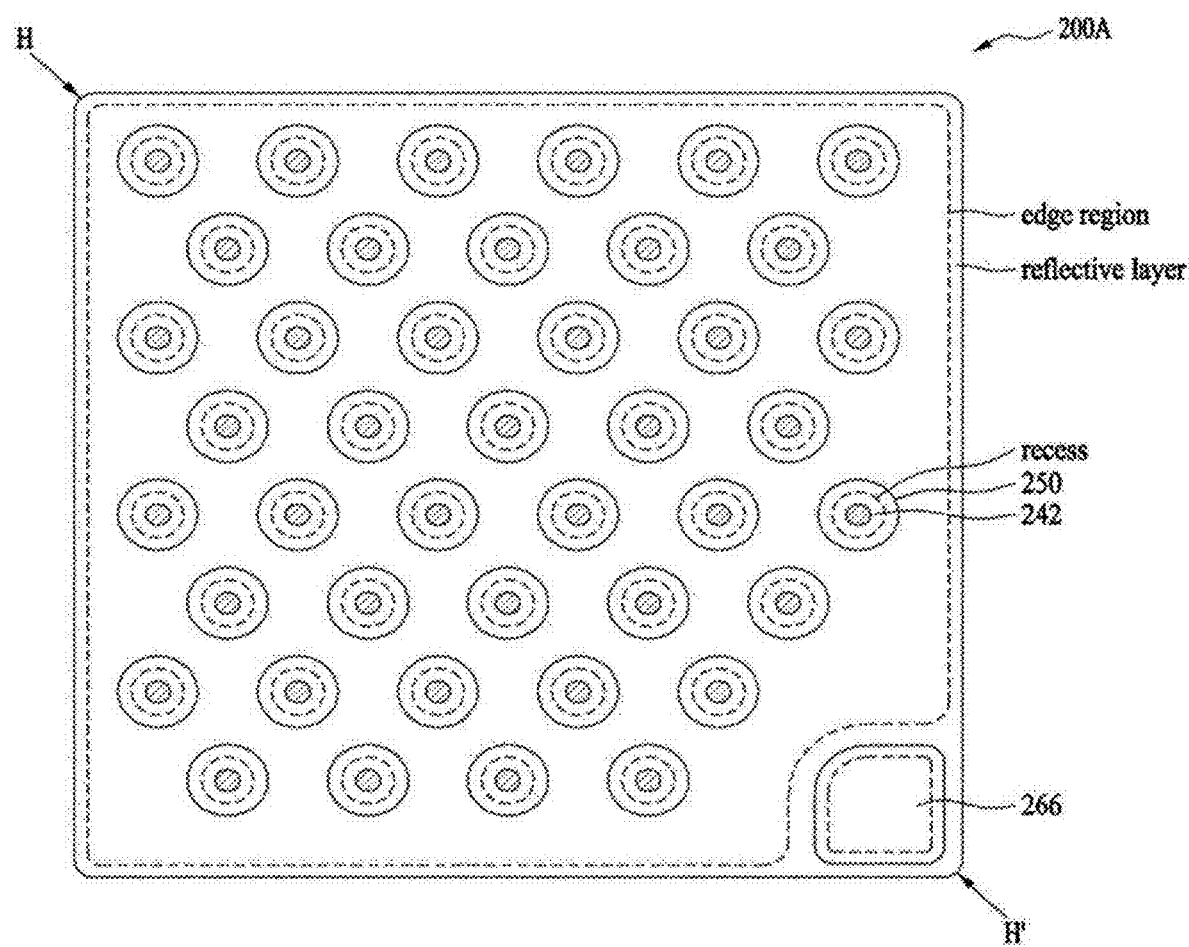
FIG. 44 is a plan view of a semiconductor device according to a sixteenth embodiment.
Figure 45:
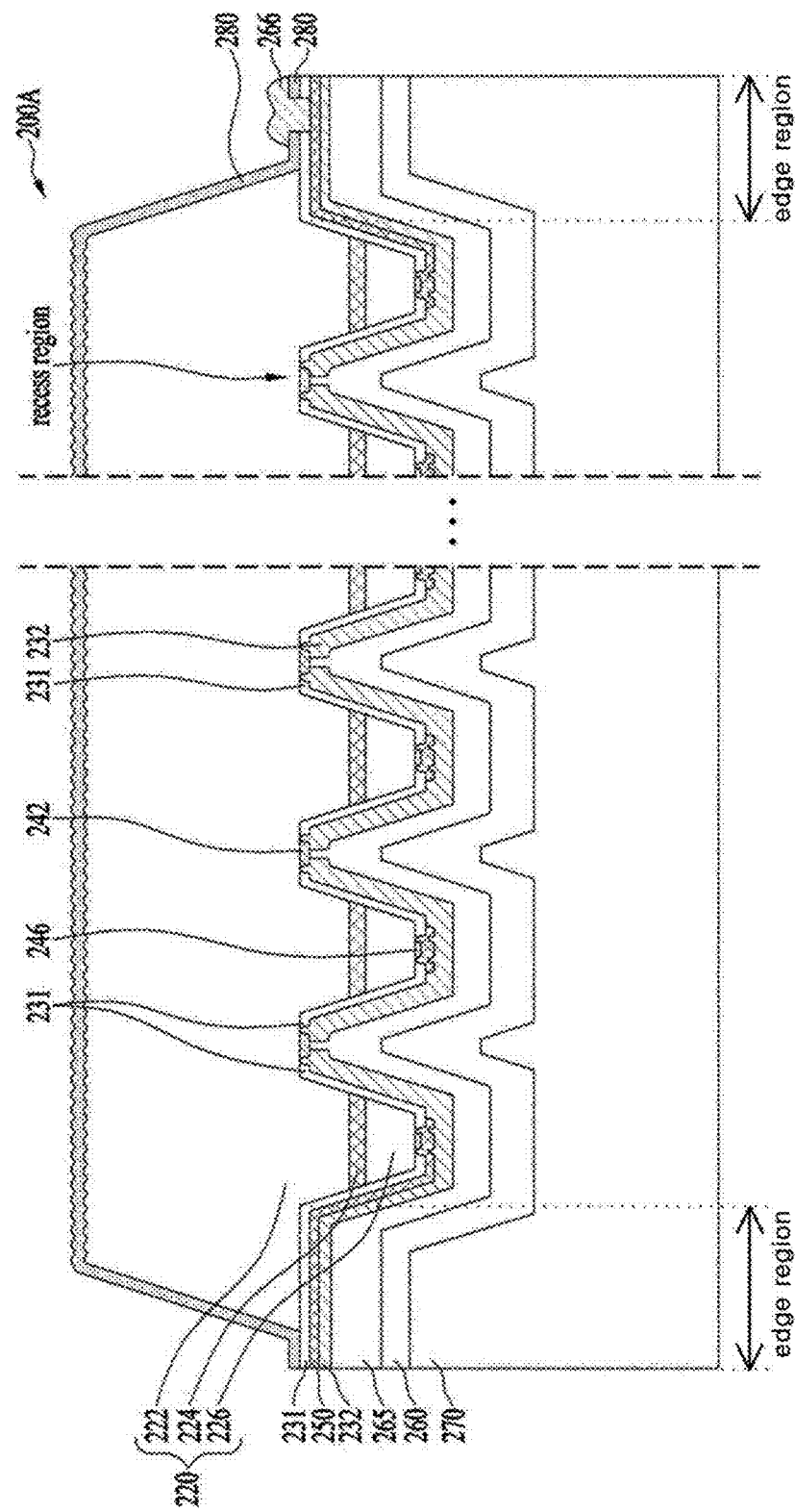
FIG. 45 is a sectional view of the semiconductor device taken along H-H' of FIG. 44.
Figure 46:
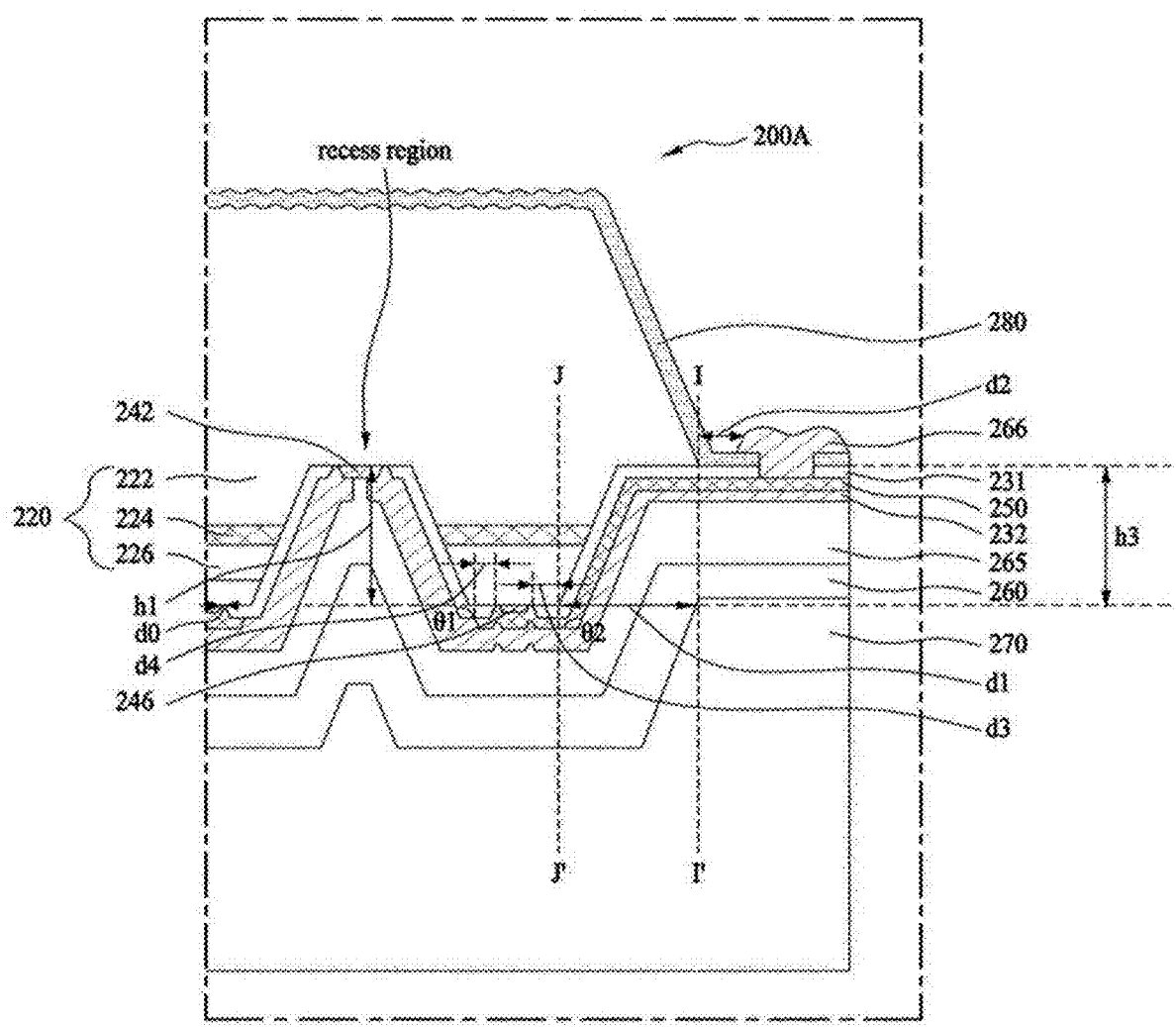
FIG. 46 is a detailed diagram showing a portion of FIG. 45.

FIG. 44 is a plan view of a semiconductor device according to a sixteenth embodiment, FIG. 45 is a sectional view of the semiconductor device taken along H-H' of FIG. 44, and FIG. 46 is a detailed diagram showing a portion of FIG. 45.

For the semiconductor device in FIG. 44, a first electrode 242 and a second conductive layer 250 may be disposed inside and outside a plurality of recesses, respectively, a reflective layer may be disposed outside an edge region of the semiconductor device, and the reflective layer may be formed by extending the second conductive layer 250.

In the semiconductor device, a structure composed of a first electrode, a recess, and a second conductive layer (a first reflective layer) may be actually provided in plural numbers, and the number of recesses may be freely adjusted in consideration of the size, electric current density, and optical light power of the semiconductor device.

A semiconductor device 200A according to this embodiment may include a semiconductor structure 220 including a first conductive semiconductor layer 222, an active layer 224, and a second conductive semiconductor layer 226, a first electrode 242 in contact with the first conductive semiconductor layer 222, and a second electrode 246 in contact with the second conductive semiconductor layer 226.

There may be a plurality of regions in which recesses are provided in the second conductive semiconductor layer 226, the active layer 224, and even a portion of the first conductive semiconductor layer 226 so that the first conductive semiconductor layer 222 is exposed. The regions may be referred to as recess regions. The recess regions have a sectional surface shaped as, for example, a circle, a polygon, and an ellipse, but are not limited thereto.

The first electrodes 242 may be disposed under the first conductive semiconductor layer 222 exposed in the recess regions, and the second electrodes 246 may be disposed on a lower surface of the second conductive semiconductor layer 226 between the recess regions.

The first conductive semiconductor layer 222 may be made of a group III-V or group II-VI compound semiconductor and may be doped with a first conductive dopant. The first conductive semiconductor layer 222 may be grown with any one of semiconductor materials having an empirical formula $Al_xIn_yGa_{1-x-y}N$ ($0 \leq x \leq 1$, $0 \leq y \leq 1$, $0 \leq x+y \leq 1$), such as AlGaN, GaN, InAlGaN, AlGaAs, GaP, GaAs, GaAsP, and AlGaInP.

When the first conductive semiconductor layer 222 is an n-type semiconductor layer, the first conductive dopant may include an n-type dopant such as Si, Ge, Sn, Se, and Te. The first conductive semiconductor layer 222 may be grown as a single or multiple layers, but is not limited thereto.

The active layer 224 may include any one of a single-well structure, a multi-well structure, a single-quantum-well structure, a multi-quantum-well (MQW) structure, a quantum dot structure, and a quantum wire structure.

The active layer 224 may be formed as a paired structure of a well layer and a barrier layer, for example, AlGaN/AlGaN, InGaN/GaN, InGaN/InGaN, AlGaN/GaN, InAlGaN/GaN, GaAs(InGaAs)/AlGaAs, or GaP(InGaP)/AlGaP by using group X compound semiconductor materials, but is not limited thereto. The well layer may be formed of a material having an energy band gap smaller than that of the barrier layer.

The second conductive semiconductor layer 226 may be made of a group III-V or group II-VI compound semiconductor and may be doped with a second conductive dopant. The second conductive semiconductor layer 226 may be made of any one or more of semiconductor materials having an empirical formula $Al_xIn_yGa_{1-x-y}N$ ($0 \leq x \leq 1$, $0 \leq y \leq 1$, $0 \leq x+y \leq 1$), such as AlGaN, GaN, AlInN, AlGaAs, GaP, GaAs, GaAsP, AlGaInP.

When the second conductive semiconductor layer 226 is made of AlGaN, hole injection may not be facilitated due to low electrical conductivity of AlGaN. This problem may be solved by disposing GaN with relative high electrical conductivity on the bottom surface of the second conductive semiconductor layer 226.

When the second conductive semiconductor layer 226 is a p-type semiconductor layer, the second conductive dopant may include a p-type dopant such as Mg, Zn, Ca, Sr, and Ba. The second conductive semiconductor layer 226 may be formed as a single or multiple layers, but is not limited thereto.

A square wave pattern may be formed on an upper surface of the first conductive semiconductor layer 222. The square wave pattern may enhance extraction efficiency for light emitted from the semiconductor device 200A.

The width may increase from the first conductive semiconductor layer 222 to the active layer 224 to an electron-blocking layer to the second conductive semiconductor layer 226. This is because a lower structure of the light emitting structure 220 may be etched to have a larger width during an etching process.

The light emitting structure 220 may have a height ranging, for example, from 2 µm to 3 µm. When the light emitting structure 220 emits ultraviolet light, the square wave pattern of the upper surface may have a depth ranging from 3,000 angstroms to 8,000 angstroms and an average depth of about 5,000 angstroms in order to increase extraction efficiency for short-wavelength light having a wavelength shorter than a blue wavelength.

A first insulation layer 131 may be disposed a certain distance apart from the first electrode 242. The first insulation layer 231 may extend from an exposed surface of the first conductive semiconductor layer 22 to a side surface of the recess region and thus may be disposed even in the surface of the second conductive semiconductor layer 226. The first insulation layer 131 may be disposed on the exposed lower surface of the second conductive semiconductor layer 246 a certain distance apart from both ends of the second electrode 246.

The first insulation layer 231, a second insulation layer 232, and a passivation layer 280 may be made of an insulating material. As the insulating material, aluminum oxide or aluminum nitride may be used. For example, the first insulation layer 231, the second insulation layer 232, and the passivation layer 280 may contain $SiO_2$ or SiN, but are not limited thereto.

The second conductive layer 250 may be disposed on the lower surface of the second conductive semiconductor layer 226. The second conductive layer 250 may be made of a conductive material, for example, metal. In detail, the second conductive layer 250 may be made of at least one material selected from a group consisting of chromium (Cr), aluminum (Al), titanium (Ti), gold (Au), and nickel (Ni), or an alloy thereof.

For example, it is assumed that the second conductive layer 250 is made of aluminum and ultraviolet wavelength light is emitted from the active layer 224. In this case, when the second conductive layer 250 has a thickness greater than or equal to 50 nm, the thickness may be sufficient to reflect 80% or more of the ultraviolet wavelength light.

The second conductive layer 250 may act as a capping layer configured to electrically connect the second electrode 246 to a second electrode pad 266 and surround and support the second electrode 246 to secure stability thereof. Also, the second conductive layer 250 may be disposed to surround at least a portion of a bottom surface and a side surface of the insulation layer. The second conductive layer 250 may have high adhesion strength with the insulation layer, thereby securing device reliability.

In particular, a semiconductor device 200A that emits UV-B or UB-C wavelength light has a light emitting structure grown based on AlGaN, and thus the amount of light being emitted may, compared to a light emitting device configured to emits blue wavelength light, increase in TM mode in which light emission is dominant in a direction perpendicular to the growth direction of the light emitting structure 220 (i.e., the horizontal direction of FIG. 5). In this case, it is possible to reduce light resorption in the light emitting structure 220 by the second conductive layer 250 reflecting laterally traveling light in the active layer 224 to change the light's direction and shorten the light's path.

To this end, the second conductive layer 250 may extend from an edge region of the light emitting structure 220 to a region higher than the active layer 224.

Referring to FIG. 46, the edge region of the light emitting structure 220 may be exposed by removing the second conductive semiconductor layer 226, the active layer 224, and a portion of the first conductive semiconductor layer 222. The second conductive layer 250 may be disposed in a region where the light emitting structure 220 has been removed.

In FIG. 46, a region represented by line I-I' is an end of the light emitting structure 220 and may refer to a separation region of the light emitting structure 220. A region represented by line J-J' may be a region where the surface of the light emitting structure 220, that is, the second conductive semiconductor layer 226 has not been removed and the upper surface remains. The edge region of the light emitting structure may indicate the outside of the region represented by line J-J'.

Here, a distance d1 between line I-I' and line J-J' may range from 3 µm to 7 µm and for example, may be 5 µm. When the distance between line I-I' and line J-J' is less than 3 µm, a mesa etching region is narrowed, and thus it may be difficult to form the second conductive layer 250 to have a stepped structure. When the distance is greater than 7 µm, process stability is enhanced, but there may be a decrease in volume of the active layer 224.

The second electrode pad 266 may be made of a conductive material or a metal and have a single-layered structure or a multi-layered structure. In detail, the second electrode pad 266 may have a structure of titanium (Ti)/nickel (Ni)/Ti/Ni/Ti/gold (Au).

The second electrode pad 266 may serve to reflect light. Thus, as the second electrode pad 266 gets closer to the semiconductor structure 220, it is possible to better enhance light extraction efficiency. A distance d2 between a region represented by the second electrode pad 266 and line I-I' and the end of the light emitting structure 220 may range from 20 µm to 30 am. When the distance d2 is less than 20 µm, it may be difficult to form the second insulation layer 280 and secure a processing margin. When the distance d2 is greater than or equal to 30 jam, the second electrode pad 266 is so far separated from the light emitting structure 220 that the light extraction efficiency may be reduced.

In order to electrically connect the second electrode pad 266 to the second conductive layer 250, the second electrode pad 266 is disposed after a recess is formed on at least one of the first insulation layer 231 and the passivation layer 280. In this case, the second electrode pad 266 may be formed along a stepped portion of at least one of the first insulation layer 231 and the passivation layer 280. When the second electrode pad 266 is formed along a low stepped portion, the upper surface of the second electrode pad may be concave or convex with respect to the substrate. When the second electrode pad 266 is bonded to wire, the concave or convex surface may increase the bonding area, thus enhancing adhesion strength therebetween.

The depth hl of the recess region may be the same as a depth h3 to which the light emitting structure 220 has been removed to dispose the second conductive layer 250 in the edge region of the light emitting structure 220.

Also, the side surface of the light emitting structure 220, in particular, the side surface of the second conductive semiconductor layer 226 may be formed at an angle θ1 from the lower surface, and the side surface of the second conductive layer 250 may be formed at an angle θ2 from the lower surface. Here, the angles θ1 and θ2 have the same value.

An inclined structure of the second conductive layer 250 may be formed by obliquely removing the edge of the light emitting structure 220 through mesa etching or the like and may be configured to enable light emitted from the active layer 224 to travel toward an upper portion of the light emitting device 200A. In FIG. 46, the angles θ1 and θ2 may be greater than 90 degrees and less than 150 degrees.

A distance d3 of a region in which the lower surface of the second conductive semiconductor layer 226 and the first insulation layer 231 are in contact with each other may range, for example, from 5 μm to 15 μm. When the distance d3 is less than 5 μm, it may be difficult to secure a processing margin. When the distance d3 is greater than 15 μm, the disposition area of the second electrode 246 is so small that the operating voltage of the device may increase. Also, a distance d4 of a region in which the first insulation layer 231 and the second conductive layer 250 overlap with each other on the lower surface of the second conductive semiconductor layer 226 may range, for example, from 4 μm to 8 μm. When the distance d4 is less than 4 μm, it is difficult to secure a processing margin for overlapping between the second conductive layer 250 and the first insulation layer 231. When the distance d4 is greater than 8 μm, it is difficult to secure a processing margin for electrical separation from the first electrode 242.

The second insulation layer 232 may be disposed under the second conductive layer 250 and the first insulation layer 231. The second insulation layer 232 is in contact with the first conductive semiconductor layer 222 inside the recess region and covers an edge of the first electrode 242.

The second insulation layer 231 may serve to electrically separate the first electrode from the second electrode 246. The thickness of the second insulation layer 232 may range from 5,000 angstroms to 13,000 angstroms. When the thickness of the second insulation layer 232 is less than 5,000 angstroms, the thickness is not sufficient to electrically separate the first electrode 242 from the second electrode 246, and thus there may be a reduction in reliability. When the thickness is greater than 13,000 angstroms, a stress occurring during a process of bonding a support substrate 270 is so large that there may be a reduction in reliability.

A first conductive layer 265 and a junction layer 260 may be disposed on a lower surface of the second insulation layer according to the shape of the light emitting structure and the recess region. The first conductive layer 265 in a first recess region may be in contact with the first electrode 242 through an opening of the second insulation layer 232.

The first conductive layer 265 may be made of a material with high reflectance, for example, aluminum (Al). In an ultraviolet wavelength region, when the thickness is greater than or equal to 500 angstroms, it is possible to secure a light reflectance of 80% or more.

The junction layer 260 may be a region including a region where the first conductive layer 265 is diffusion-bonded or eutectic-bonded to the support substrate 270 disposed thereunder. In the region, Ni, Sn, Au, etc. are mixedly present.

The junction layer 260 may have a protrusion formed on the bottom surface in the thickness direction of the semiconductor device along a stepped portion occurring within a separation distance d0 between the first insulation layer 231 and the second electrode 246 disposed on the bottom surface of the second conductive semiconductor layer 226. When the thickness is sufficient, the junction layer 260 may have a flat bottom surface.

Also, the separation distance d0 between the second electrode 246 and the first insulation layer 231 may range, for example, from 1 μm to 2 μm. The second conductive semiconductor layer 226 may be in contact with the second conductive layer 250 within the separation distance d0. The separation distance d0 may be secured through self-alignment.

The junction layer 260 may contain a conductive material. For example, the junction layer 260 may be formed of a material selected from a group consisting of gold (Au), tin (Sn), indium (In), aluminum (Al), silicon (Si), silver (Ag), nickel (Ni), and copper (Cu), or an alloy thereof. A diffusion barrier layer prevents a material forming the junction layer 260 from spreading to the vicinity of the first electrode 242 and thus reducing reliability during a bonding process.

A diffusion barrier layer (not shown) may be disposed between the first conductive layer 265 and the junction layer 260 and may have, for example, a multi-layered structure of titanium/nickel/titanium/nickel The support substrate 270 may be made of a conductive material. For example, the support substrate 270 may be formed of a metal or a semiconductor material. The material of the support substrate 270 may be a metal with high electrical conductivity and thermal conductivity. The support substrate 270 may be formed of a material with high thermal conductivity because heat generated during operation of the light emitting device should be sufficiently radiated. For example, the support substrate 270 may be made of a material selected from a group consisting of silicon (Si), molybdenum (Mo), tungsten (W), copper (Cu), and aluminum (Al), or an alloy thereof. Also, the support substrate 270 may selectively contain gold (Au), a copper alloy (a Cu alloy), nickel (Ni), copper-tungsten (Cu—W), carrier wafers (e.g., GaN, Si, Ge, GaAs, ZnO, SiGe, SiC, and Ga$_2$O$_3$), or the like.

When the semiconductor device is formed based on AlGaN and a large amount of aluminum (Al) is contained, the electric current spreading characteristics are deteriorated in the light emitting structure. In particular, a light emitting device that emits UV-B or UV-C wavelength light has a light emitting structure grown based on AlGaN containing a large amount of aluminum (Al), and thus the amount of light being polarized may, compared to a light emitting device configured to emits blue wavelength light, increase in TM mode in which light emission is dominant in a direction perpendicular to the growth direction of the light emitting structure. In this case, laterally traveling light in the active layer may be reflected by the second conductive layer 250.

Figure 47:
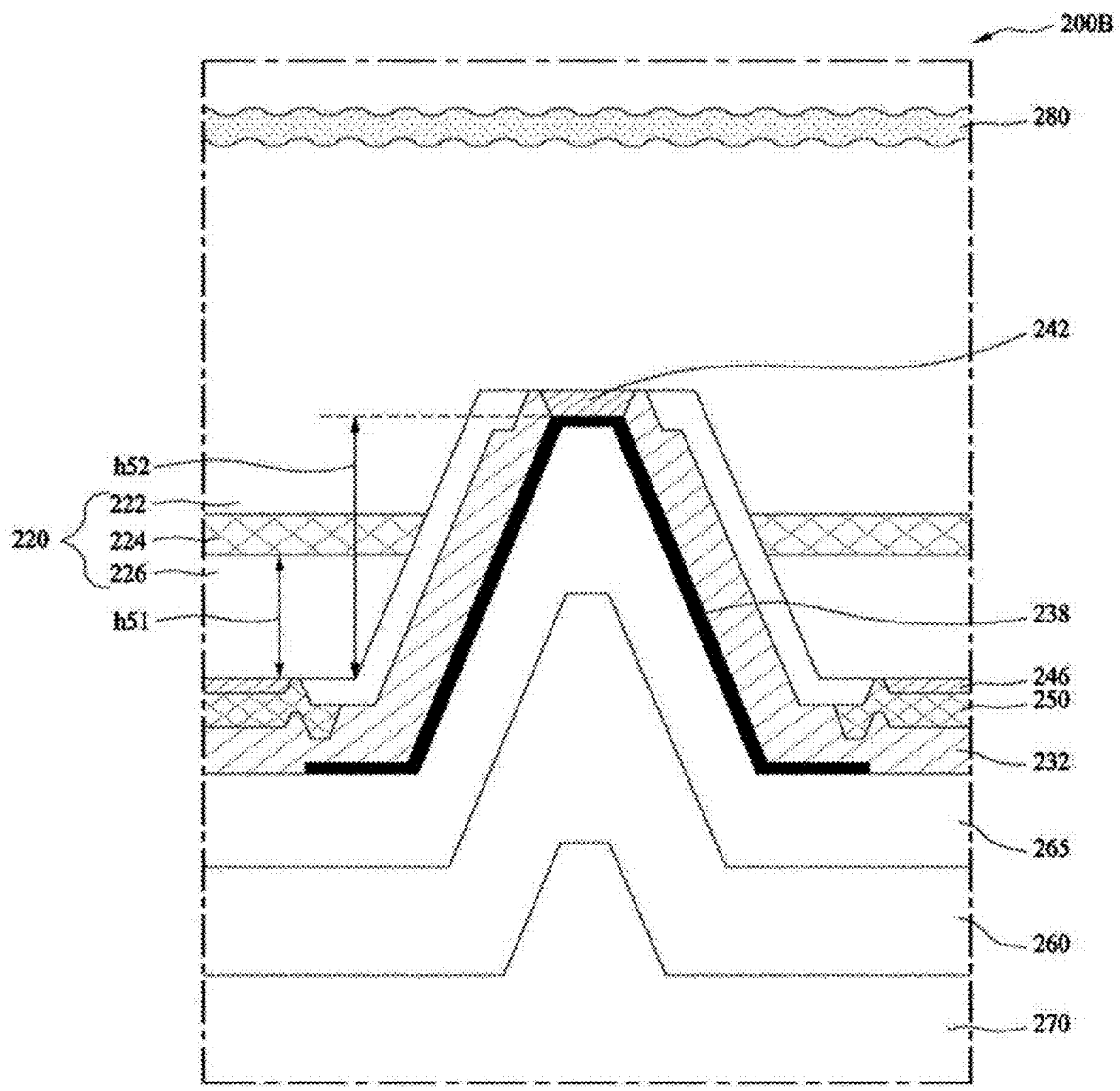
FIGS. 47 to 49 are detailed diagrams showing portions of the semiconductor devices according to seventeenth to nineteenth embodiments.
Figure 48:
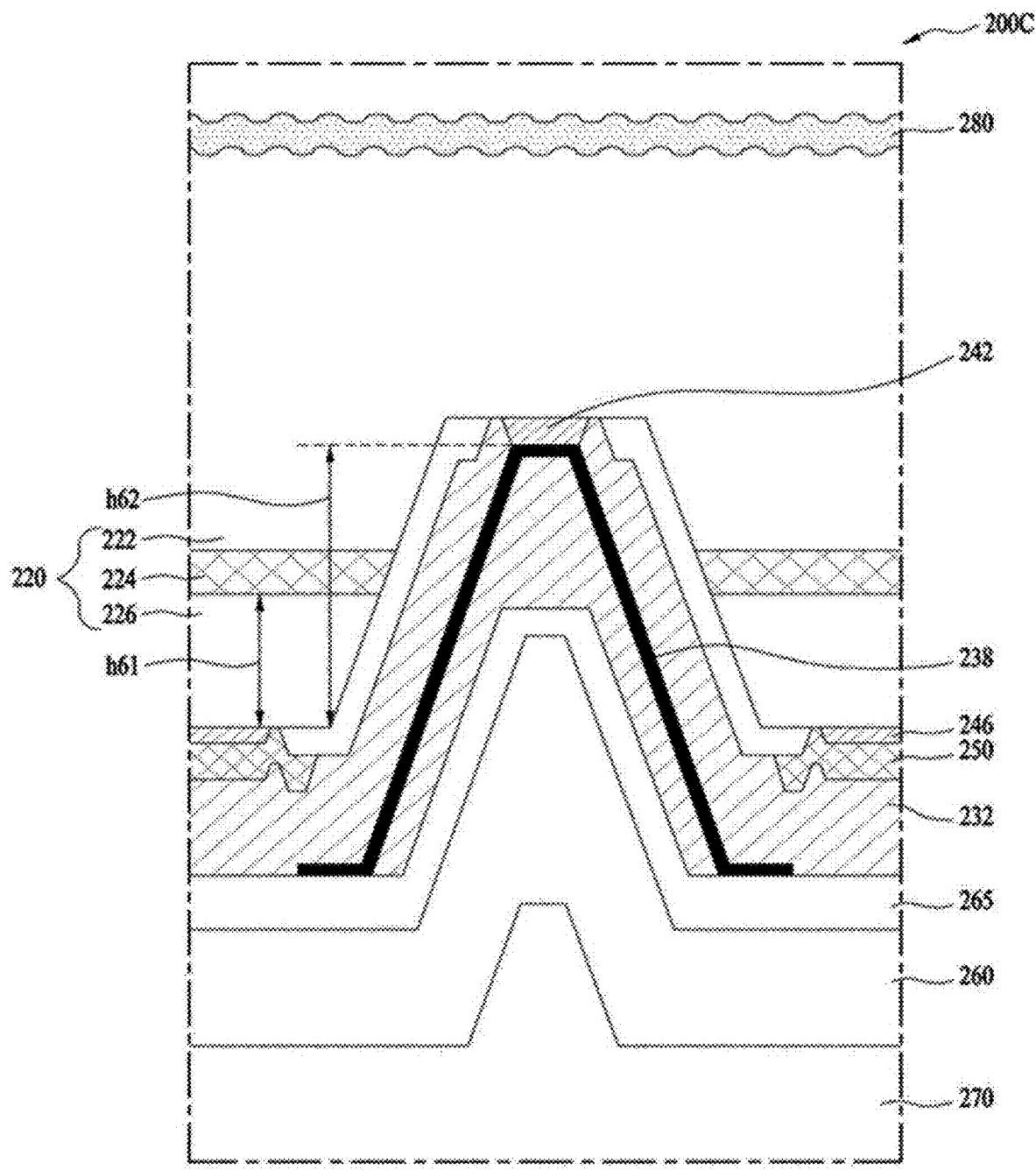
Figure 49:
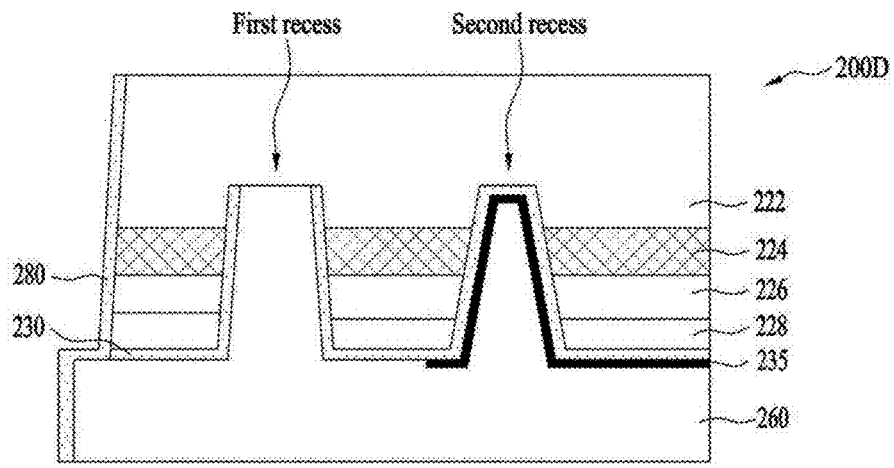

FIGS. 47 to 49 are detailed diagrams showing portions of the semiconductor devices according to seventeenth to nineteenth embodiments.

FIG. 47 is a sectional view of a portion of a semiconductor device according to the seventeenth embodiment. Here, the semiconductor device according to the seventeenth embodiment will be described, focusing on differences with the semiconductor device according to the sixteenth embodiment.

A semiconductor device 200B according to this embodiment is different from that of the sixteenth embodiment in that a third reflective layer 238 is disposed in the recess region.

The third reflective layer 238 may be made of at least one material selected from a group consisting of chromium (Cr), aluminum (Al), titanium (Ti), gold (Au), and nickel (Ni), or an alloy thereof. It is assumed that the third reflective layer 238 is made of aluminum and ultraviolet wavelength light is emitted from the active layer 224. In this case, when the third reflective layer 238 has a thickness greater than or equal to 50 nm, the thickness may be sufficient to reflect the ultraviolet wavelength light.

The third reflective layer 238 may have an upper surface electrically connected to the first electrode 242 and a lower surface electrically connected to the first conductive layer 265. Also, the third reflective layer 238 may be electrically separated from the second conductive layer 250 by the second insulation layer 232.

In this case, the third reflective layer 238 may have a part that vertically overlaps with the second conductive layer 250 under the second conductive semiconductor layer 226, thus securing process stability. Also, the third reflective layer 238 may sufficiently reflect light emitted from the active layer 224 toward the support substrate 270, thereby enhancing optical output power of the light emitting device.

FIG. 48 is a sectional view of a portion of the semiconductor device according to the eighteenth embodiment. Here, the semiconductor device according to the eighteenth embodiment will be described, focusing on differences with the semiconductor device according to the seventeenth embodiment.

In FIG. 48, a height h52 from the bottom surface of the light emitting structure 220 to the top surface of the third reflective layer 238 may be greater than a height h51 from the bottom surface of the light emitting structure 220 to the active layer 224. In other words, a portion of the third reflective layer 238, that is, an upper region of the third reflective layer 238 may be disposed at a height corresponding to the first conductive semiconductor layer 222, and a lower region of the third reflective layer 238 may be disposed to face the bottom surface of the second conductive semiconductor layer 226 from the bottom of the recess region. Also, a middle region of the third reflective layer 238 may be disposed at a height corresponding to the active layer 224 and be inclined with respect to the bottom surface of the second conductive semiconductor layer 226. In this case, light emitted from the active layer 224 may be reflected by, in particular, the middle region of the third reflective layer 238.

In a semiconductor device 200C according to this embodiment, an upper region of the third reflective layer 238 may have a top surface being in contact with the first electrode 142 to be electrically connected to the first conductive semiconductor layer 222 and a bottom surface being in contact with the first conductive layer 265. However, the middle region and the lower region of the third reflective layer 238 may be disposed to surround the second insulation layer 232.

FIG. 49 is a sectional view of a portion of a semiconductor device according to the nineteenth embodiment. Here, the semiconductor device according to the nineteenth embodiment will be described, focusing on differences with the semiconductor devices according to the above-described embodiments.

In a semiconductor device 200D according to this embodiment, a conductive layer 228 may be disposed under the second conductive semiconductor layer 226. When the second conductive semiconductor layer 226 is made of AlGaN, hole injection may not be facilitated due to low electrical conductivity of AlGaN. This problem may be solved by disposing a conductive layer 228 containing GaN with relatively high electrical conductivity.

The junction layer 260 is in contact with the first conductive semiconductor layer 222 through a first recess. Although not shown, a first electrode layer may be disposed between the junction layer 260 and the first conductive semiconductor layer 222.

The second reflective layer 25 is disposed in a second recess, and the insulation layer 230 is disposed to extend to an upper surface and even a side surface of the second reflective layer 235. In the junction layer 260, the second recess having the second reflective layer 235 disposed therein may have the same height as and a smaller width than the first recess being in contact with the first conductive semiconductor layer 222.

The insulation layer 230 may be disposed on top of the second reflective layer 235, and the junction layer 260 may be disposed on the bottom of and electrically connected to the second reflective layer 235.

Figure 50:
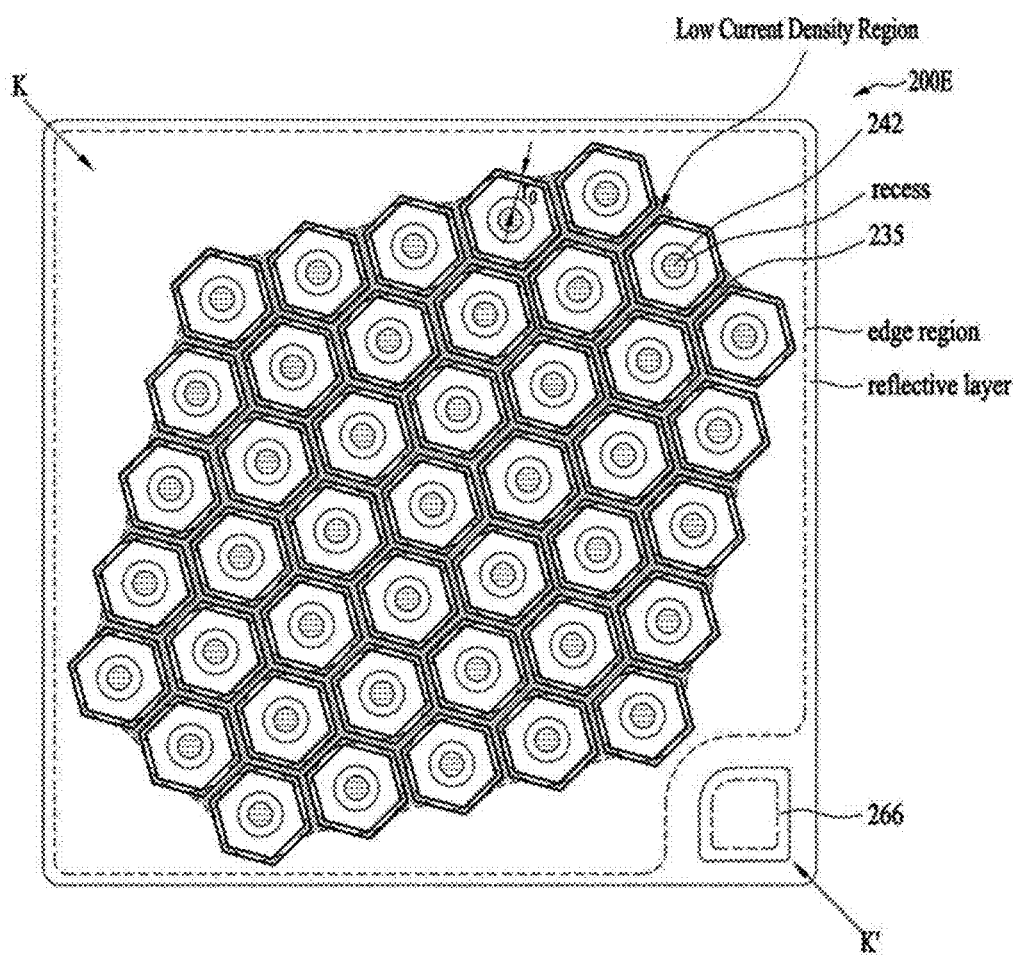
FIG. 50 is a plan view of a semiconductor device according to a twentieth embodiment.
Figure 51:
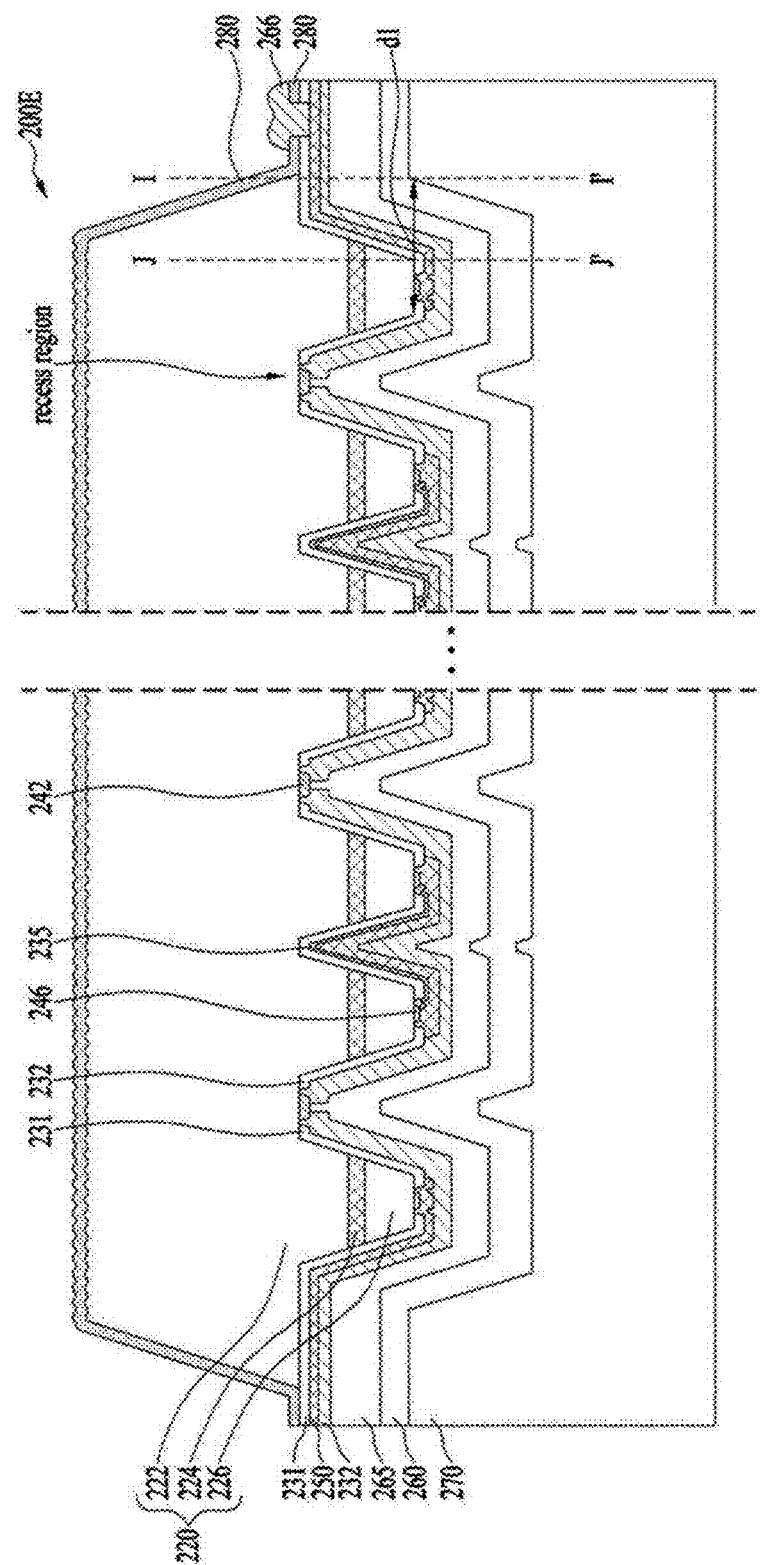
FIG. 51 is a sectional view of the semiconductor device taken along K-K' of FIG. 50.

FIG. 50 is a plan view of a semiconductor device according to a twentieth embodiment, and FIG. 51 is a sectional view of the semiconductor device taken along K-K' of FIG. 50. Here, the semiconductor device according to the twentieth embodiment will be described, focusing on differences with the semiconductor device according to the sixteenth embodiment.

In a semiconductor device 200E, the reflective layer 235 may be disposed in a low electric current density region between first electrodes 242 and between recesses. The low electric current density region may be spaced a distance r0 from the first electrodes 242. In the semiconductor device 200E, actually, a larger number of structures each composed of a first electrode 242 and a recess may be provided, and the number of structures can be designed in consideration of a current density and thus is not limited. By disposing the structures in consideration of the electric current of the first electrodes, it is possible to design the low electric current density region and dispose a second reflective layer in the low electric current density region. The second reflective layer 235 may be formed of the same material as that of the third reflective layer 238 of FIGS. 46 to 49.

In FIG. 50, the plurality of first electrodes 242 are shown as circles, and regions spaced distance r0 from the first electrodes may be referred to as "boundary regions." The boundary regions may have electric current density Ii.

The shape of the boundary regions may be a circle, but may change depending on the shape of the first electrodes 242. Accordingly, the present invention is not limited thereto. The electric current density Ii of the boundary region may range from 30% to 40% of electric current density I0 (e.g., Ii=I0×exp(−1)).

Also, the low electric current density region may refer to a region between the plurality of boundary regions and may have electric current density less than the electric current density Ii.

In this embodiment, the second reflective layer is disposed in outer contact with a "boundary region" around one first electrode 242, and a plurality of "boundary regions" may be in outer direct with or be spaced apart from each other. Accordingly, low electric current density regions may be spaced apart from each other when boundary regions are in contact with each other, and a low electric current density region may be expanded when boundary regions are spaced apart from each other.

In FIG. 51, recesses are provided from the second conductive semiconductor layer 226 to the active layer 224 and a portion of the first conductive semiconductor layer 226, and there are a plurality of regions where the first conductive semiconductor layer 222 is exposed, which are classified into a first recess region and a second recess region. The cross sections of the first recess region and the second recess region are, for example, circular, polygonal, elliptical, or the like, but are not limited thereto. The second recess region may be disposed around the first recess region.

The first electrode 242 may be disposed on the first conductive semiconductor layer 222 exposed in the first recess region, and the second electrode 246 may be disposed on the second conductive semiconductor layer 226 between the first recess region and the second recess region. Also, the second reflective layer 235 may be inserted into the second recess region, and a portion of the second reflective layer 235 may extend to a region outside the second recess region. A portion of the second reflective layer 235 may be disposed at a height corresponding to the active layer 224 and a height corresponding to a portion of the first conductive semiconductor layer 222. That is, the top surface of the second reflective layer 235 may be disposed at the same height as that of the active layer 224.

The light emitting structure 220 is based on AlGaN and contains a large amount of aluminum (Al), electric current spreading characteristics are deteriorated in the light emitting structure 220. In this case, the light emitting structure 220 is removed from a low electric current density region, and the second reflective layer 235 is formed. Also, the second reflective layer 235 may upwardly change a path of light emitted from the active layer in TM mode to reduce light absorption in the light emitting structure. Thus, it is possible to adjust an orientation angle of the semiconductor device and enhance light extraction efficiency.

Also, the second conductive layer 250 may act as a capping layer configured to electrically connect the second electrode 246 to the second electrode pad 266 and surround and support the second electrode 246 and the second reflective layer 235 to secure stability thereof. It may be like the sixteenth embodiment in that, in particular, the edge region of the light emitting structure 220 is exposed by removing the second conductive semiconductor layer 226, the active layer 224, and a portion of the first conductive semiconductor layer 222, the second conductive layer 250 may be disposed in a region where the light emitting structure 220 has been removed, and the second conductive layer 250 may extend to a region higher than the active layer.

That is, the edge region of the light emitting structure 220 is exposed by removing the second conductive semiconductor layer 226, the active layer 224, and a portion of the first conductive semiconductor layer 222, and the second conductive layer 250 may be disposed in a region where the light emitting structure 220 has been removed.

In FIG. 51, a region represented by line I-I' may be an end of the light emitting structure 220 and also a separation region of the light emitting structure 220, and a region represented by line J-J' may be a region where the surface of the light emitting structure 220, that is, the second conductive semiconductor layer 226 has not been removed and the upper surface remains.

Here, a distance d1 between line I-I' and line J-J' may range from 3 µm to 7 µm and, for example, may be 5 µm. When the distance between line I-I' and line J-J' is less than 3 m, a mesa etching region is narrowed, and thus it may be difficult to form the second conductive layer 250 to have a stepped structure. When the distance is greater than 7 µm, process stability is enhanced, but there may be a decrease in volume of the active layer 224.

According to the semiconductor device 200E according to this embodiment, the second reflective layer 235 in the low electric current density region is provided in the second recess region and configured to upwardly reflect laterally traveling light that is emitted from the active layer 224, and the second conductive layer 250 in the edge region of the light emitting structure 220 may extend to a height greater than that of the active layer 224 and upwardly reflect light that is emitted from the active layer and traveling to the edge region.

The semiconductor device may be configured as a package and may be used for cure of a resin, a resist, an SOD, or an SOG, for medial treatment such atopy treatment, or for sterilization of an air purifier or a water purifier. Also, the semiconductor device may be used as a light source of a lighting system. For example, the semiconductor device may be used as a light source of an image display device or a light source of a lighting device.

When the semiconductor device is used as a backlight unit of an image display device, the semiconductor device may be used as an edge-type backlight unit or a direct-type backlight unit. When the semiconductor device is used as a light source of a lighting device, the semiconductor device may be used as a lamp or a bulb. Alternatively, the semiconductor device may be used as a light source of a mobile terminal.

Figure 52:
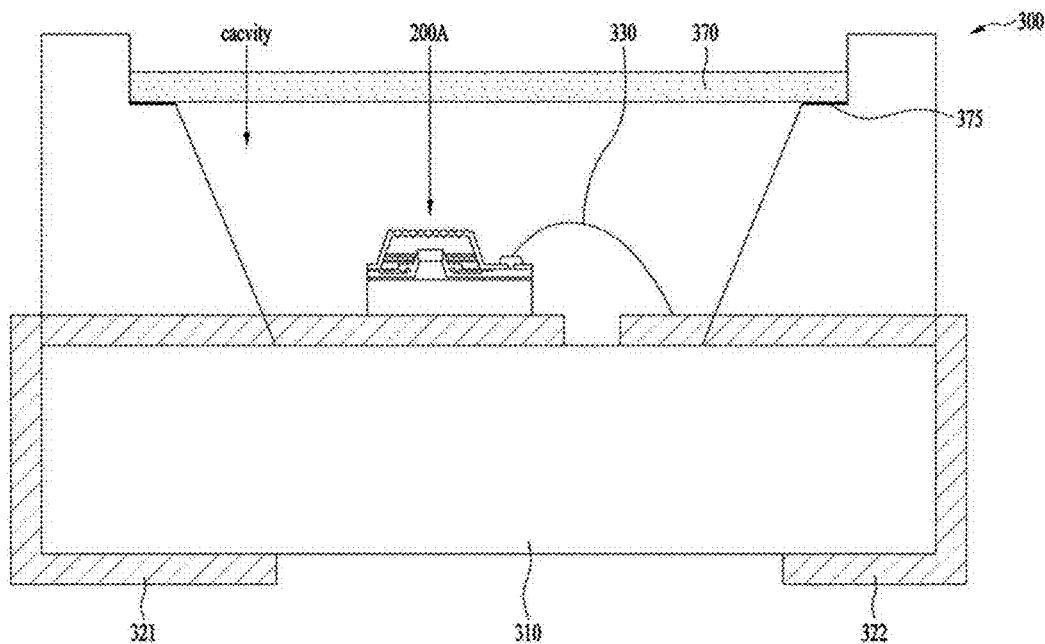
FIG. 52 is a diagram showing a package in which a semiconductor device is disposed.

FIG. 52 is a diagram showing a package in which a semiconductor device is disposed.

A light emitting device package 300 according to an embodiment includes a package body 310, a first electrode unit 321, a second electrode unit 322, and a light emitting device 200A.

The package body 310 may be made of an insulating material with a cavity and may contain, for example, a polyphthalamide (PPA) resin, a silicon-based material, or the like.

The first electrode unit 321 and the second electrode unit 322 may be disposed on the package body 310, and portions of the electrodes may be disposed on the bottom of the cavity.

The light emitting device 200A may be the above-described light emitting device and may be disposed on the first electrode unit 321 and electrically connected with the second electrode unit 322 through a wire 330.

The peripheries of the light emitting device 200 and the wire 330 may be filled with air. For a light emitting device that emits ultraviolet light, when a molding part made of a silicon-based material is disposed in the periphery of the light emitting device, a defect such as a crack may occur in the molding part due to energy corresponding to ultraviolet wavelengths, and thus there may be a reduction in reliability.

A phosphor (not shown) may be included around the light emitting device 200A. The phosphor may be a YAG-based phosphor, a nitride-based phosphor, a silicate-based phosphor, or a mixture thereof, but is not limited thereto. A groove is formed over the package body 310, and a cover 370 is disposed over the groove. The cover 370 may be made of a light transmitting material such as glass. The package body 310 and the cover 370 may be combined using an adhesive 375. For example, a silicon-based adhesive may be used as the adhesive 375.

Other than the package of FIG. 52, the semiconductor device is flip-chip-bonded and used as a package.

Figure 53:
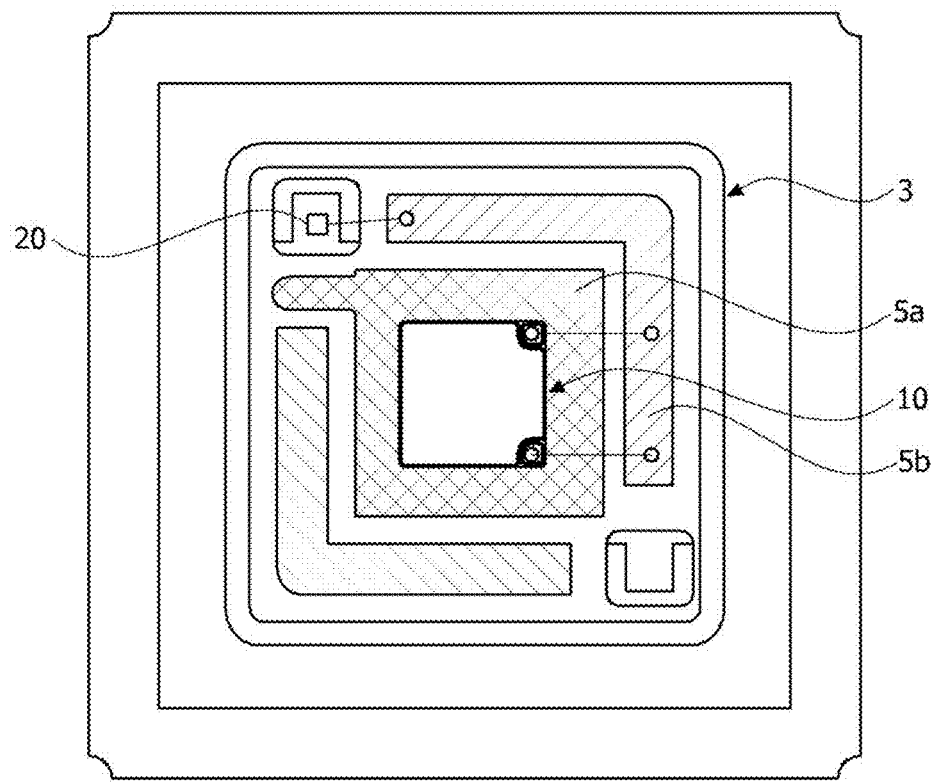
FIG. 53 is a plan view of a semiconductor device package according to an embodiment of the present invention.
Figure 54:
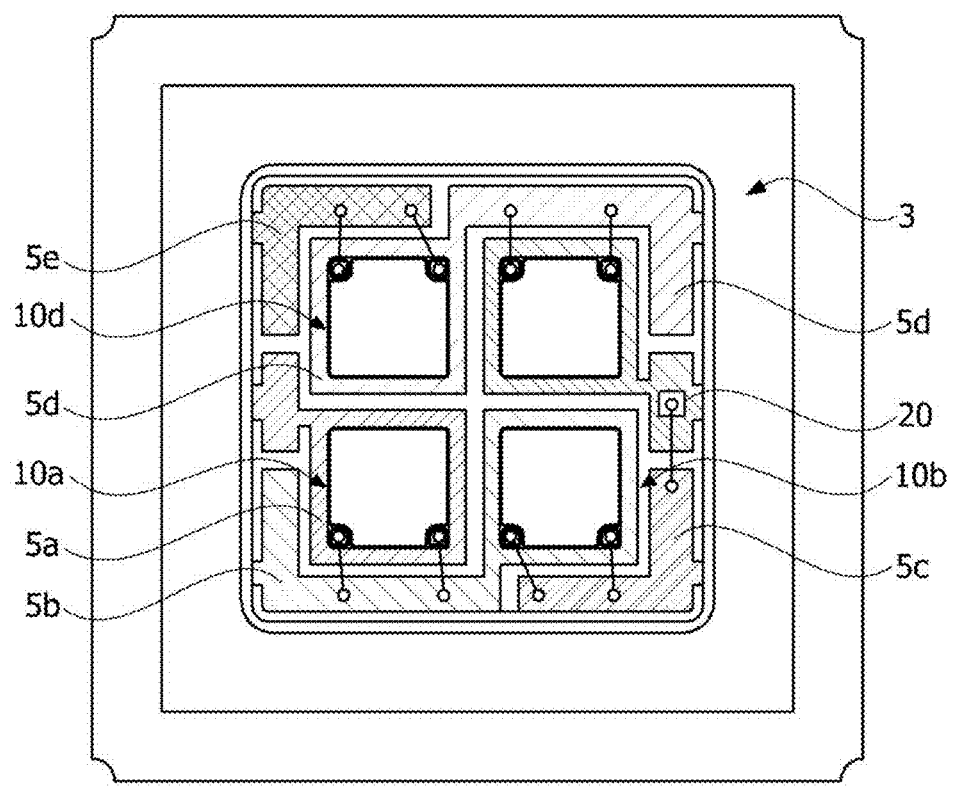
FIG. 54 is a modification of FIG. 53.

FIG. 53 is a plan view of a semiconductor device package according to an embodiment of the present invention, and FIG. 54 is a modification of FIG. 53.

Referring to FIG. 53, a semiconductor device 10 may be disposed on a first lead frame 5a and connected with a second lead frame 5b by wires. In this case, the second lead frame 5b may be disposed to surround the side surface of the first lead frame.

Referring to FIG. 54, the semiconductor device package may have a plurality of semiconductor devices 10a, 10b, 10c, and 10d disposed therein. In this case, the lead frame may include a first lead frame 5a, a second lead frame 5b, a third lead frame 5c, a fourth lead frame 5d, and a fifth lead frame 5e.

The first semiconductor device 10a may be disposed on the first lead frame 5a and connected with the second lead frame 5b by means of a wire. The second semiconductor device 10b may be disposed on the second lead frame 5b and connected with the third lead frame 5c by means of a wire. The third semiconductor device 10c may be disposed on the third lead frame 5c and connected with the fourth lead frame 5d by means of a wire. The fourth semiconductor device 10d may be disposed on the fourth lead frame 5d and connected with the fifth lead frame 5e by means of a wire.

The semiconductor device may be applied to various kinds of light source devices. For example, conceptually, the light source devices may include a lighting device and a display device. That is, the semiconductor device may be applied to various electronic devices configured to provide light by being disposed in housings thereof.

The lighting device may include a light source module including a substrate and a semiconductor device of an embodiment, a heat dissipation unit configured to dissipate heat of the light source module, and a power supply unit configured to process or convert an electric signal from the outside and provide the electric signal to the light source module. Also, the lighting device may include a lamp, a headlamp, or a streetlight.

The display device may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may constitute a backlight unit.

The reflective plate may be placed on the bottom cover, and the light emitting module may emit light. The light guide plate may be placed in front of the reflective plate to guide light emitted by the light emitting module forward. The optical sheet may include a prism sheet or the like and may be placed in front of the light guide plate. The display panel may be placed in front of the optical sheet. The image signal output circuit may supply an image signal to the display panel. The color filter may be placed in front of the display panel.

When the semiconductor device is used as a backlight unit of a display device, the semiconductor device may be used as an edge-type backlight unit or a direct-type backlight unit.

The semiconductor device may be a laser diode rather than the above-described light emitting diode.

Like the light emitting device, the laser diode may include a first conductive semiconductor layer, an active layer, and a second conductive semiconductor layer that have the above-described structures. The laser diode may also utilize an electroluminescence phenomenon in which light is emitted when electric current flows after a p-type first conductive semiconductor and an n-type second conductive semiconductor are brought in contact with each other, but has a difference in the directionality and phase of the emitted light. That is, the laser diode uses stimulated emission and constructive interference so that light having a specific single wavelength may be emitted at the same phase and in the same direction. Due to these characteristics, the laser diode may be used for an optical communication device, a medical device, a semiconductor processing device, or the like.

A light receiving device may include, for example, a photodetector, which is a kind of transducer configured to detect light and convert intensity of the light into an electric signal. The photodetector may include a photocell (silicon and selenium), an optical output element (cadmium sulfide and cadmium selenide), a photodiode (e.g., a PD with a peak wavelength in a visible blind spectral region or a true blind spectral region), a photo transistor, a photomultiplier, a photoelectric tube (vacuum and gas filling), an infra-red (IR) detector, or the like, but is not limited thereto.

Generally, a semiconductor device such as the photodetector may be produced using a direct bandgap semiconductor having good photoelectric transformation efficiency. Alternatively, the photodetector may have various structures. As the most common structure, the photodetector may include a pin-type photodetector using a p-n junction, a Schottky photodetector using a Schottky junction, a metal-semiconductor-metal (MSM) photodetector, or the like.

Like the light emitting device, the photodiode may include a first conductive semiconductor layer and a second conductive semiconductor layer that have the above-described structures and may be formed as a p-n junction or a pin structure. The photodiode operates when a reverse bias or a zero bias is applied. When light is incident on the photodiode, electrons and holes are generated such that electric current flows. In this case, the magnitude of electric current may be approximately proportional to the intensity of the light incident on the photodiode.

A photocell or a solar cell, which is a kind of photodiode, may convert light into electric current. Like the light emitting device, the solar cell may include a first conductive semiconductor layer, an active layer, and a second conductive semiconductor layer that have the above-described structures.

Also, the solar cell may be used as a rectifier of an electronic circuit through the rectification characteristics of a general diode using a p-n junction and may be applied to an oscillation circuit or the like of a microwave circuit.

Also, the above-described semiconductor device is not necessarily implemented only with semiconductors. Depending on the case, the semiconductor device may additionally include a metal material. For example, a semiconductor device such as the light receiving device may be implemented using at least one of Ag, Al, Au, In, Ga, N, Zn, Se, P, and As and may be implemented using an intrinsic semiconductor material or a semiconductor material doped with a p-type dopant or an n-type dopant.

While the present invention has been described with reference to exemplary embodiments, these are just examples and do not limit the present invention. It will be understood by those skilled in the art that various modifications and applications may be made therein without departing from the essential characteristics of the embodiments. For example, elements described in the embodiments above in detail may be modified and implemented. Furthermore, differences associated with such modifications and applications should be construed as being included in the scope of the present invention defined by the appended claims.

The invention claimed is:

1. A semiconductor device comprising:
   a conductive substrate;
   a light emitting structure comprising, a first conductive semiconductor layer, a second conductive semiconductor layer, an active layer provided between the first conductive semiconductor layer and the second conductive semiconductor layer, and a plurality of recesses that passes through the second conductive semiconductor layer and the active layer and extends into the first conductive semiconductor layer;
   a plurality of first electrodes electrically connected with the first conductive semiconductor layer; and
   a second electrode electrically connected with the second conductive semiconductor layer, wherein the first conductive semiconductor layer, the second conductive semiconductor layer and the active layer include Aluminum respectively, wherein the plurality of the first electrodes contacts to a portion of the first conductive semiconductor layer which is disposed on an upper surface of the plurality of recesses, wherein the second electrode contacts to the second conductive semiconductor layer, wherein light emitted from the active layer has a main peak in a range of 100 nm to 320 nm, wherein an area of a top surface of the second electrode comprises a range of 35% to 70% of a lower surface of the second conductive semiconductor layer, and wherein the conductive substrate includes a plurality of side surfaces, wherein a diameter of a top surface of a recess comprises a range of 3.8% to 6% of a length of each of the side surfaces of the conductive substrate.

2. The semiconductor device of claim 1, wherein the diameter of the top surface of a recess comprises a range of 38 μm to 60 μm.

3. The semiconductor device of claim 2, wherein a number of the plurality of the recesses is 48 to 236.

4. The semiconductor device of claim 2, wherein an area of the top surface of the plurality of recesses comprises a range of 7.4% to 20% of the lower surface of the second conductive semiconductor layer.

5. The semiconductor device of claim 4, wherein the area of the top surface of the second electrode is 1.75 times to 9.45 times of the area of the top surface of the first electrodes.

6. The semiconductor device of claim 1, further comprising a first conductive layer provided between the light emitting structure and the conductive substrate, wherein the first conductive layer comprises a plurality of connecting electrodes extending to the plurality of the recesses and connecting to the plurality of the first electrodes, wherein the plurality of connecting electrodes extends to the plurality of the recesses respectively, and wherein a number of the plurality of connecting electrodes is 48 to 236.

7. The semiconductor device of claim 6, further comprising a second conductive layer disposed between the second electrode and the first conductive layer, wherein the second conductive layer surrounds the second electrode, and wherein the second conductive layer comprises an area which contacts to the second electrode and an area which contact to the second conductive semiconductor layer.

8. The semiconductor device of claim 7, further comprising an insulation layer provided between the second conductive layer and the first conductive layer, wherein the insulation layer extends into the plurality of the recesses, and wherein the insulation layer comprises through holes provided in the plurality of the recesses.

9. The semiconductor device of claim 8, wherein the plurality of the first electrodes is provided in the through holes.

10. The semiconductor device of claim 9, wherein a width in a horizontal direction of a portion of the insulation layer which contacts to a top surface of the plurality of the recesses comprises a range of 11 μm to 28 μm.

11. The semiconductor device of claim 7, further comprising a second electrode pad provided on the conductive substrate and spaced away from the light emitting structure, wherein the second electrode pad electrically connects to the second conductive layer.

12. The semiconductor device of claim 11, wherein the second electrode pad includes a groove thereon, and wherein a top surface of the light emitting structure includes a pattern.

13. The semiconductor device of claim 8, wherein the second conductive layer includes a concave portion provided on a lower surface of the second conductive layer, and wherein the concave portion concaves in a direction from the lower surface of the second conductive layer toward an upper surface of the second conductive layer.

14. The semiconductor device of claim 13, wherein the second conductive layer extends from a lower surface of the second electrode to a spaced area in which the second electrode is spaced away from the insulation layer, and wherein the concave portion overlaps with the spaced area in vertical direction.

15. The semiconductor device of claim 14, wherein the insulation layer is separated from an end of the second conductive layer so that the insulation layer is provided on a first area between the second conductive semiconductor layer and the second conductive layer and is provided on a second area between the second conductive layer and the first conductive layer.

16. The semiconductor device of claim 2, wherein the plurality of the recesses includes an inner surface respectively, and wherein an angle of a lower surface between the second conductive surface and the inner surface of the plurality of the recesses comprises a range of 90° to 120°.

17. The semiconductor device of claim 16, wherein the first conductive semiconductor layer comprises a first Al containing layer provided adjacent to the active layer, wherein the first Al containing layer is an area having the lowest Aluminum composition in the first conductive semiconductor layer, and the plurality of recesses are formed up to the first Al containing layer, wherein the first electrode electrically connect the first Al containing layer.

18. The semiconductor device of claim 11, wherein the top surface of the second electrode is a surface contacted to the lower surface of the second conductive semiconductor layer and the top surface of the plurality of the recesses is an end surface provided into the first conductive semiconductor layer.

19. A semiconductor device package comprising:
a body; and
a semiconductor device provided in the body,
wherein the semiconductor device comprises;
a conductive substrate;
a light emitting structure comprising a first conductive semiconductor layer, a second conductive semiconductor layer, an active layer provided between the first conductive semiconductor layer and the second conductive semiconductor layer, and a plurality of recesses that passes through the second conductive semiconductor layer and the active layer and extends into the first conductive semiconductor layer;
a plurality of first electrodes electrically connected to the first conductive semiconductor layer; and
a second electrode electrically connected to the second conductive semiconductor layer,
a first conductive layer provided between the light emitting structure and the conductive substrate, a second conductive layer provided between the second electrode and the first conductive layer, and a second electrode pad provided on the conductive substrate and spaced away from the light emitting structure, wherein the first conductive semiconductor layer, the second conductive semiconductor layer, and the active layer include Aluminum respectively, wherein the plurality of the first electrodes contacts to a portion of the first conductive semiconductor layer which is provided on an upper surface of the plurality of recesses, wherein the second electrode contacts to the second conductive semiconductor layer, wherein light emitted from the active layer has a main peak in a range of 100 nm to 320 nm, wherein a total area of top surface of the plurality of recesses comprises a range of 13% to 30% of a lower surface of the second conductive semiconductor layer, wherein an area of the second electrode comprises a range of 35% to 70% of the lower surface of the second conductive semiconductor layer, wherein the second electrode pad electrically connects to the second conductive layer, wherein the conductive substrate includes a plurality of side surfaces, wherein a diameter of a top surface of a recess comprises a range of 3.8% to 6% of a length of each of the side surfaces of the conductive substrate.

* * * * *